United States Patent
Kim et al.

(10) Patent No.: US 9,378,977 B2
(45) Date of Patent: Jun. 28, 2016

(54) NON-VOLATILE MEMORY DEVICES AND METHODS OF FABRICATING THE SAME

(71) Applicant: Samsung Electronics Co., Ltd., Suwon-si (KR)

(72) Inventors: Minchul Kim, Hwaseong-si (KR); Jae-Hwang Sim, Hwaseong-si (KR); Sangbin Song, Yongin-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 30 days.

(21) Appl. No.: 14/293,346

(22) Filed: Jun. 2, 2014

(65) Prior Publication Data

US 2014/0273495 A1    Sep. 18, 2014

Related U.S. Application Data

(62) Division of application No. 13/212,639, filed on Aug. 18, 2011, now abandoned.

(30) Foreign Application Priority Data

Dec. 13, 2010    (KR) .................. 10-2010-0127155

(51) Int. Cl.
| | |
|---|---|
| *H01L 21/336* | (2006.01) |
| *H01L 21/3213* | (2006.01) |
| *H01L 27/115* | (2006.01) |
| *H01L 29/423* | (2006.01) |
| *H01L 29/66* | (2006.01) |

(Continued)

(52) U.S. Cl.
CPC ...... *H01L 21/32135* (2013.01); *H01L 27/1157* (2013.01); *H01L 27/11524* (2013.01); *H01L 27/11543* (2013.01); *H01L 29/4234* (2013.01); *H01L 29/42324* (2013.01); *H01L 29/42332* (2013.01); *H01L 29/66825* (2013.01); *H01L 29/66833* (2013.01); *H01L 29/7881* (2013.01); *H01L 29/792* (2013.01)

(58) Field of Classification Search
None
See application file for complete search history.

(56) References Cited

U.S. PATENT DOCUMENTS

| | | |
|---|---|---|
| 6,228,712 B1 | 5/2001 | Kawai et al. |
| 2004/0150056 A1 | 8/2004 | Yang et al. |

(Continued)

FOREIGN PATENT DOCUMENTS

| | | |
|---|---|---|
| CN | 1956329 | 5/2007 |
| JP | 2008-108787 | 5/2008 |

(Continued)

OTHER PUBLICATIONS

Chinese Office Action dated May 20, 2015 issued in corresponding CN Application No. 201110378154.0.

(Continued)

*Primary Examiner* — Fei Fei Yeung Lopez
(74) *Attorney, Agent, or Firm* — Onello & Mello LLP

(57) ABSTRACT

A non-volatile memory device comprises a substrate, a control gate electrode on the substrate, and a charge storage region between the control gate electrode and the substrate. A control gate mask pattern is on the control gate electrode, the control gate electrode comprising a control base gate and a control metal gate on the control base gate. A width of the control metal gate is less than a width of the control gate mask pattern. An oxidation-resistant spacer is at sidewalls of the control metal gate positioned between the control gate mask pattern and the control base gate.

8 Claims, 32 Drawing Sheets

(51) Int. Cl.
*H01L 29/788* (2006.01)
*H01L 29/792* (2006.01)

(56) References Cited

U.S. PATENT DOCUMENTS

| | | |
|---|---|---|
| 2005/0145925 A1 | 7/2005 | Ozawa |
| 2006/0054953 A1 | 3/2006 | Son et al. |
| 2007/0018207 A1 | 1/2007 | Prinz |
| 2007/0090867 A1 | 4/2007 | Kim |
| 2008/0195916 A1 | 8/2008 | Lee et al. |
| 2009/0212345 A1 | 8/2009 | Lee |
| 2009/0224307 A1 | 9/2009 | Lee et al. |
| 2009/0289295 A1* | 11/2009 | Jeon .............................. 257/321 |
| 2009/0289296 A1 | 11/2009 | Jeon |

FOREIGN PATENT DOCUMENTS

| | | |
|---|---|---|
| KR | 10-2006-0133166 | 12/2006 |
| KR | 10-2009-0090622 | 8/2009 |
| KR | 10-2010-0013946 | 2/2010 |

OTHER PUBLICATIONS

Application and Prosecution history of U.S. Appl. No. 13/212,639, filed Aug. 18, 2011, by Minchul Kim, et al., Entitled "Non-Volatile Memory Devices and Methods of Fabricating the Same".

* cited by examiner

NON-VOLATILE MEMORY DEVICES AND METHODS OF FABRICATING THE SAME

CROSS-REFERENCE TO RELATED APPLICATIONS

This U.S. non-provisional patent application is a divisional application of U.S. patent application Ser. No. 13/212,639, filed on Aug. 18, 2011, which claims priority under 35 U.S.C. §119 of Korean Patent Application No. 10-2010-0127155, filed on Dec. 13, 2010, the entire contents of which are hereby incorporated by reference.

BACKGROUND

The present disclosure relates to semiconductor devices and methods of fabricating the same, and more particularly, to non-volatile memory devices and methods of fabricating the same.

Semiconductor devices enjoy widespread use in the electronics industry as a result of advantageous characteristics such as amenability to miniaturization, multi-functional capability, low manufacturing cost, and the like. Semiconductor devices can include, for example, memory devices that store logic data, logic devices that perform logic operations, hybrid devices that include both memory elements and logic elements, and other devices.

As the electronics industry continues to advance, the desired performance constraints placed on the characteristics of semiconductor devices continues to increase. For example, semiconductor devices are driven to operate at ever-higher speeds, and with greater reliability. However, the critical dimension of patterns used in semiconductor devices continues to be reduced due to the continuing trend toward ever-higher integration density. Therefore, it is increasingly difficult to realize semiconductor devices that operate at higher frequency and with more favorable reliability.

SUMMARY

In an aspect, a non-volatile memory device comprises: a substrate; a control gate electrode on the substrate; a charge storage region between the control gate electrode and the substrate; a control gate mask pattern on the control gate electrode; the control gate electrode comprising a control base gate and a control metal gate on the control base gate; a width of the control metal gate being less than a width of the control gate mask pattern; and an oxidation-resistant spacer at sidewalls of the control metal gate positioned between the control gate mask pattern and the control base gate.

In some embodiments, a combined width of the control metal gate and a width of the oxidation-resistant spacer at first and second sidewalls of the control metal gate is less than the width of the control gate mask pattern.

In some embodiments, a combined width of the control metal gate and a width of the oxidation-resistant spacer at first and second sidewalls of the control metal gate is equal to the width of the control gate mask pattern.

In some embodiments, a width of the oxidation-resistant spacer is less than one-half a width of a narrowest portion of the control metal gate.

In some embodiments, the non-volatile memory device further comprises a lower barrier layer pattern between the control base gate and the control metal gate.

In some embodiments, the lower barrier layer pattern is of a thickness that is less than one-half a thickness of the control metal gate.

In some embodiments, the lower barrier layer pattern is of a width that is less than the width of the control gate mask pattern.

In some embodiments, the non-volatile memory device further comprises an upper barrier layer pattern between the control metal gate and the gate mask pattern.

In some embodiments, the upper barrier layer pattern is of a thickness that is less than one-half a thickness of the control metal gate.

In some embodiments, the upper barrier layer pattern is of a width that is less than the width of the control gate mask pattern.

In some embodiments, the control base gate includes a lower portion and an upper portion, wherein the upper portion is of a width that is less than a width of the lower portion.

In some embodiments, the oxidation resistant spacer covers a top surface and sidewall surface of the upper portion of the control base gate.

In some embodiments, the non-volatile memory device further comprises an insulative layer on the control gate electrode.

In some embodiments, a memory cell region of the memory device includes multiple control gate electrodes, and wherein air gaps are present in the insulative layer between neighboring control gate electrodes.

In some embodiments, the charge storage region comprises a tunnel dielectric layer on the substrate, a floating gate on the tunnel dielectric layer and a blocking layer on the floating gate.

In some embodiments, the floating gate and blocking layer are patterned to have sidewalls that are aligned with sidewalls of the control base gate.

In some embodiments, the non-volatile memory device further comprises an oxidation layer on the sidewalls of the floating gate.

In some embodiments, the charge storage region comprises a tunnel dielectric layer on the substrate, a dielectric charge storage layer on the tunnel dielectric layer and a blocking layer on the dielectric charge storage layer.

In some embodiments, the charge-storage region comprises a ONO-type structure

In some embodiments, the dielectric charge storage layer and the blocking layer are patterned to have sidewalls that are aligned with sidewalls of the control base gate.

In some embodiments, the non-volatile memory device further comprises an oxidation layer on sidewalls of the control base gate.

In some embodiments, the memory device comprises a memory cell region and wherein the control gate electrode and the control gate mask pattern are located in the memory cell region and wherein the memory device further comprises a peripheral region including: a peripheral gate electrode on the substrate in the peripheral region; the peripheral gate electrode comprising a peripheral base gate and a peripheral metal gate on the peripheral base gate; a peripheral gate mask pattern on the peripheral gate electrode; a width of the peripheral metal gate being less than a width of the peripheral gate mask pattern; and an oxidation-resistant spacer at sidewalls of the peripheral metal gate and below the peripheral gate mask pattern.

In some embodiments, the peripheral base gate is a same material as the control base gate, wherein the peripheral metal gate is a same material as the control metal gate, and wherein the oxidation-resistant spacer at sidewalls of the peripheral metal gate is a same material as the oxidation-resistant spacer at sidewalls of the control metal gate.

In some embodiments, a thickness of the oxidation-resistant spacer at sidewalls of the peripheral metal gate is greater than a thickness of the oxidation-resistant spacer at sidewalls of the control metal gate.

In some embodiments, at least one of the control base gate and the peripheral base gate includes a lower portion and an upper portion, wherein the upper portion is of a width that is less than a width of the lower portion.

In some embodiments, the peripheral gate electrode further comprises: a peripheral bottom gate on the substrate between the peripheral base gate and the substrate; a peripheral gate dielectric layer between the peripheral bottom gate and the substrate; and an interlayer dielectric layer pattern between the peripheral base gate and the peripheral bottom gate, wherein the peripheral metal gate directly contacts the peripheral bottom gate through an opening in the peripheral base gate and in the dielectric layer pattern.

In some embodiments, the oxidation-resistant spacer comprises nitride.

In some embodiments, the oxidation-resistant spacer comprises insulating nitride.

In some embodiments, the oxidation-resistant spacer comprises a material selected from the group consisting of silicon nitride and silicon oxynitride.

In some embodiments, the oxidation-resistant spacer comprises conductive nitride.

In some embodiments, the oxidation-resistant spacer comprises a material selected from the group consisting of metal nitride, titanium nitride, tantalum nitride, and tungsten nitride.

In some embodiments, a height of the oxidation-resistant spacer is equal to a height of the control metal gate.

In an aspect, a non-volatile memory device comprises: a substrate; a control gate electrode comprising metal on the substrate; a charge storage region between the control gate electrode and the substrate; a control gate mask pattern on the control gate electrode; a width of the control gate electrode being less than a width of the control gate mask pattern; and an oxidation-resistant spacer at sidewalls of the control gate electrode positioned between the control gate mask pattern and the charge storage region.

In some embodiments, a combined width of the control gate electrode and a width of the oxidation-resistant spacer at first and second sidewalls of the control gate electrode is less than the width of the control gate mask pattern.

In some embodiments, a combined width of the control gate electrode and a width of the oxidation-resistant spacer at first and second sidewalls of the control gate electrode is equal to the width of the control gate mask pattern.

In some embodiments, a width of the oxidation-resistant spacer is less than one-half a width of a narrowest portion of the control gate electrode.

In some embodiments, the non-volatile memory device further comprises a lower barrier layer pattern between the charge storage region and the control gate electrode.

In some embodiments, the lower barrier layer pattern is of a thickness that is less than one-half a thickness of the control gate electrode.

In some embodiments, the lower barrier layer pattern is of a width that is less than the width of the control gate mask pattern.

In some embodiments, the non-volatile memory device further comprises an upper barrier layer pattern between the control gate electrode and the gate mask pattern.

In some embodiments, the upper barrier layer pattern is of a thickness that is less than one-half a thickness of the control gate electrode.

In some embodiments, the upper barrier layer pattern is of a width that is less than the width of the control gate mask pattern.

In some embodiments, the non-volatile memory device further comprises an insulative layer on the control gate electrode.

In some embodiments, a memory cell region of the memory device includes multiple control gate electrodes, and wherein air gaps are present in the insulative layer between neighboring control gate electrodes.

In some embodiments, the charge storage region comprises a tunnel dielectric layer on the substrate, a dielectric charge storage layer on the tunnel dielectric layer and a blocking layer on the dielectric charge storage layer.

In some embodiments, the charge-storage region comprises a ONO-type structure.

In some embodiments, the dielectric charge storage layer and the blocking layer are patterned to have sidewalls that are aligned with sidewalls of the control gate mask pattern.

In some embodiments, the memory device comprises a memory cell region and wherein the control gate electrode and the control gate mask pattern are located in the memory cell region and wherein the memory device further comprises a peripheral region including: a peripheral gate electrode on the substrate in the peripheral region; a peripheral gate mask pattern on the peripheral gate electrode; a width of the peripheral gate electrode being less than a width of the peripheral gate mask pattern; and an oxidation-resistant spacer at sidewalls of the peripheral gate electrode and below the peripheral gate mask pattern.

In some embodiments, the peripheral gate electrode is a same material as the control gate electrode, and wherein the oxidation-resistant spacer at sidewalls of the peripheral gate electrode is a same material as the oxidation-resistant spacer at sidewalls of the control gate electrode.

In some embodiments, a thickness of the oxidation-resistant spacer at sidewalls of the peripheral gate electrode is greater than a thickness of the oxidation-resistant spacer at sidewalls of the control gate electrode.

In some embodiments, the peripheral gate electrode comprises a peripheral metal gate on, and in direct contact with, a peripheral base gate.

In some embodiments, the oxidation-resistant spacer comprises nitride.

In some embodiments, the oxidation-resistant spacer comprises insulating nitride.

In some embodiments, the oxidation-resistant spacer comprises a material selected from the group consisting of silicon nitride and silicon oxynitride.

In some embodiments, the oxidation-resistant spacer comprises conductive nitride.

In some embodiments, the oxidation-resistant spacer comprises a material selected from the group consisting of metal nitride, titanium nitride, tantalum nitride, and tungsten nitride.

In some embodiments, a height of the oxidation-resistant spacer is equal to a height of the control gate electrode.

In an aspect, a non-volatile memory device comprises: a substrate; a control gate electrode on the substrate; a charge storage region between the control gate electrode and the substrate; a control gate mask pattern on the control gate electrode; the control gate electrode comprising a control base gate and a control metal gate on the control base gate; a width of the control metal gate being less than a width of the control base gate; and an oxidation-resistant spacer at sidewalls of the control metal gate positioned between the control gate mask pattern and the control base gate.

In some embodiments, a combined width of the control metal gate and a width of the oxidation-resistant spacer at first and second sidewalls of the control metal gate is less than the width of the control base gate.

In some embodiments, a combined width of the control metal gate and a width of the oxidation-resistant spacer at first and second sidewalls of the control metal gate is equal to the width of the control base gate.

In an aspect, a method of fabricating a non-volatile memory device comprises: providing a charge storage layer on a substrate; providing a control base gate layer on the charge storage layer; providing a control metal gate layer on the control base gate layer; providing a control gate mask pattern on the control metal gate layer; etching the control metal gate layer and the control base gate layer using the control gate mask pattern as an etch mask to form a first control metal gate pattern and a control base gate pattern; etching sidewalls of the first control metal gate pattern to form a second control metal gate pattern, so that a width of the second control metal gate pattern is less than a width of the control gate mask pattern; and providing an oxidation-resistant spacer at sidewalls of the second control metal gate pattern positioned between the control gate mask pattern and the control base gate pattern In some embodiments, providing the oxidation-resistant spacer comprises: providing an oxidation-resistant layer on the second control metal gate pattern at sidewalls of the second control metal gate pattern to fill an undercut region below the control gate mask pattern; and etching the oxidation-resistant layer to form the oxidation-resistant spacer.

In some embodiments, etching the oxidation-resistant layer comprises etching using an etching process having dominant anisotropy properties.

In some embodiments, etching the sidewalls of the first control metal gate pattern to form the second control metal gate pattern comprises etching using a dry etching process having dominant anisotropy properties.

In some embodiments, the method further comprises, following providing the oxidation-resistant spacers, performing a gate oxidation process on sidewalls of the control base gate pattern.

In an aspect, a method of fabricating a non-volatile memory device comprises: providing a charge storage region on a substrate; providing a control gate electrode layer comprising metal on the charge storage region; providing a control gate mask pattern on the control gate electrode layer; etching the control gate electrode layer using the control gate mask pattern as an etch mask to form a first control gate electrode pattern; etching sidewalls of the first control gate electrode pattern to form a second control gate electrode pattern, so that a width of the second control gate electrode pattern is less than a width of the control gate mask pattern; and providing an oxidation-resistant spacer at sidewalls of the second control gate electrode pattern positioned between the control gate mask pattern and the charge storage region In some embodiments, providing the oxidation-resistant spacer comprises: providing an oxidation-resistant layer on the second control gate electrode pattern at sidewalls of the second control gate electrode pattern to fill an undercut region below the control gate mask pattern; and etching the oxidation-resistant layer to form the oxidation-resistant spacer.

In some embodiments, etching the oxidation-resistant layer comprises etching using an etching process having dominant anisotropy properties.

In some embodiments, etching the sidewalls of the first control gate electrode pattern to form the second control gate electrode pattern comprises etching using a dry etching process having dominant anisotropy properties.

In an aspect, a memory system comprises: a memory controller that generates command and address signals; and a memory module comprising a plurality of memory devices, the memory module receiving the command and address signals and in response storing and retrieving data to and from at least one of the memory devices, wherein each memory device comprises a non-volatile memory device comprising: a substrate; a control gate electrode on the substrate; a charge storage region between the control gate electrode and the substrate; a control gate mask pattern on the control gate electrode; the control gate electrode comprising a control base gate and a control metal gate on the control base gate; a width of the control metal gate being less than a width of the control gate mask pattern; and an oxidation-resistant spacer at sidewalls of the control metal gate positioned between the control gate mask pattern and the control base gate.

BRIEF DESCRIPTION OF THE DRAWINGS

The accompanying drawings are included to provide a further understanding of the inventive concept, and are incorporated in, and constitute a part of, this specification. The drawings illustrate exemplary embodiments of the inventive concept and, together with the description, serve to explain principles of the inventive concept. In the drawings.

DETAILED DESCRIPTION OF THE EMBODIMENTS

Figure 1:
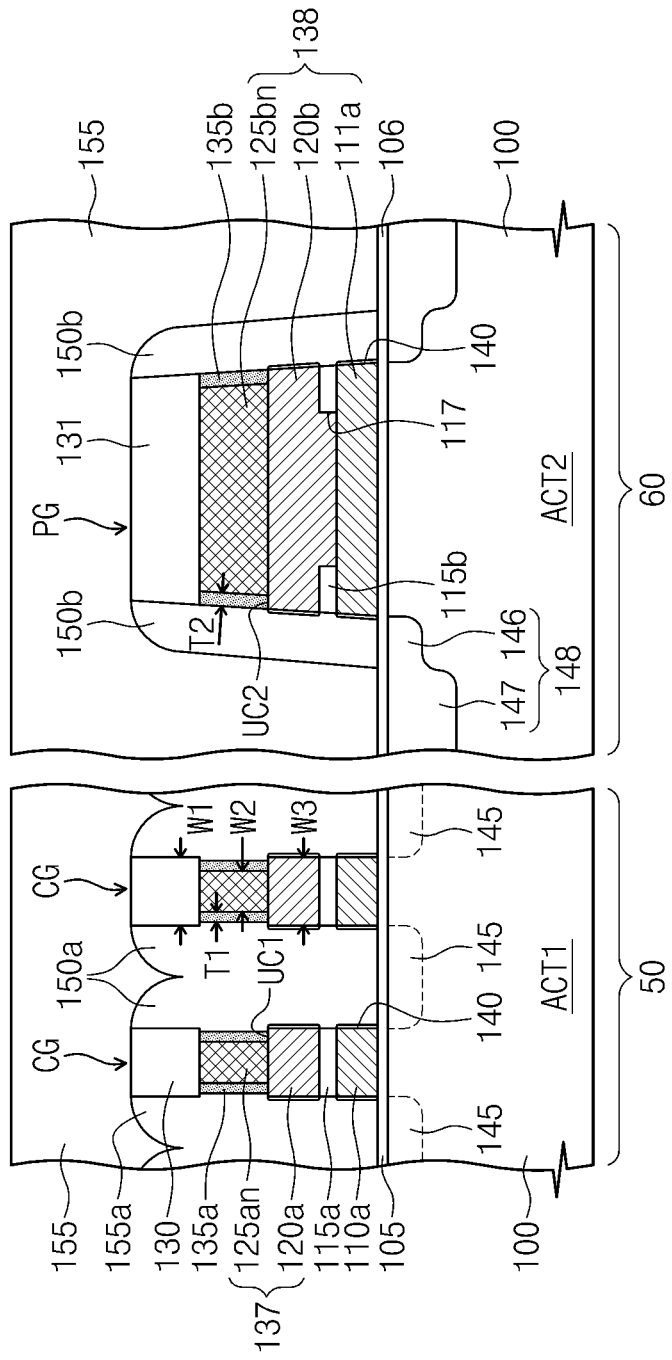
FIG. 1 is a cross-sectional view illustrating a non-volatile memory device according to an embodiment of the inventive concept.

Embodiments of the present inventive concept will now be described more fully hereinafter with reference to the accompanying drawings, in which preferred embodiments of the invention are shown. This invention may, however, be embodied in different forms and should not be construed as limited to the embodiments set forth herein. Like numbers refer to like elements throughout the specification.

It will be understood that, although the terms "first", "second", etc. are used herein to describe various elements, these elements should not be limited by these terms. These terms are used to distinguish one element from another. For example, a "first" element could be termed a "second" element, and, similarly, a "second" element could be termed a "first" element, without departing from the scope of the present inventive concepts. As used herein, the term "and/or" includes any and all combinations of one or more of the associated listed items.

It will be understood that when an element is referred to as being "on" or "connected" or "coupled" to another element, it can be directly on or connected or coupled to the other element or intervening elements can be present. In contrast, when an element is referred to as being "directly on" or "directly connected" or "directly coupled" to another element, there are no intervening elements present. Other words used to describe the relationship between elements should be interpreted in a like fashion (e.g., "between" versus "directly between," "adjacent" versus "directly adjacent," etc.). When an element is referred to herein as being "over" another element, it can be over or under the other element, and either directly coupled to the other element, or intervening elements may be present, or the elements may be spaced apart by a void or gap.

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

In the specification, it will be understood that when a layer (or film) is referred to as being 'on' another layer or substrate, it can be directly on the other layer or substrate, or intervening layers may also be present. In the drawings, the dimensions of layers and regions are exaggerated for clarity of illustration. Also, though terms like a first, a second, and a third are used to describe various regions and layers in various embodiments of the present invention, the regions and the layers are not limited to these terms. These terms are used only to discriminate one region or layer from another region or layer. Therefore, a layer referred to as a first layer in one embodiment can be referred to as a second layer in another embodiment. An embodiment described and exemplified herein includes a complementary embodiment thereof. As used herein, the term 'and/or' includes any and all combinations of one or more of the associated listed items. Like reference numerals refer to like elements throughout.

First Embodiment

FIG. 1 is a cross-sectional view illustrating a non-volatile memory device according to an embodiment of the inventive concept.

Referring to FIG. 1, a semiconductor substrate 100 (hereinafter, referred to as a substrate) may include a cell region 50 and a peripheral region 60. The cell region 50 may correspond to a region where an array of non-volatile memory cells suitable for storing logic data are positioned. The peripheral region 60 may correspond to a region where individual elements, for example, a peripheral field effect transistor, and the like, constituting a peripheral circuit are positioned. The substrate 100 may comprise a silicon substrate, a germanium substrate or a silicon-germanium substrate, or other substrate suitable for transistor devices. However, the inventive concept is not limited thereto. In another example, the substrate 100 may be a compound semiconductor substrate.

A device isolation pattern (not illustrated), which defines active portions ACT1 and ACT2, may be disposed on the substrate 100. In one embodiment, the device isolation patterns may define a first active portion ACT1 in the cell region 50 and a second active portion ACT2 in the peripheral region 60. The first active portion ACT1 may correspond to a portion of the substrate 100 in the cell region 50 surrounded by the device isolation pattern. The second active portion ACT2 may correspond to a portion of the substrate 100 in the peripheral region 60 surrounded by the device isolation pattern. The first active portion ACT1 may be doped with a first conductive-type dopant. The second active portion ACT2 may be doped with the same conductive-type dopant as that of the first active portion ACT1. Alternatively, the second active portion ACT2 may be doped with a second conductive-type dopant that is different from that of the first conductive type dopant of the first active portion ACT1.

A cell gate pattern CG may be positioned on the first active portion ACT1. In some embodiments, the cell gate pattern CG may be included in a non-volatile memory cell. The cell gate pattern CG may include a control gate electrode 137 that extends across the first active portion ACT1. The control gate electrode 137 may include a control base gate 120a and a control metal pattern 125an that are stacked sequentially on one another. The cell gate pattern CG may further include a first gate mask pattern 130 disposed on the control gate electrode 137. In addition, the cell gate patterns CG may further include a tunnel dielectric layer 105, a charge storage layer 110a and a blocking dielectric layer 115a which are sequentially stacked between the first active portion ACT1 and the control gate electrode 137.

The first gate mask pattern 130 may have a first width W1, the control metal pattern 125an may have a second width W2, and the control base gate 120a may have a third width W3. In the present embodiment, the second width W2 of the control metal pattern 125an may be less than the first width W1 of the first gate mask pattern 130 and may be less than the third width W3 of the control base gate 120a. As a result, a pair of first undercut regions UC1 may be defined at both sides of the control metal pattern 125an. The pair of first undercut regions UC1 may be defined under both edge regions of the first gate mask pattern 130.

A pair of first oxidation-resistant spacers 135a may be disposed on both sidewalls of the control metal pattern 125an, respectively. The pair of first oxidation-resistant spacers 135a may be disposed between both edge regions of the first gate mask pattern 130 and between both edge regions of the control base gate 120a. In other words, a bottom end of the first oxidation-resistant spacer 135a may be positioned at the same level as, or at a level higher than a level of an upper surface of the control base gate 120a, and a top end of the first oxidation-resistant spacer 135a may be positioned at the same level as or at a level lower level than a level of a lower surface of the first gate mask pattern 130. The pair of first oxidation-resistant spacers 135a may be directly in contact with both sidewalls of the control metal pattern 125an. According to an embodiment, the pair of first oxidation-resistant spacers 135a may be positioned in the pair of first undercut regions UC1, respectively. In some embodiments, the pair of first oxidation-resistant spacers 135a are limited to the first undercut regions UC1.

The control metal pattern 125an may comprise a metal having low resistivity. For example, the control metal pattern 125an may comprise tungsten, copper, or another suitable metal, or combinations thereof. The first oxidation-resistant spacer 135a may comprise a material having superior oxidation resistance. For example, the first oxidation-resistant spacer 135a may comprise a nitride. According to an embodiment, the first oxidation-resistant spacer 135a may comprise an insulating nitride. For example, the first oxidation-resistant spacer 135a may comprise a silicon nitride and/or silicon oxynitride, etc. According to another embodiment, the first oxidation-resistant spacer 135a may comprise a conductive nitride. For example, the first oxidation-resistant spacer 135a may also comprise a conductive metal nitride (e.g., a titanium nitride (TiN), a tantalum nitride (TaN) and/or tungsten nitride (WN), etc.).

The control base gate 120a may comprise a conductive material having an etch selectivity with respect to the control metal pattern 125an. For example, the control base gate 120a may include a semiconductor doped with a dopant (e.g., silicon doped with a dopant, silicon-germanium doped a dopant, etc.). According to an embodiment, in the case where the control base gate 120a includes the semiconductor doped with the dopant, the control base gate 120a may further include carbon. That is, the control base gate 120a may comprise a semiconductor doped with the dopant and carbon. The dopant may be a first-conductive-type dopant or a second-conductive-type dopant. One of the first conductive type dopant and second conductive type dopant may be an n-type dopant, and the other one may be a p-type dopant. However, the inventive concept is not limited thereto. The control base gate 120a may include another conductive material having an etch selectivity with respect to the control metal pattern 125an. According to an embodiment, the control base gate 120a may include a conductive nitride (e.g., TiN, TaN, etc.) and/or a transition metal (e.g., titanium (Ti), tantalum (Ta), etc.). Alternatively, the control base gate 120a may include the semiconductor doped with the dopant (or the semiconductor doped with the dopant and carbon) and the conductive metal nitride. Alternatively, the control base gate 120a may also include the semiconductor doped with the dopant (or the semiconductor doped with the dopant and carbon), the transition metal and the conductive metal nitride.

The first gate mask pattern 130 may include a dielectric material having an etch selectivity with respect to the control metal pattern 125an. Further, the first gate mask pattern 130 may include a dielectric material having an etch selectivity with respect to the first oxidation-resistant spacer 135a. For example, the first gate mask pattern 130 may include oxide (e.g., a silicon oxide, etc.). However, the inventive concept is not limited thereto. In a case where the first oxidation-resistant spacer 135a includes the conductive nitride, the first gate mask pattern 130 may include a silicon oxide, a silicon nitride and/or a silicon oxynitride, and other suitable materials.

The charge storage layer 110a may include a semiconductor material. For example, the charge storage layer 110a may include polycrystalline silicon, etc. In this case, the charge storage layer 110a may be a floating gate. Charge used for storing data may be stored as free charge in the charge storage layer 110a. The charge storage layer 110a may include sidewalls that are substantially self-aligned with sidewalls of the control base gate 120a. The charge storage layer 110a may be in an undoped state. Alternatively, the charge storage layer 110a may be in a state doped with a dopant. According to an embodiment, the charge storage layer 110a may be doped with the second conductive type dopant that is a different type dopant from that of the first active portion ACT1 present under the charge storage layer 110a. Among the first conductive type dopant and the second conductive type dopant, one may be an n-type dopant and the other one may be a p-type dopant.

Alternatively, the charge storage layer 110a may be doped with the first conductive type dopant that is the same conductive type dopant as that of the first active portion ACT1. When the charge storage layer 110a and the first active portion ACT1 are doped with the same type dopant, charge stored in the charge storage layer 110a may have an opposite type to major carriers present in the charge storage layer 110a. In this case, an energy barrier between charge stored in the charge storage layer 110a and the tunnel dielectric layer 105 can be increased such that data retention characteristics of a non-volatile memory cell may be increased.

According to an embodiment, the charge storage layer 110a may be doped with carbon. For example, the charge storage layer 110a may include silicon doped with carbon. In some embodiments, the charge storage layer 110 may alternatively be doped with carbon and the dopant. For example, the charge storage layer 110a may include silicon doped with carbon and the dopant (e.g., the first conductive type dopant or the second conductive type dopant).

The tunnel dielectric layer 105 may include oxide (e.g., a silicon oxide, etc.) and/or oxynitride (e.g., a silicon oxynitride, etc.). For example, the tunnel dielectric layer 105 may include an oxide formed by performing an oxidation process on the first active portion ACT1 and/or an oxynitride formed by performing an oxynitriding process on the first active portion ACT1, etc. The oxynitriding process may include a oxidation process and nitridation process.

The blocking dielectric layer 115a may include oxide/nitride/oxide (ONO). Alternatively, the blocking dielectric layer 115a may include a high-k dielectric material (e.g., an insulating metal oxide such as an aluminum oxide, a hafnium oxide, etc., or the like) having a higher dielectric constant than that of the tunnel dielectric layer 105. In addition, the blocking dielectric layer 115a may include the high-k dielectric material and a barrier dielectric material. The barrier dielectric material may include a dielectric material (e.g., a silicon oxide, etc.) having a larger bandgap energy than that of the high-k dielectric material.

According to an embodiment, an oxide layer 140 may be disposed on both sidewalls of the control base gate 120a and both sidewalls of the charge storage layer 110a. For example, the oxide layer 140 may include an oxide which is formed by oxidation of the both sidewalls of the control base gate 120a and the both sidewalls of the charge storage layer 110a.

A cell source/drain 145 may be defined in the first active portion ACT1 adjacent to both sides of the cell gate pattern CG. According to an embodiment, the cell source/drain 145 may be doped with a different type dopant from that of the first active portion ACT1 (i.e., the second conductive type dopant).

A first gate spacer 150a may be disposed on both sidewalls of the cell gate pattern CG. According to an embodiment, a plurality of the cell gate patterns CG may be disposed on the first active portion ACT1. The cell gate patterns CG may be spaced apart in a lateral direction relative to each other. As shown in FIG. 1, according to an embodiment, at least a portion of a space between the adjacent cell gate patterns CG may be filled with the first gate spacers 150a. For example, at least a portion of the spacer below a lower surface of the first gate mask pattern 130 may be filled with the first gate spacers 150a. However, the inventive concept is not limited thereto.

The first gate spacer 150a may include oxide (e.g., a silicon oxide, etc.). In some embodiments, the first gate spacer 150a does not include silicon nitride.

Continuing to refer to FIG. 1, a peripheral gate pattern PG may be disposed on the second active portion ACT2 of the peripheral region 60. The peripheral gate pattern PG may include a peripheral gate dielectric layer 106, a peripheral gate electrode 138 and a second gate mask pattern 131 which are sequentially stacked. The peripheral gate electrode 138 may include a peripheral bottom gate 111a, a peripheral sub-gate 120b and a peripheral metal pattern 125bn which are sequentially stacked.

A width of the peripheral metal pattern 125bn may be smaller than widths of the second gate mask pattern 131 and the peripheral sub-gate 120b. Therefore, a pair of second undercut regions UC2 may be defined at both sides of the peripheral metal pattern 125bn, respectively. The pair of second undercut regions UC2 may be defined under both edge regions of the second gate mask pattern 131, respectively.

A pair of second oxidation-resistant spacers 135b may be disposed on both sidewalls of the peripheral metal pattern 125bn. At this time, the pair of second oxidation-resistant spacers 135b may be disposed between both edge regions of the second gate mask patter 131 and both edge regions of the peripheral sub-gate 120b. A bottom end of the second oxidation-resistant spacer 135b may be positioned at the same level as or a higher level than a level of an upper surface of the peripheral sub-gate 120b. A top end of the second oxidation-resistant spacer 135b may be positioned at the same level as or a lower level than a level of a lower surface of the second gate mask pattern 131. The pair of second oxidation-resistant spacers 135b may be positioned to be in direct contact with both sidewalls of the peripheral metal pattern 125bn. According to an embodiment, the pair of second oxidation-resistant spacers 135b may be positioned in the pair of second undercut regions UC2, respectively. The second oxidation-resistant spacer 135b may include a material having superior oxidation resistance characteristics. For example, the second oxidation-resistant spacer 135b may be formed of the same material as the first oxidation-resistant spacer 135a.

The second gate mask pattern 131 may include a dielectric material having an etch selectivity with respect to the peripheral metal pattern 125bn. The peripheral sub-gate 120b may include a conductive material having an etch selectivity with respect to the peripheral metal pattern 125bn. The peripheral metal pattern 125bn may be formed of the same material as that of the control metal pattern 125an. The second gate mask pattern 131 may be formed of the same dielectric material as that of the first gate mask pattern 130. The peripheral sub-gate 120b may be formed of the same conductive material as that of the control base gate 120a.

The peripheral bottom gate 111a may comprise the same semiconductor material as that of the charge storage layer 110a. At this time, the peripheral bottom gate 111a may have electrical conductivity characteristics by doping the material of the gate with a dopant. The peripheral sub-gate 120b may be electrically connected to the peripheral bottom gate 111a. An interlayer dielectric pattern 115b may be disposed between the peripheral sub-gate 120b and the peripheral bottom gate 111a. At this time, the peripheral sub-gate 120b may be extended to fill an opening 117 penetrating the interlayer dielectric pattern 115b. Therefore, the peripheral sub-gate 120b may be positioned to be in direct contact with the peripheral bottom gate 111a. The interlayer dielectric pattern 115b may be formed of the same material as the blocking dielectric layer 115a.

The density of patterns including the peripheral gate pattern PG in the peripheral region 60 may be different from the density of patterns including the cell gate patterns CG of the cell region 50. Therefore, a degree of inclination of a sidewall of the peripheral gate pattern PG may be different from that of a sidewall of the cell gate pattern CG, for example due to various loading effects. More specifically, the angle of inclination of the sidewall of the peripheral gate pattern PG relative to an upper surface of the substrate 100 may be different from that of the sidewall of the cell gate pattern CG relative to the upper surface of the substrate 100. As a result, a first thickness T1 of the first oxidation-resistant spacer 135a positioned on the sidewall of the control metal pattern 125an may be different from a second thickness T2 of the second oxidation-resistant spacer 135b positioned on the sidewall of the peripheral metal pattern 125bn. The first oxidation-resistant spacer 135a may have a first inner sidewall adjacent to the sidewall of the control metal pattern 125an and a first outer sidewall opposite to the first inner sidewall. The first thickness T1 of the first oxidation-resistant spacer 135a may correspond to the shortest distance between the first inner sidewall and the first outer sidewall of the first oxidation-resistant spacer 135a. Likewise, the second oxidation-resistant spacer 135b may have a second inner sidewall adjacent to the sidewall of the peripheral metal pattern 125bn and a second outer sidewall opposite to the second inner sidewall. The second thickness T2 of the second oxidation-resistant spacer 135b may correspond to the shortest distance between the second inner sidewall and the second outer sidewall of the second oxidation-resistant spacer 135b.

According to an embodiment, the inclination of the sidewall of the peripheral gate pattern PG may be gentler than that of the sidewall of the cell gate pattern CG. That is, the incline angle of the sidewall of the peripheral gate pattern PG relative to the upper surface of the substrate 100 may be less than that of the sidewall of the cell gate pattern CG relative to the upper surface of the substrate 100. In this case, the second thickness T2 of the second oxidation-resistant spacer 135b may be larger than the first thickness T1 of the first oxidation-resistant spacer 135a.

According to an embodiment, the first outer sidewall of the first oxidation-resistant spacer 135a may be laterally recessed relative to a sidewall of the first gate mask pattern 130. Accordingly, the second width W2 of the control metal pattern 125an may be less than the third width W3 of the control base gate 120a, or may be less than the first width W1 of the first gate mask pattern 130. Also, the sum of the second width W2 of the control metal pattern 125an and the first thicknesses T1 of the pair of first oxidation-resistant spacers 135a may be less than the third width W3 of the control base gate 120a, or may be less than the first width W1 of the first gate mask pattern 130.

In some embodiments, including any of the embodiments disclosed herein, the first thickness T1 of one of the pair of first oxidation-resistant spacers 135a may be less than one-half a width W2 of a narrowest portion of the control metal pattern 125an. Also, the height of the oxidation-resistant spacers may be substantially equal to a height of the control metal pattern 125an.

According to an embodiment, the oxide layer 140 may also be disposed on both sidewalls of the peripheral sub-gate 120b and the peripheral bottom gate 111a. A peripheral source/drain 148 may be disposed in the second active portion ACT2 adjacent to both sides of the peripheral gate pattern PG. The peripheral source/drain 148 may be doped with a different type dopant from a dopant in the second active portion ACT2. Second gate spacers 150b may be disposed on the both sidewalls of the peripheral gate pattern PG, respectively. The peripheral source/drain 148 may have a lightly doped drain (LDD) structure including a low concentration region 146 and a high concentration region 147. The second gate spacer 150b may be formed of the same material as the first gate spacer 150a. An interlayer dielectric layer 155 may be disposed on an entire surface of the substrate 100 including the gate spacers 150a and 150b and the gate patterns CG and PG. The interlayer dielectric layer 155 may include oxide.

According to the foregoing non-volatile memory device, the pair of first oxidation-resistant spacers 135a may be disposed on the both sidewalls of the control metal pattern 125an. Therefore, the control metal pattern 125an may be prevented from being oxidized during a subsequent oxidation process or otherwise by exposure to oxygen, for example, during the process for forming the oxide layer 140. Also, the first oxidation-resistant spacers 135a may be positioned to be confined to the region defined between both edge regions of the first gate mask pattern 130 and both edge regions of the control base gate 120a. This enables minimization of an increase in the line width of the cell gate pattern CG that would otherwise be caused by the presence of the first oxidation-resistant spacers 135a. As a result, a non-volatile memory device having excellent reliability and optimized for high integration density can be achieved.

In addition, a resistance of the control gate electrode 137 may be minimized by the material of the control metal pattern 125an having low resistivity characteristics. Therefore, a non-volatile memory device operating at a high speed can be achieved.

Likewise, the peripheral metal pattern 125bn may be prevented from being oxidized due to the presence of the second oxidation-resistant spacers 135b on both sidewalls of the peripheral metal pattern 125bn. Also, the second oxidation-resistant spacers 135b may be positioned to be confined between both edge regions of the second gate mask pattern 131 and both edge regions of the peripheral sub-gate 120b. This enables minimization of an increase in the line width of the peripheral gate pattern PG that would otherwise be caused by the presence of the first oxidation-resistant spacers 135a. As a result, a peripheral transistor in the peripheral region 60 can have excellent reliability and can be optimized for high integration density. In addition, the peripheral gate electrode 138 also includes the peripheral metal pattern 125bn having low resistivity characteristics, such that the peripheral transistor can operate at a high speed.

Furthermore, according to an embodiment, the second thickness T2 of the second oxidation-resistant spacer 135b may be greater than the first thickness T1 of the first oxidation-resistant spacer 135a. Thus, the cell gate patterns CG having relatively narrow linewidths and/or spaces can prevent the control metal pattern 125an from being oxidized and also maintain narrow linewidth and/or space due to the first oxidation-resistant spacer 135a having a relatively thin thickness. Also, the peripheral gate patterns PG having a relatively greater widths can efficiently prevent the peripheral metal pattern 125bn from becoming oxidized as a result of the second oxidation-resistant spacer 135b having a relatively greater thickness. As a result, it is possible to realize a non-volatile memory device which has excellent reliability and which is optimized for high integration.

Next, various modified examples of non-volatile memory devices according to the inventive concept will be described with reference to the following drawings.

Referring to the embodiment of FIG. 1, in this example, the sum of the width W2 of the control metal pattern 125an and the thicknesses T1 of the pair of first oxidation-resistant spacers 135a may be smaller than the width W3 of the control base gate 120a. However, embodiments of the inventive concept are not limited thereto. As shown in the example embodiment of FIG. 2, the sum of the width of the control metal pattern 125an and the thicknesses of the pair of first oxidation-resistant spacers 135a' disposed on the both sidewalls of the control metal pattern 125an may be substantially equal to the width of the control base gate 120a. In this case, the outer sidewall of the first oxidation-resistant spacer 135a' may be substantially self-aligned with the sidewall of the first gate mask pattern 130. In this example embodiment, the first oxidation-resistant spacer 135a' of FIG. 2 may be formed of the same material as that of the first oxidation-resistant spacer 135a of FIG. 1.

Figure 3:
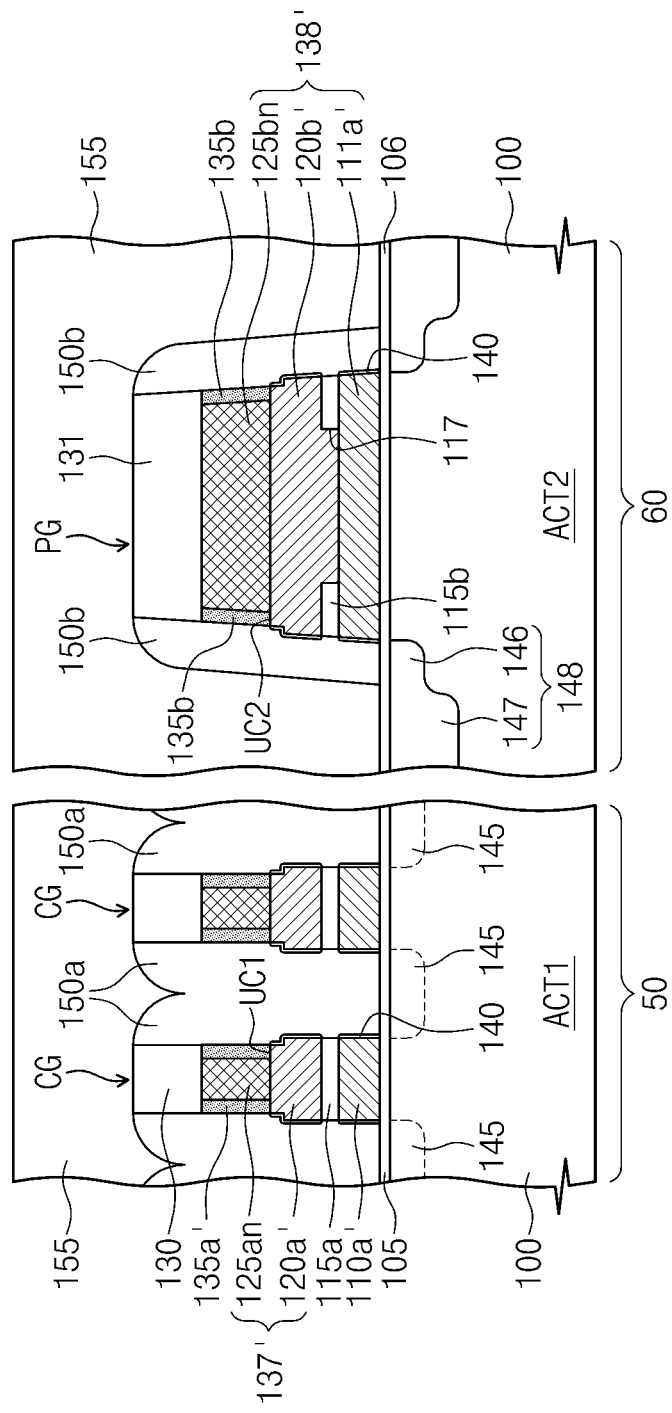
FIG. 3 is a cross-sectional view illustrating another modified example of a non-volatile memory device according to an embodiment of the inventive concept.

FIG. 3 is a cross-sectional view illustrating another modified example of a non-volatile memory device according to an embodiment of the inventive concept.

According to the present modified example, as shown in FIG. 3, a sidewall of a control base gate 120a' included in a control gate electrode 137' may have a stepped shape. Specifically, a width of an upper portion of the control base gate 120a' may be smaller than that of a lower portion of the control base gate 120a'. Therefore, the sidewall of the control base gate 120a' may have the stepped shape. In this case, the width of the upper portion of the control base gate 120a' may be substantially equal to the first width W1 of the first gate mask pattern 130, and the width of the lower portion of the control base gate 120a' may be greater than the first width W1 of the first gate mask pattern 130. Both of the sidewalls of the underlying charge storage layer 110a' may be self-aligned with both of the sidewalls of the lower portion of the control base gate 120a'. According to an embodiment, when the sidewall of the control base gate 120a' has the stepped shape, the outer sidewall of the first oxidation-resistant spacer 135a' may be substantially self-aligned to the sidewall of the first gate mask pattern 130. Also, in this embodiment, the first oxidation resistant spacer 135a' may cover a portion of a top surface and a portion of a sidewall surface of the upper portion of the control base gate 135'.

Similarly, in the embodiment of FIG. 3, a sidewall of a peripheral sub-gate 120b' included in a peripheral gate electrode 138' may also have a stepped shape. That is, a width of an upper portion of the peripheral sub-gate 120b' may be smaller than that of a lower portion. In this case, both of the sidewalls of a peripheral bottom gate 111a' may be substantially self-aligned to both of the sidewalls of the lower portion of the peripheral sub-gate 120b'.

Figure 4:
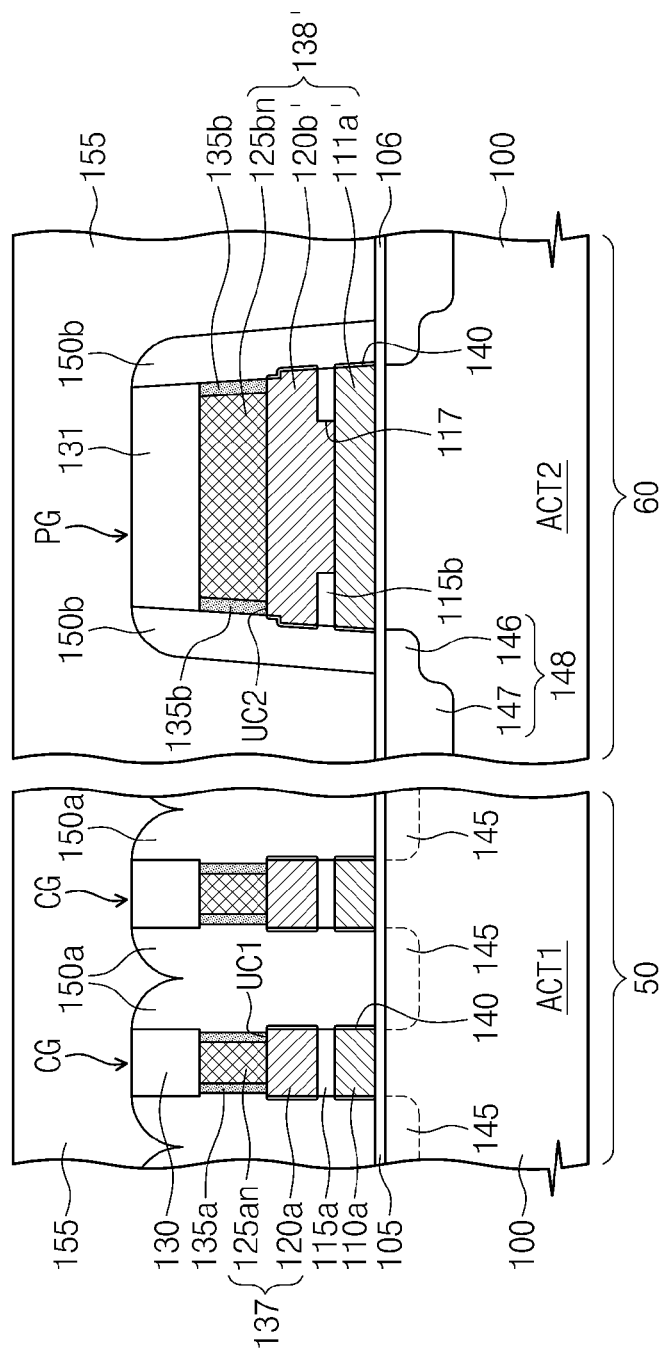
FIG. 4 is a cross-sectional view illustrating still another modified example of a non-volatile memory device according to an embodiment of the inventive concept.

FIG. 4 is a cross-sectional view illustrating still another modified example of a non-volatile memory device according to an embodiment of the inventive concept.

According to the present modified example, as shown in FIG. 4, the sidewalls of the control base gate 120a in the control gate electrode 137 are flat, whereas the sidewalls of the peripheral sub-gate 120b' in the peripheral gate electrode 138' may have a stepped shape. In this case, the outer sidewall of the first oxidation-resistant spacer 135a may be positioned to be recessed laterally relative to the sidewall of the first gate mask pattern 130. However, the inventive concept is not limited thereto. For example, in the example embodiment of FIG. 4, the outer sidewall of the first oxidation-resistant spacer 135a can alternatively be substantially self-aligned to the sidewall of the first gate mask pattern 130, for example, in accordance with the embodiment of FIG. 2.

Figure 5:
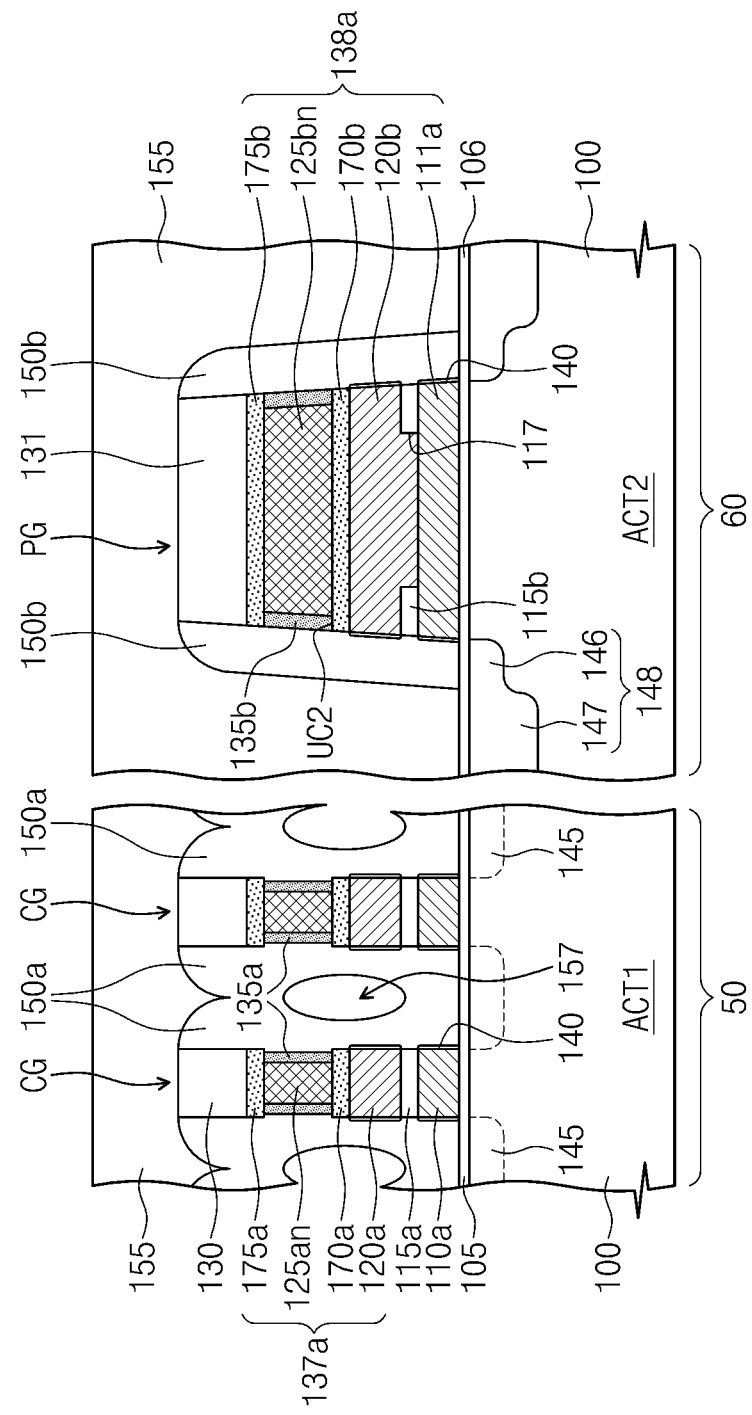
FIG. 5 is a cross-sectional view illustrating yet another modified example of a non-volatile memory device according to an embodiment of the inventive concept.

FIG. 5 is a cross-sectional view illustrating yet another modified example of a non-volatile memory device according to an embodiment of the inventive concept.

Referring to FIG. 5, according to the present modified example, a control gate electrode 137a may further include a first lower barrier pattern 170a positioned between the control base gate 120a and the control metal pattern 125an. In this case, the control base gate 120a may be formed of a semiconductor material that is doped with a dopant (e.g., silicon doped with a dopant, silicon-germanium doped with a dopant, etc.) and/or a semiconductor material that is doped with a dopant and carbon (e.g., silicon doped with a dopant and carbon, silicon-germanium doped with a dopant and carbon, etc.). The first lower barrier pattern 170a may be formed of a conductive material having properties so as to minimize diffusion of metal atoms from the control metal pattern 125an into the control base gate 120a. For example, the first lower barrier pattern 170a may comprise a conductive metal nitride (e.g., a titanium nitride, a tantalum nitride and/or a tungsten nitride, etc.). In addition, the first lower barrier pattern 170a may also further comprise a transition metal (e.g., titanium or tantalum, etc.) disposed between the conductive metal nitride and the control base gate 120a.

A width in the horizontal direction of the top surface of the substrate 100 of the first lower barrier pattern 170a may be greater than that of the control metal pattern 125an. In this case, the pair of first oxidation-resistant spacers 135a may be disposed between the both edge regions of the first gate mask pattern 130 and both edge regions of the first lower barrier pattern 170a. Both of the sidewalls of the first lower barrier pattern 170a may be substantially self-aligned to both of the sidewalls of the first gate mask pattern 130.

According to an embodiment, the control gate electrode 137a may further include a first upper barrier pattern 175a disposed between the control metal pattern 125an and the first gate mask pattern 130. The first upper barrier pattern 175a may be formed of a conductive material having properties so as to minimize diffusion of metal atoms from the control metal pattern 125an into the first gate mask pattern 130. For example, the first upper barrier pattern 175a may comprise a conductive metal nitride (e.g., a titanium nitride, a tantalum nitride and/or a tungsten nitride, etc.). In addition, the first upper barrier pattern 175a may also further comprise a transition metal (e.g., titanium and/or tantalum, etc.) disposed between the conductive metal nitride and the control metal pattern 125an. A width of the first upper barrier pattern 175a may be greater than that of the control metal pattern 125an. The pair of first oxidation-resistant spacers 135a may be disposed between both of the edge regions of the first upper barrier pattern 175a and both of the edge regions of the first lower barrier pattern 170a. Further, both of the sidewalls of the first upper barrier pattern 175a may be substantially self-aligned to both of the sidewalls of the first gate mask pattern 130. According to an embodiment, any one of the first lower barrier pattern 170a and the first upper barrier pattern 175a may be omitted.

In similar fashion to the cell gate pattern CG, a peripheral gate electrode 138a in the peripheral region 60 may further include a second lower barrier pattern 170b disposed between the peripheral sub-gate 120b and the peripheral metal pattern 125bn. A width of the second lower barrier pattern 170b may be greater than that of the peripheral metal pattern 125bn. In this case, the pair of second oxidation-resistant spacers 135b may be disposed between both of the edge regions of the second lower barrier pattern 170b and both of the edge regions of the second gate mask pattern 131. Both of the sidewalls of the second lower barrier pattern 170b may be substantially self-aligned to both of the sidewalls of the second gate mask pattern 131. The peripheral gate electrode 138a may further include a second upper barrier pattern 175b disposed between the peripheral metal pattern 125bn and the second gate mask pattern 131. A width of the second upper barrier pattern 175b may be greater than that of the peripheral metal pattern 125bn. In this case, the pair of second oxidation-resistant spacers 135b may be disposed between both edge regions of the second upper barrier pattern 175b and both edge regions of the second lower barrier pattern 170b. The second lower barrier pattern 170b may be formed of the same conductive material as that of the first lower barrier pattern 170a, and the second upper barrier pattern 175b may be formed of the same conductive material as that of the first upper barrier pattern 175a. According to an embodiment, any one of the second lower barrier pattern 170b and the second upper barrier pattern 175b may be omitted.

In various embodiments of the present inventive concepts, the first and second lower barrier patterns 170a and 170b and/or the first and second upper barrier patterns 175a and 175b may be applied to any one of the non-volatile memory device embodiments described herein, including the embodiments of FIGS. 1 through 4.

In some embodiments, including any of the embodiments disclosed herein, the thickness of the lower barrier layer 170a may be less than one-half a thickness of the control metal pattern 125an. Similarly, the thickness of the upper barrier layer 175a may be less than one-half a thickness of the control metal pattern 125an.

According to an embodiment, air gaps 157 may be disposed in the interlayer dielectric layer 155 or in the gate spacer layer 150a at positions that are between neighboring ones of the cell gate patterns CG. As an interval between the adjacent cell gate patterns CG becomes narrow, the air gap 157 may be formed. The first gate spacers 150a may cover the air gap 157. The air gap 157 has a lower dielectric constant than oxide. As a result, parasitic electrostatic capacitance characteristics between the adjacent cell gate patterns CG can be minimized, so that a non-volatile memory device having excellent reliability can be achieved. In other embodiments, the air gap 157 may also be formed between the adjacent cell gate patterns CG included in the non-volatile memory devices of FIGS. 1 through 4.

Next, a method of fabricating a non-volatile memory device according to an embodiment of the inventive concept will be described with reference to the following drawings.

Figure 6A:
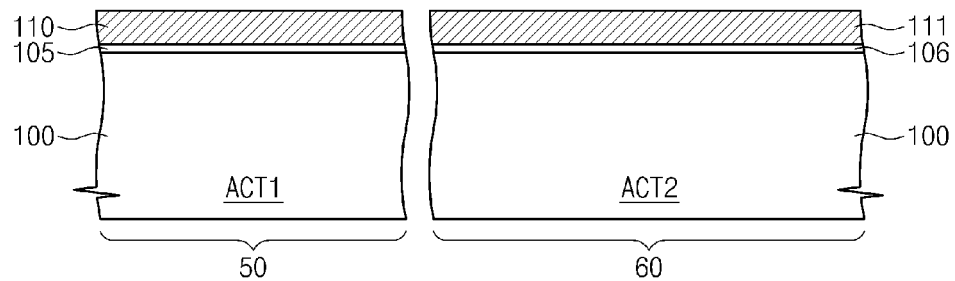
FIGS. 6A through 6G are cross-sectional views illustrating a method of fabricating a non-volatile memory device according to an embodiment of the inventive concept.
Figure 6B:
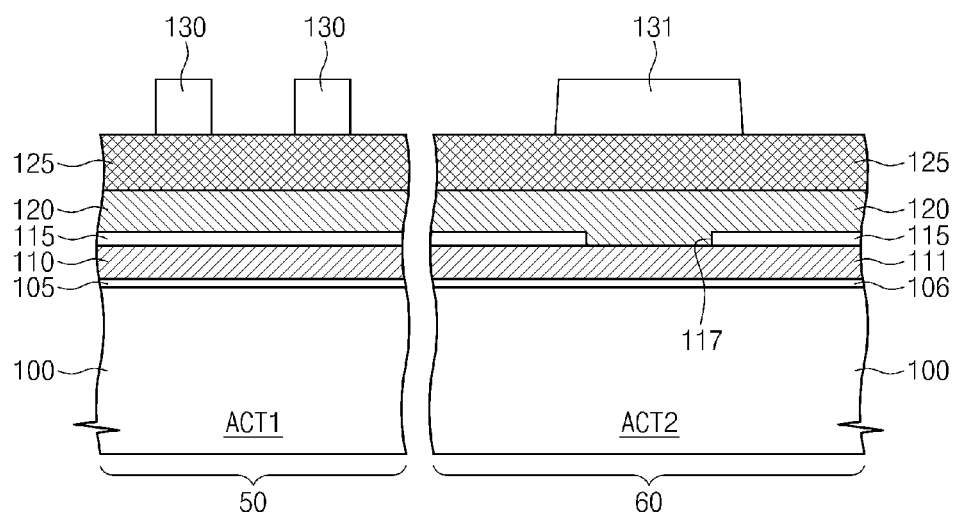
Figure 6C:
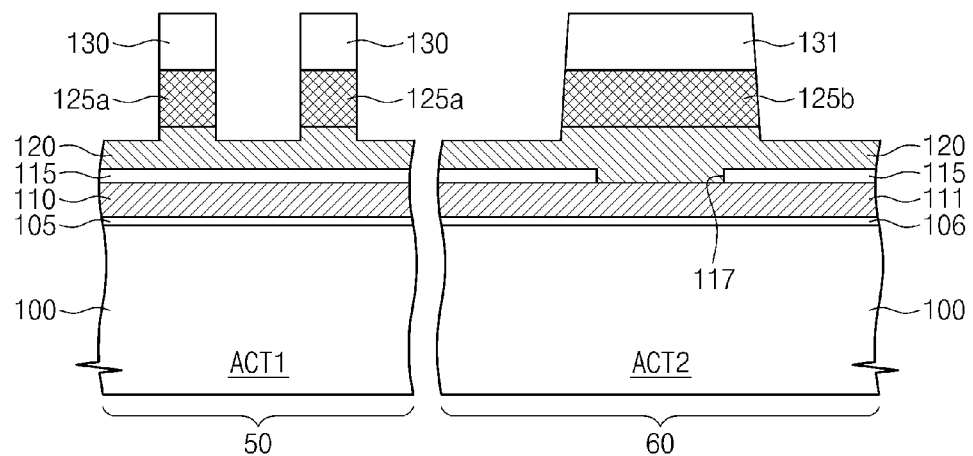
Figure 6D:
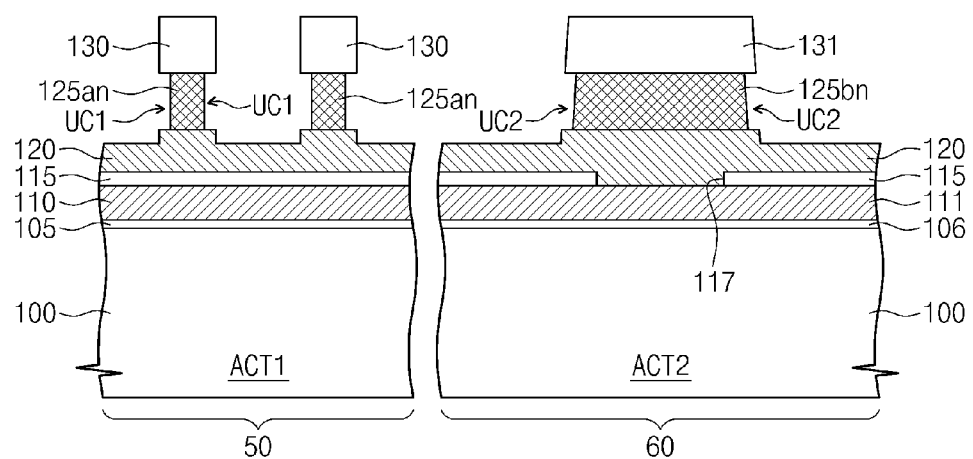
Figure 6E:
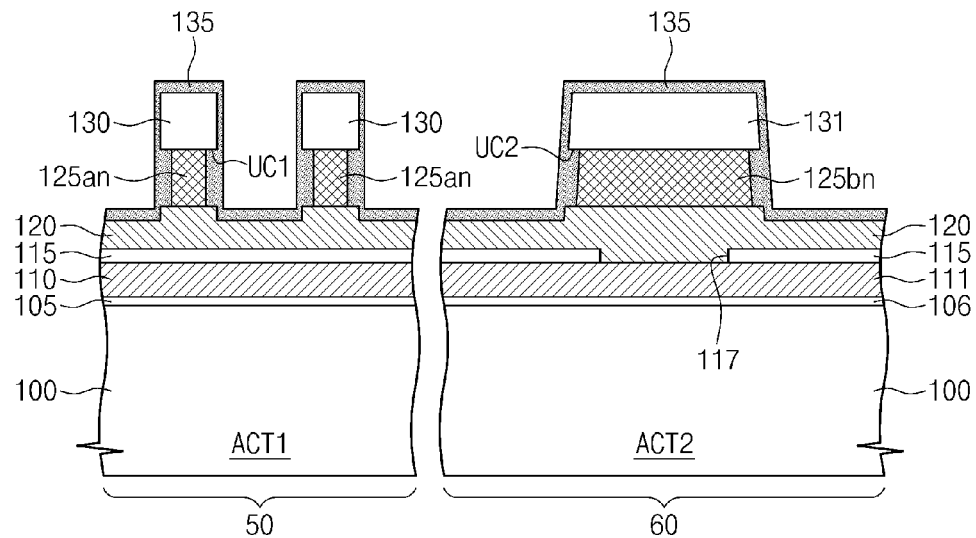
Figure 6F:
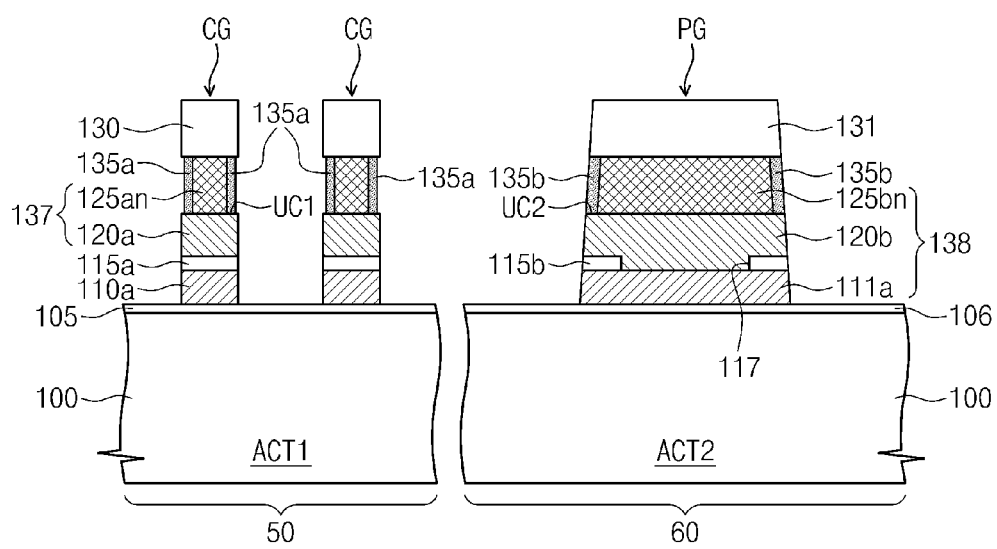
Figure 6G:
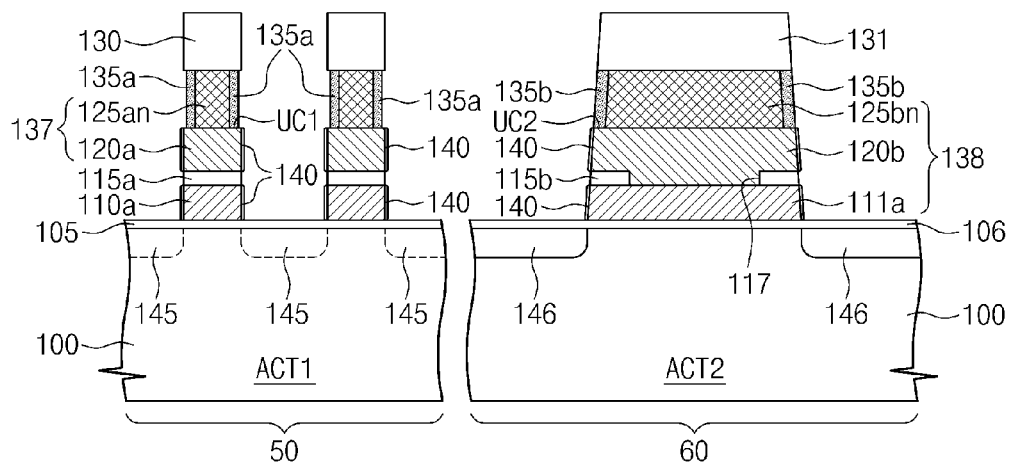
Figure 7:
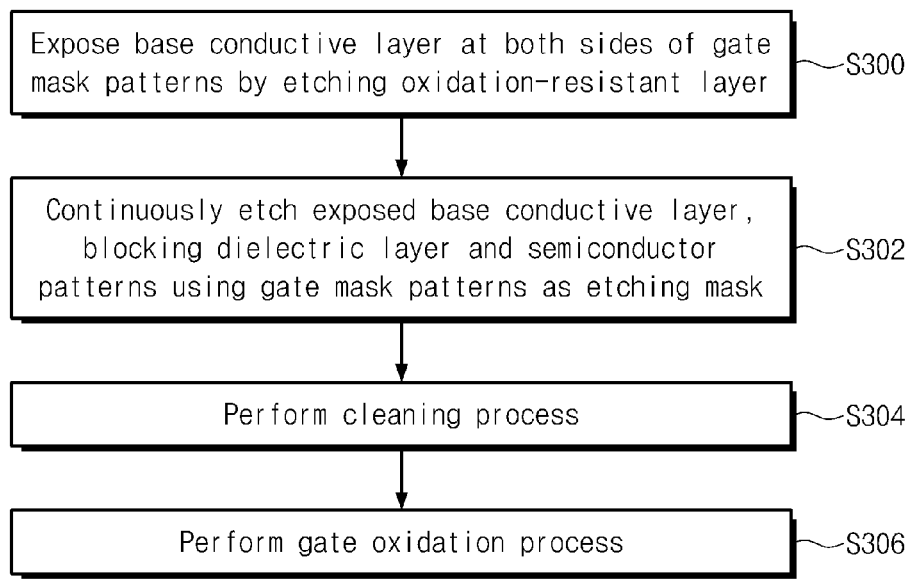
FIG. 7 is a flow chart illustrating a method of forming an oxidation-resistant spacer and gate patterns of a non-volatile memory device according to an embodiment of the inventive concept.

FIGS. 6A through 6G are cross-sectional views illustrating a method of fabricating a non-volatile memory device according to an embodiment of the inventive concept, and FIG. 7 is a flow chart illustrating a method of forming an oxidation-resistant spacer and gate patterns of a non-volatile memory device according to an embodiment of the inventive concept.

Referring to FIG. 6A, a substrate 100 including a cell region 50 and a peripheral region 60 may be prepared. A first active portion ACT1 in the cell region 50 and a second active portion ACT2 in the peripheral region 60 may be defined. A tunnel dielectric layer 105 and a first semiconductor pattern 110 may be sequentially formed on the first active portion ACT1. A peripheral gate dielectric layer 106 and a second semiconductor pattern 111 may be sequentially formed on the second active portion ACT2. The first and second active portions ACT1 and ACT2 may be defined by a device isolation pattern (not illustrated) formed on the substrate 100. The first semiconductor pattern 110 may be formed at the first active portion ACT1 in a self-aligned manner, and the second semiconductor pattern 111 may be formed at the second active portion ACT2 in a self-aligned manner.

For example, the tunnel dielectric layer 105 may be formed on the substrate 100 of the cell region 50. The peripheral gate dielectric layer 106 may be formed on the substrate 100 of the peripheral region 60. The tunnel dielectric layer 105 and the peripheral gate dielectric layer 106 may be formed at the same time. Alternatively, the tunnel dielectric layer 105 and the peripheral gate dielectric layer 106 may be sequentially formed. A semiconductor layer and a hard mask layer may be sequentially formed on an entire surface of the substrate 100 having the dielectric layers 105 and 106. By continuously patterning the hard mask layer, the semiconductor layer, the dielectric layers 105 and 106 and the substrate 100, a trench (not illustrated), which defines the relative positions of the first and second active portions ACT1 and ACT2, may be formed. At this time, the first semiconductor pattern 110 and the first hard mask pattern (not illustrated) may be sequentially formed on the tunnel dielectric layer 105 on the first active portion ACT1, and the second semiconductor pattern 111 and the second hard mask pattern (not illustrated) may be sequentially formed on the peripheral gate dielectric layer 106 on the second active portion ACT2. Therefore, the first and second semiconductor patterns 110 and 111 may be formed to the first and second active regions ACT1 and ACT2 in a self-aligned manner, respectively. Subsequently, a device isolation pattern (not illustrated) that fills the trench may be formed. Subsequently, the first and second hard mask patterns may be removed.

The second semiconductor pattern 111 may be made to be electrically conductive by being doped with a dopant. The first semiconductor pattern 110 may be in an undoped state or a state doped with a dopant and/or carbon. When the first and second semiconductor patterns 110 and 111 are doped with the same type dopant, the semiconductor layer may be doped by an in-situ method. Alternatively, when the first semiconductor pattern 110 is in an undoped state or is doped with a different type dopant from the second semiconductor pattern 111, a selective doping method may be performed on the semiconductor layer.

However, embodiments of the inventive concepts are not limited thereto. The first and second semiconductor patterns 110 and 111 may be formed by other methods.

Referring to FIG. 6B, a blocking dielectric layer 115 may be formed on the substrate 100 having the first and second semiconductor patterns 110 and 111. An opening 117, which exposes the second semiconductor pattern 111, may be formed by patterning the blocking dielectric layer 115 in the peripheral region 60. Subsequently, a base conductive layer 120 and a metal layer 125 may be sequentially formed on the entire surface of the substrate 100. The base conductive layer 120 in the peripheral region 60 may fill the opening 117 to be in contact with the second semiconductor pattern 111.

A gate mask layer is formed on the metal layer 125, and a first gate mask pattern 130 in the cell region 50 and a second gate mask pattern 131 in the peripheral region 60 may be formed by patterning the gate mask layer. The gate mask layer may include a dielectric material having an etch selectivity with respect to the metal layer 125, the base conductive layer 120 and the semiconductor patterns 110 and 111. For example, the gate mask layer may be formed of an oxide layer.

Referring to FIG. 6C, a control metal pattern 125a in the cell region 50 and a peripheral metal pattern 125b in the peripheral region 60 may be formed by etching the metal layer 125 using the first and second gate mask patterns 130 and 131 as etching masks. The metal layer 125 may be etched by a first dry etching process having dominant anisotropy characteristics. The base conductive layer 120 may be exposed at both sides of the control and peripheral metal patterns 125a and 125b.

According to an embodiment, due to the difference in pattern density between the cell region 50 and the peripheral region 60 or the like, the resulting degree of inclination of sidewalls of the control metal pattern 125a and the first gate mask pattern 130 may be different from that of sidewalls of the peripheral metal pattern 125b and the second gate mask pattern 131. For example, the sidewalls of patterns 125b and 131 stacked in the peripheral region 60 may be inclined to a more gentle degree as compared to the degree of inclination of the sidewalls of patterns 125a and 130 stacked in the cell region 50. That is, the inclination angle between the sidewalls of patterns 125b and 131 stacked in the peripheral region 60 and an upper surface of the substrate 100 may be less than that of the sidewalls of patterns 125a and 130 stacked in the cell region 50 and the upper surface of the substrate 100.

Referring to FIG. 6D, both of the sidewalls of the control metal pattern 125a and both of the sidewalls of the peripheral metal pattern 125b are etched in a lateral direction. As a result, a pair of first undercut regions UC1 may be formed at both sides of a control metal pattern 125an etched laterally. Also, a pair of second undercut regions UC2 may be formed at both sides of a peripheral metal pattern 125bn etched laterally. The pair of first undercut regions UC1 may be formed under both edge regions of the first gate mask pattern 130, respectively, and the pair of second undercut regions UC2 may be formed under both edge regions of the second gate mask pattern 131, respectively. In this manner, the undercut regions UC1, UC2 are recessed in a lateral direction, relative to outer edges the gate mask patterns 130, 131 that lie above them.

According to an embodiment, the sidewalls of the control and peripheral metal patterns 125a and 125b may be etched in a lateral direction using a reactive dry etching process. The reactive dry etching process may have a dominant isotropy. As a result, both sidewalls of the control and peripheral metal patterns 125a and 125b may be etched in a lateral direction. For example, a back bias of the reactive dry etching process may be reduced, or radical components in an etching gas of the reactive dry etching process may be increased. Alternatively, both sidewalls of the control and peripheral metal patterns 125a and 125b may be etched by a wet etching process.

Referring to FIG. 6E, an oxidation-resistant layer 135 may be deposited on the substrate 100 having the undercut, or recessed, regions UC1 and UC2. In various embodiments, the oxidation-resistant layer 135 may be deposited by a chemical vapor deposition process or an atomic layer deposition process, or by another suitable process. The oxidation-resistant layer 135 may partially or completely fill the undercut regions UC1 and UC2.

According to an embodiment, as described above, due to a difference in degree of inclination of the sidewalls, a deposition thickness of the oxidation-resistant layer 135 on the sidewalls of the patterns 125an and 130 stacked in the cell region 50 may be different from the deposition thickness of the oxidation-resistant layer 135 on the sidewalls of the patterns 125bn and 131 stacked in the peripheral region 60. For example, when the sidewalls of the patterns 125bn and 131 stacked in the peripheral region 60 have a more gentle angle of inclination than those of the patterns 125an and 130 stacked in the cell region 50, the deposition thickness of the oxidation-resistant layer 135 on the sidewalls of the patterns 125bn and 131 stacked in the peripheral region 60 may be greater than that of the oxidation-resistant layer 135 on the sidewalls of the patterns 125an and 130 stacked in the cell region 50. The oxidation-resistant layer 135 on upper surfaces of the gate mask patterns 130 and 131 and the base conductive layer 120 may be thicker than that on the sidewalls of the patterns 125an, 130, 125bn and 131.

Next, a method of forming oxidation-resistant layers and gate patterns will be described in detail with reference to the flow chart of FIG. 7.

Referring to FIGS. 6E, 6F and 7, in operation S300, the base conductive layer 120 at both sides of the gate mask patterns 130 and 131 may be exposed by etching the oxidation-resistant layer 135. At this time, a first oxidation-resistant spacer 135a may be formed in the first undercut region UC1, and a second oxidation-resistant spacer 135b may be formed in the second undercut region UC2. The oxidation-resistant layer 135 may be etched by a second dry etching process having a dominant anisotropy. The second dry etching process may include a dominant anisotropic etching component and a weak isotropic etching component. The oxidation-resistant layer 135 on the gate mask patterns 130 and 131 and the base conductive layer 120 is etched by the dominant anisotropic etching component of the second dry etching process such that the upper surfaces of the gate mask patterns 130 and 131 and the base conductive layer 120 may be exposed. The oxidation-resistant layer 135 on the sidewalls of the gate mask patterns 130 and 131 may be etched by the weak isotropic etching component of the second dry etching process.

According to an embodiment, immediately following the performing of the second dry etching process, some portions of the first and second oxidation-resistant spacers 135a and 135b may be disposed outside the undercut regions UC1 and UC2. For example, some portions of the first and second oxidation-resistant spacers 135a and 135b may be extended to be disposed on at least a portion of the sidewalls of the gate mask patterns 130 and 131.

According to another embodiment, immediately after the performing of the second dry etching process, at least one of the first and second oxidation-resistant spacers 135a and 135b may be confinedly formed in the undercut region UC1 and/or UC2. For example, when the oxidation-resistant layer 135 on the sidewalls of the patterns 125bn and 131 stacked in the peripheral region 60 is thicker than that on the sidewalls of the patterns 125an and 130 stacked in the cell region 50, the first oxidation-resistant spacer 135a may be confinedly formed in the first undercut region UC1, and a portion of the second oxidation-resistant spacer 135b may also be disposed beyond the second undercut region UC2. Alternatively, immediately after the performing of the second dry etching process, all the first and second oxidation-resistant spacers 135a and 135b may be confinedly formed in the first and second undercut regions UC1 and UC2.

In operation S302, the exposed base conductive layer 120, the blocking dielectric layer 115 and the semiconductor patterns 110 and 111 may be continuously etched using the gate mask patterns 130 and 131 as etching masks. Therefore, a charge storage layer 110a, a patterned blocking dielectric layer 115a and a control base gate 120a, which are sequentially stacked on the first active region ACT1, may be formed. Also, a peripheral bottom gate 111a, an interlayer dielectric pattern 115b and a peripheral sub-gate 120b, which are sequentially stacked on the second active region ACT2, may be formed. The interlayer dielectric pattern 115b may include the opening 117. Therefore, the peripheral sub-gate 120b may be electrically connected to the peripheral bottom gate 111a.

The base conductive layer 120, the blocking dielectric layer 115 and the semiconductor patterns 110 and 111 may be etched by a third dry etching process. According to an embodiment, the third dry etching process may include a first sub-etching process, a second sub-etching process and a third sub-etching process. The base conductive layer 120 may be etched by the first sub-etching process, and the blocking dielectric layer 115 may be etched by the second sub-etching process. The semiconductor patterns 110 and 111 may be etched by the third sub-etching process. According to an embodiment, etching recipes of the first, second and third sub-etching processes may be different from each other.

The third dry etching process may have a dominant anisotropic etching component and a weak isotropic etching component. In other words, each of the first, second and third sub-etching processes may have a dominant anisotropic etching component and a weak isotropic etching component. As described above, some portions of the first and second oxidation-resistant spacers 135a and 135b may extend beyond the first and second undercut regions UC1 and UC2 immediately after the second dry etching process. In this case, after the performing of the third dry etching process, those residual portions of the first and second oxidation-resistant spacers 135a and 135b that remain positioned beyond the undercut regions UC1 and UC2 may be removed by the third dry etching. Therefore, the first and second oxidation-resistant spacers 135a and 135b are thus confinedly formed, or otherwise positioned exclusively, in the first and second undercut regions UC1 and UC2 after the third dry etching process.

When at least one of the first and second oxidation-resistant spacers 135a and 135b is confinedly formed in the undercut region UC1 and/or UC2 immediately after the performing of the second dry etching process, an outer sidewall of the confined oxidation-resistant spacer 135a and/or 135b may also be recessed laterally relative to the sidewall of the gate mask pattern 130 and/or 131 as a result of the weak isotropic etching component of the third dry etching process. According to an embodiment, after the performing of the third dry etching process, the outer sidewall of the first oxidation-resistant spacer 135a may be recessed in a lateral direction relative to the sidewall of the first gate mask pattern 130 due to the reduction in thickness in the portions of the oxidation-resistant layer 135.

However, the inventive concept is not limited thereto. For example, according to an embodiment, portions of at least one of the first and second oxidation-resistant spacers 135a and 135b may remain disposed outside the undercut region UC1 and/or UC2, even after the performing of the third dry etching process.

After the performing of the foregoing operation S302, a cleaning process may be performed on the substrate 100 in operation S304. In a case where portions of at least one of the first and second oxidation-resistant spacers 135a and 135b remain disposed outside the undercut region UC1 and/or UC2 after the performing of the third dry etching process, such portions may be removed by the cleaning process. As a result, immediately after the performing of the operation S300, the operation 302 or the operation S304, the first and second oxidation-resistant spacers 135a and 135b are confinedly formed in the first and second undercut regions UC1 and UC2, so that the first and second oxidation-resistant spacers 135a, 135b are positioned exclusively in those regions UC1, UC2.

Referring to FIGS. 6G and 7, after performing the cleaning process of operation S304, a gate oxidation process may be performed on the substrate 100 in operation S306. As a result, an oxide layer 140 may be formed on both sidewalls of the control base gate 120a, the charge storage layer 110a, the peripheral sub-gate 120b and the peripheral bottom gate 111a. Etched sidewalls of the gates 120a, 120b and 111a and the charge storage layer 110a may be cured by the gate oxidation process. The gate oxidation process may be performed in an oxygen source gas atmosphere. For example, an oxygen source gas of the gate oxidation process may include oxygen ($O_2$), nitrogen monoxide (NO), water vapor ($H_2O$) and/or nitrous oxide ($N_2O$), etc. A process temperature of the gate oxidation process may be in the range of about 300° C. to about 900° C.

According to the foregoing method, during the performing of the gate oxidation process in operation S306, the control metal pattern 125an and the peripheral metal pattern 125bn are protected from oxidation by the first and second oxidation-resistant spacers 135a and 135b. Therefore, a non-volatile memory device having excellent reliability can be achieved by minimizing oxidation of the metal patterns 125an and 125bn.

If the metal patterns 125an and 125bn were to be oxidized by the gate oxidation process, various problems such as an abnormal growth of the oxide or the like may occur, so that reliability of a non-volatile memory device would be adversely affected. However, according to embodiments of the inventive concept, the first and second oxidation-resistant spacers 135a and 135b operate to protect the metal patterns 125an and 125bn, during the subsequent gate oxidation process, thereby achieving a non-volatile memory device having excellent reliability.

Also, the first and second oxidation-resistant spacers 135a and 135b are confinedly formed in the first and second undercut, or recessed, regions UC1 and UC2. Therefore, the phenomena of increasing widths of the gate patterns or the like may be minimized. As a result, a non-volatile memory device optimized for high integration density can be achieved.

Continuously, referring to FIG. 6G, a cell source/drain 145 may be formed in the first active region ACT1 at both sides of the first gate mask pattern 130. A low concentration region 146 of a peripheral source/drain may be formed in the second active region ACT2 at both sides of the second gate mask pattern 131. The cell source/drain 145 and the low concentration region 146 may be formed at the same time, or sequentially formed regardless of the order.

Subsequently, a gate spacer layer may be formed, and then an etch-back process may be performed to the gate spacer layer, so that the first and second gate spacers 150a and 150b of FIG. 1 may be formed. Subsequently, the high concentration region 147 of FIG. 1 may be formed by providing a dopant in the second active region ACT2 using the peripheral gate pattern PG and the second gate spacer 150b as masks. Therefore, the peripheral source/drain 148 of FIG. 1 may be formed. Subsequently, the interlayer dielectric layer 155 may be formed on the entire surface of the substrate 100. Therefore, the non-volatile memory device of FIG. 1 can be achieved.

Figure 2:
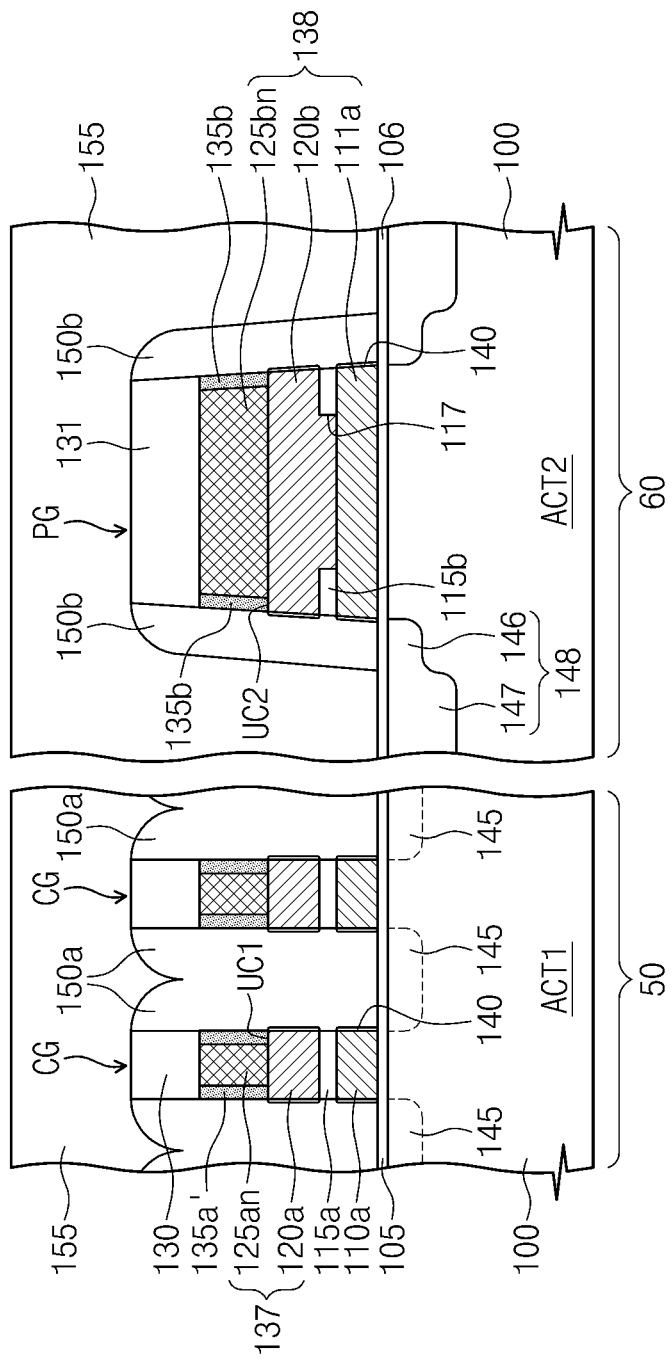
FIG. 2 is a cross-sectional view illustrating a modified example of a non-volatile memory device according to an embodiment of the inventive concept.

Meanwhile, methods of fabricating the non-volatile memory devices shown in FIGS. 2 through 4 are similar to the described one with reference to FIGS. 6A through 6G and 7. The non-volatile memory devices of FIGS. 2 through 4 may be achieved by adjusting a thickness of the oxidation-resistant layer 135 of FIG. 6E.

For example, in FIG. 6E, when the thickness of an oxidation-resistant layer 135 on the sidewalls of the patterns 125an and 130 stacked in the cell region 50 may be substantially equal to the thickness of the oxidation-resistant layer 135 on the sidewalls of the patterns 125bn and 131 stacked in the peripheral region 60, the non-volatile memory device shown in FIG. 2 may be achieved.

In FIG. 6E, the oxidation-resistant layers 135, which are on the sidewalls of the patterns 125an and 130 stacked in the cell region 50 and the patterns 125bn and 131 stacked in the peripheral region 60, may be sufficiently thick. In this case, when the operation S302 of FIG. 7 may be performed, some portions of the first and second oxidation-resistant spacers 135a and 135b disposed outside the undercut regions UC1 and UC2 may be used as etching masks. Therefore, as shown in FIG. 3, the sidewalls of the control base gate 120a' and the peripheral sub-gate 120b' may be formed in a stepped shape. In this case, the portions of the oxidation-resistant spacers 135a and 135b positioned outside the undercut regions UC1 and UC2 may be removed immediately after the operation S302 or the operation S304 of FIG. 7. Therefore, the oxidation-resistant spacers 135a and 135b may be confinedly formed in the undercut regions UC1 and UC2.

In FIG. 6E, the thickness of the oxidation-resistant layer 135 on the sidewall of the first gate mask pattern 130 may be less than that of the oxidation-resistant layer 135 on the sidewall of the second gate mask pattern 131 due to a difference in degree of inclination of the first and second gate mask patterns 130, 131. Also, the thickness of the oxidation-resistant layer 135 on the sidewall of the second gate mask pattern 131 may be sufficiently thick. In this case, as shown in FIG. 4, the sidewall of the control base gate 120a may be flat, and the sidewall of the peripheral sub-gate 120b' may be formed in a stepped shape. In this case, a portion of the second oxidation-resistant spacer 135b positioned outside the second undercut region UC2 may be removed after the operation S302 or the operation S304 of FIG. 7. Therefore, the second oxidation-resistant spacer 135b may be confinedly formed in the second undercut region UC2.

Next, a method of fabricating the non-volatile memory device shown in FIG. 5 will be described with reference to the following drawings.

FIGS. 8A through 8D are cross-sectional views illustrating a method of fabricating the non-volatile memory device shown in FIG. 5.

Figure 8A:
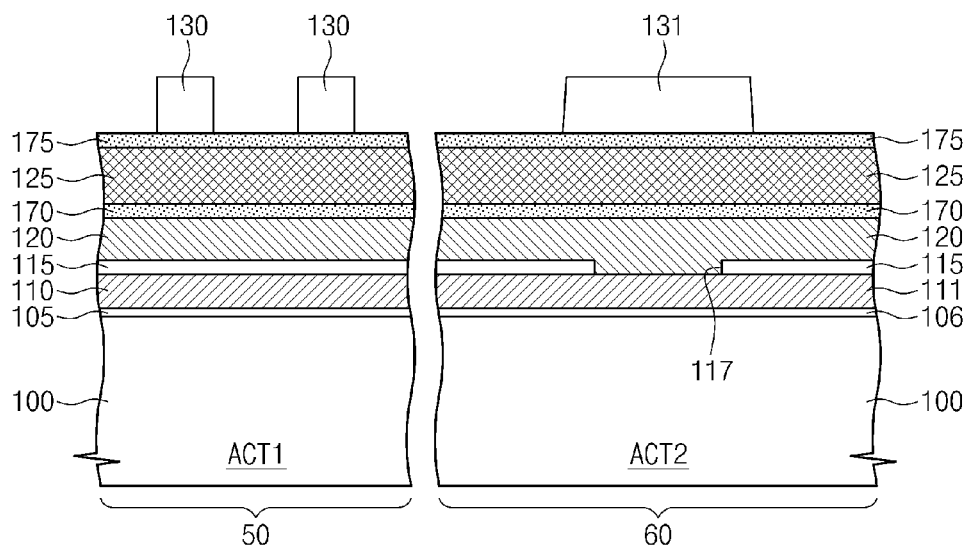
FIGS. 8A through 8D are cross-sectional views illustrating a method of fabricating the non-volatile memory device shown in FIG. 5.

Referring to FIG. 8A, after the forming of the base conductive layer 120, a lower barrier layer 170, a metal layer 125 and an upper barrier layer 175 may be sequentially formed. The first gate mask pattern 130 may be formed on the upper barrier layer 175 of the cell region 50, and the second gate mask pattern 131 may be formed on the upper barrier layer 175 of the peripheral region 60. According to an embodiment, any one of the lower barrier layer 170 and the upper barrier layer 175 may be omitted. In the description below, the case where both the lower and upper barrier layers 170 and 175 are formed will be described for the purpose of simplifying the description.

Figure 8B:
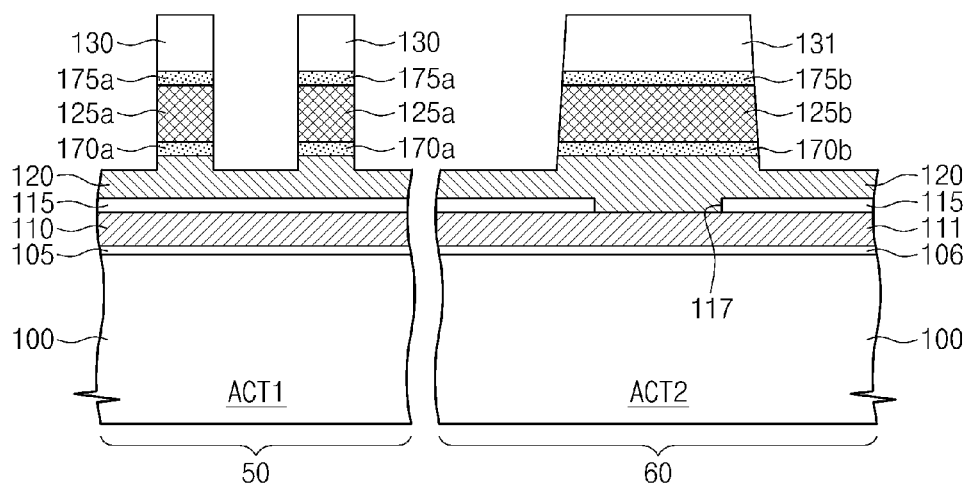

Referring to FIG. 8B, the upper barrier layer 175, the metal layer 125 and the lower barrier layer 170 may be etched by using the first and second gate mask patterns 130 and 131 as etching masks. Therefore, a first lower barrier pattern 170a, a control metal pattern 125a and a first upper barrier pattern 175a, which are stacked under the first gate mask pattern 130, may be formed. Also, a second lower barrier pattern 170b, a peripheral metal pattern 125b and a second upper barrier pattern 175b, which are stacked under the second gate mask pattern 131, may be formed.

Figure 8C:
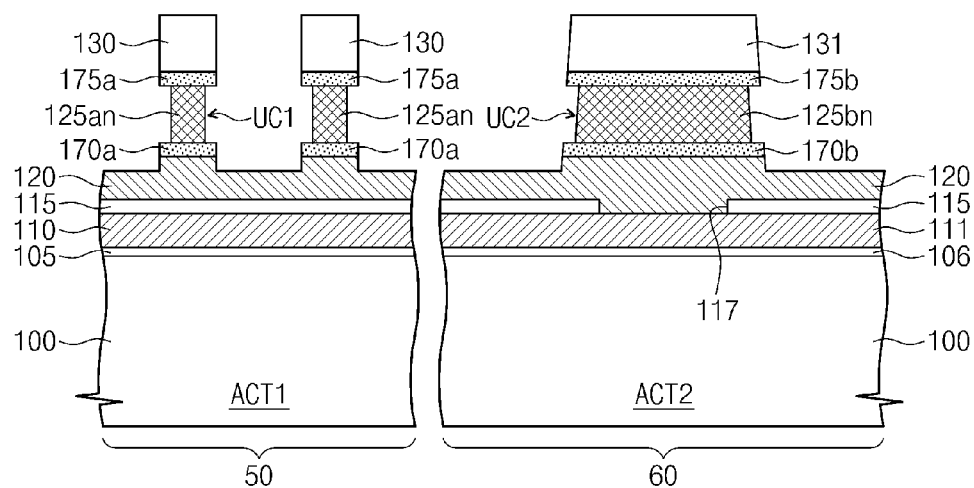

Referring to FIG. 8C, the sidewalls of the control metal pattern 125a and the peripheral metal pattern 125b are etched in a lateral direction, relative to the horizontal direction of extension of the substrate. Therefore, the first undercut regions UC1 are formed at the both sides of the laterally etched control metal pattern 125an, and the second undercut regions UC2 are formed at the both sides of the laterally etched peripheral metal pattern 125bn. The control and peripheral metal patterns 125a and 125b may be laterally etched according to the method described herein with reference to FIG. 6D.

As described with reference to FIG. 5, the lower and upper barrier patterns 170a, 170b, 175a and 175b may have an etch selectivity with respect to the metal patterns 125a and 125b. Therefore, the first undercut region UC1 may be formed between the first lower and upper barrier patterns 170a and 175a, and the second undercut region UC2 may be formed between the second lower and upper barrier patterns 170b and 175b.

Figure 8D:
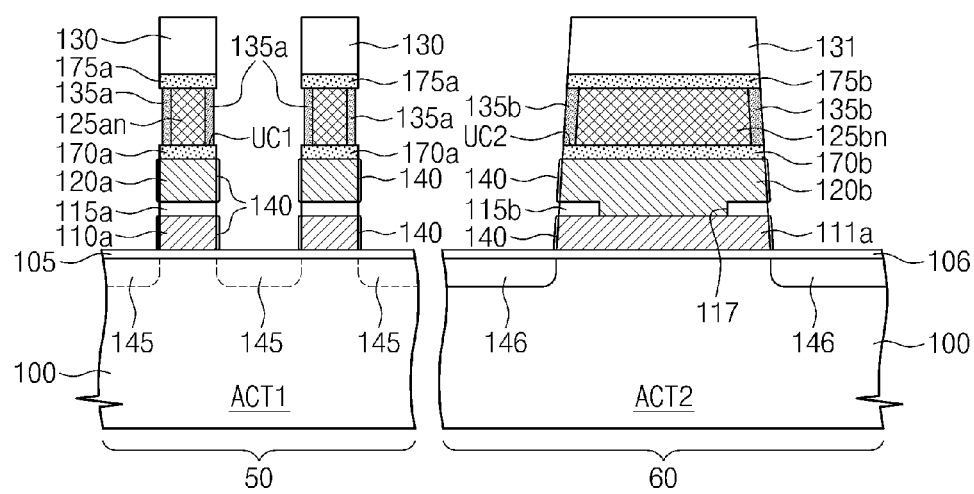

Subsequently, the forming processes of the oxidation-resistant layer described with reference to FIGS. 6E, 6F, 7 and 6G, and the operations S300, S302, S304 and S306 of FIG. 7 may be sequentially performed. Therefore, as shown in FIG. 8D, the first and second oxidation-resistant spacers 135a and 135b may be formed in the first and second undercut regions UC1 and UC2. Also, the charge storage layer 110a, the patterned blocking dielectric layer 115a and the control base gate 120a, which are sequentially stacked under the first lower barrier pattern 170a, may be formed. The peripheral bottom gate 111a, the interlayer dielectric pattern 115b and the peripheral sub-gate 120b, which are sequentially stacked under the second lower barrier pattern 170b, may be formed. The oxide layer 140 may be formed on the sidewalls of the gates 120a, 120b and 111a and the charge storage layer 110a. The subsequent process may be performed with the same method as described with reference to FIGS. 6G and 1.

Second Embodiment

Figure 9:
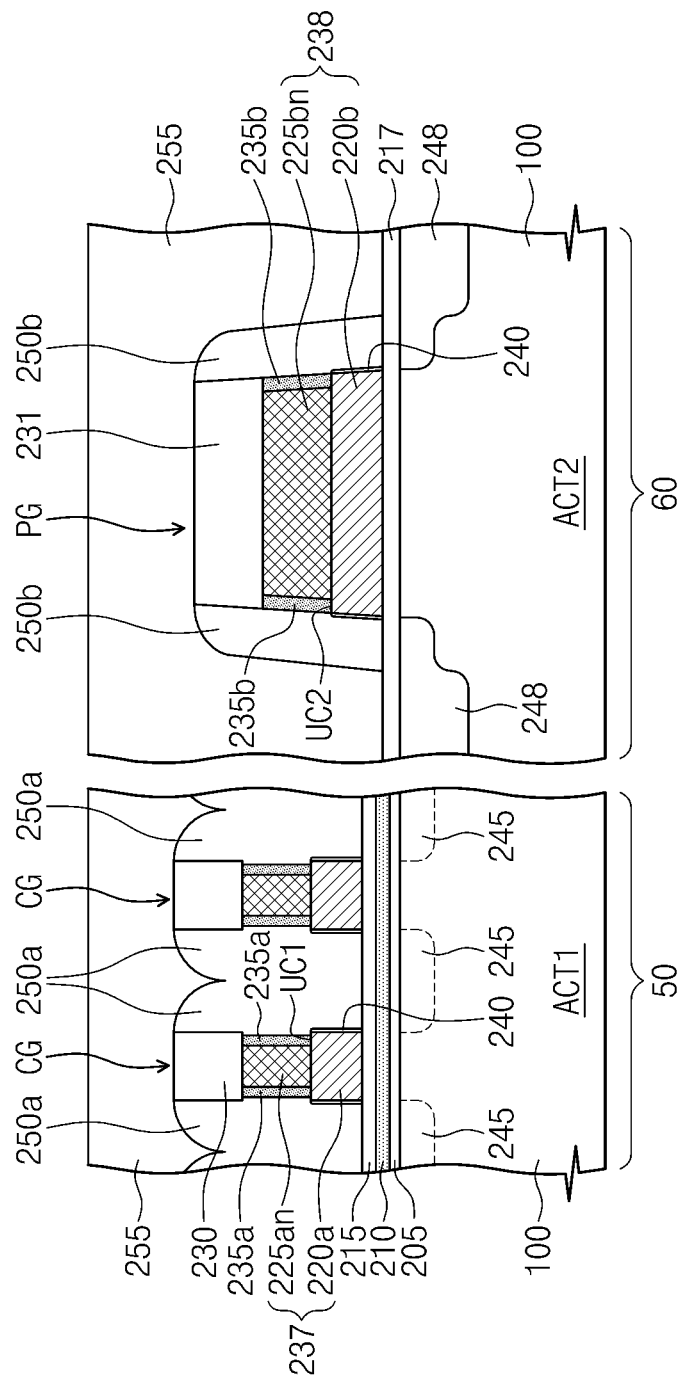
FIG. 9 is a cross-sectional view illustrating a non-volatile memory device according to another embodiment of the inventive concept.

FIG. 9 is a cross-sectional view illustrating a non-volatile memory device according to another embodiment of the inventive concept.

Referring to FIG. 9, a device isolation pattern (not illustrated) is formed at a substrate 100 including cell and peripheral regions 50 and 60 such that a first active portion ACT1 in the cell region 50 and a second active portion ACT2 in the peripheral region 60 may be defined. A cell gate pattern CG may be disposed on the first active portion ACT1, and a peripheral gate pattern PG may be disposed on the second active portion ACT2.

The cell gate pattern CG may include a control gate electrode 237 that extends across the first active portion ACT1. Also, the cell gate pattern CG may further include a first gate mask pattern 230 disposed on the control gate electrode 237. In addition, the cell gate pattern CG may include a tunnel dielectric layer 205, a charge storage layer 210 and a blocking dielectric layer 215 that are stacked sequentially under the control gate electrode 237. The peripheral gate pattern PG may include a peripheral gate electrode 238 that extends across the second active portion ACT2. Also, the peripheral gate pattern CG may further include a second gate mask pattern 231 disposed on the peripheral gate electrode 238, and a peripheral gate dielectric layer 217 disposed between the peripheral gate electrode 238 and the second active portion ACT2.

The control gate electrode 237 may include a control base gate 220a and a control metal pattern 225an that are sequentially stacked. A width of the control gate pattern 225an may be less than a width of the first gate mask pattern 230 and less than a width of the control base gate 220a. As a result, a pair of first undercut regions UC1 may be defined at both sides of the control metal pattern 225an. A pair of first oxidation-resistant spacers 235a is disposed on both sidewalls of the control metal pattern 225an, respectively. The pair of first oxidation-resistant spacers 235a may be disposed between both edge regions of the first gate mask pattern 230 and between both edge regions of the control base gate 220a. The first oxidation-resistant spacers 235a may be confinedly disposed or otherwise positioned within, the first undercut regions UC1.

The peripheral gate electrode 238 may include a peripheral sub-gate 220b and a peripheral metal pattern 225bn that are stacked sequentially. According to the present embodiment, the peripheral sub-gate 220b may be disposed directly on the peripheral gate dielectric layer 217. A width of the peripheral metal pattern 225bn may be smaller than widths of the second gate mask pattern 231 and the peripheral sub-gate 220b. Therefore, a pair of second undercut regions UC2 may be defined at both sides of the peripheral metal pattern 225bn, respectively. A pair of second oxidation-resistant spacers 235b may be disposed on both sidewalls of the peripheral metal pattern 225bn, respectively. The pair of second oxidation-resistant spacers 235b may be disposed between both edge regions of the second gate mask pattern 231 and both edge regions of the peripheral sub-gate 220b. The second oxidation-resistant spacers 235b may be confinedly disposed, or otherwise positioned within, the second undercut regions UC2.

According to an embodiment, the thickness of the first oxidation-resistant spacer 235a at the sidewall of the control metal pattern 225an may be different from that of the second oxidation-resistant spacer 235b at the sidewall of the peripheral metal pattern 225bn. For example, the thickness of the second oxidation-resistant spacer 235b may be thicker than that of the first oxidation-resistant spacer 235a. An outer sidewall of the first oxidation-resistant spacer 235a may be recessed in a lateral direction to a larger extent relative to a sidewall of the first gate mask pattern 230, as compared to the amount of recess of the second oxidation-resistant spacer, relative to the sidewall of the second gate mask pattern 231.

The control metal pattern 225an may comprise a metal having low resistivity. For example, the control metal pattern 225an may comprise tungsten, copper, another suitable metal, or combinations thereof. The first gate mask pattern 230 may comprise a dielectric material having an etch selectivity with respect to the control metal pattern 225an and the control base gate 220a. For example, the first gate mask pattern 230 may comprise an oxide. The control base gate 220a may include a conductive material having an etch selectivity with respect to the control metal pattern 225an. Also, the control base gate 220a may include a conductive material having a specific work function. According to an embodiment, the second gate mask pattern 231, the peripheral metal pattern 225bn and the peripheral sub-gate 220b may be formed of the same materials as the first gate mask pattern 230, the control metal pattern 225an and the control base gate 220a, respectively. The first and second oxidation-resistant spacers 235a and 235b may be formed of the same material as the first and second oxidation-resistant spacers 135a and 135b of FIG. 1.

The tunnel dielectric layer 205 may comprise an oxide (e.g., a thermal oxide) and/or an oxynitride, etc. The charge storage layer 210 may include a dielectric material having charge trap storing capability. For example, the charge storage layer 210 may include a silicon nitride, a silicon oxide including nano dots and/or an insulating metal nitride (e.g., a hafnium oxide, etc.), etc. The nano dots may include a semiconductor material and/or a metal, etc. The blocking dielectric layer 215 may include a high-k material (e.g., an insulating metal oxide such as an aluminum oxide and/or a hafnium oxide, etc.) which has a higher dielectric constant than that of the tunnel dielectric layer 205. In addition, the blocking dielectric layer 215 may further include a barrier dielectric material (e.g., oxide, etc.) having a larger bandgap energy than the high-k material.

The charge storage layer 210 may includes a dielectric material having charge traps in such manner that the charge storage layer 210 may be connected to a charge storage layer in a neighboring or adjacent cell gate pattern. For example, as illustrated in FIG. 9, the charge storage layer 210 and the blocking dielectric layer 215 extend laterally beyond both sidewalls of the control gate electrode 237, in a manner so as to be continuously connected to the charge storage layer of the adjacent cell gate pattern and the blocking dielectric layer 215.

According to an embodiment, an energy barrier between the control base gate 220a and the blocking dielectric layer 215 may be increased by adjusting a work function of the control base gate 220a. For example, when a non-volatile memory cell according to embodiments of the inventive concept is n-metal oxide semiconductor (n-MOS) type, the control base gate 220a may include a conductive material having a larger work function than that of n-type silicon. For example, the control base gate 220a may include p-type silicon, p-type silicon-germanium, a titanium nitride (TiN), a tantalum nitride (TaN), a tantalum silicon nitride (TaSiN) and/or a tungsten nitride (WN), etc. According to an embodiment, when the control base gate 220a may include silicon or silicon-germanium, the control base gate 220a may further include carbon.

The control gate dielectric layer 217 in the peripheral region may comprise an oxide. A thickness of the control gate dielectric layer 217 in the peripheral region may be different from that of the tunnel dielectric layer 205 in the cell region.

An oxide layer 240 may be disposed on both sidewalls of the control base gate 220a and the peripheral sub-gate 220b. The oxide layer 240 may include an oxide that is formed by oxidation of the both sidewalls of the gates 220a and 220b. First gate spacers 250a may be disposed on both sidewalls of the cell gate pattern CG, and second gate spacers 250b may be disposed on both sidewalls of the peripheral gate pattern PG. The first and second gate spacers 250a and 250b may comprise an oxide. According to an embodiment, the first and second gate spacers 250a and 250b may not include silicon nitride.

Cell source/drain 245 regions may be defined in the first active portion ACT1 of both sides of the first gate mask pattern 230. According to an embodiment, the cell source/drain 245 regions may be doped with a different type dopant from that of the first active portion ACT1 of the substrate. Alternatively, the cell source/drain 245 region may also be defined as an inversion layer, which is formed by a fringe field generated by an operating voltage applied to the control gate electrode 237. A peripheral source/drain 248 region may be disposed in the second active portion ACT2 of both sides of the second gate mask pattern 231. The peripheral source/drain 248 may be doped with a different type dopant from that of the second active portion ACT2 of the substrate. The peripheral source/drain 248 may have a LDD structure. An interlayer dielectric layer 255 may be disposed on an entire surface of the substrate 100. The interlayer dielectric layer 255 may include an oxide.

According to the foregoing non-volatile memory device, the first and second oxidation-resistant spacers 235a and 235b are disposed on the both sidewalls of the control and peripheral metal patterns 225an and 225bn. Therefore, a non-volatile memory device having excellent reliability can be achieved by preventing the metal patterns 225an and 225bn from oxidation. Also, the first and second oxidation-resistant spacers 235a and 235b are confinedly disposed in the undercut regions UC1 and UC2 such that a non-volatile memory device optimized for high integration density can be achieved.

Figure 10:
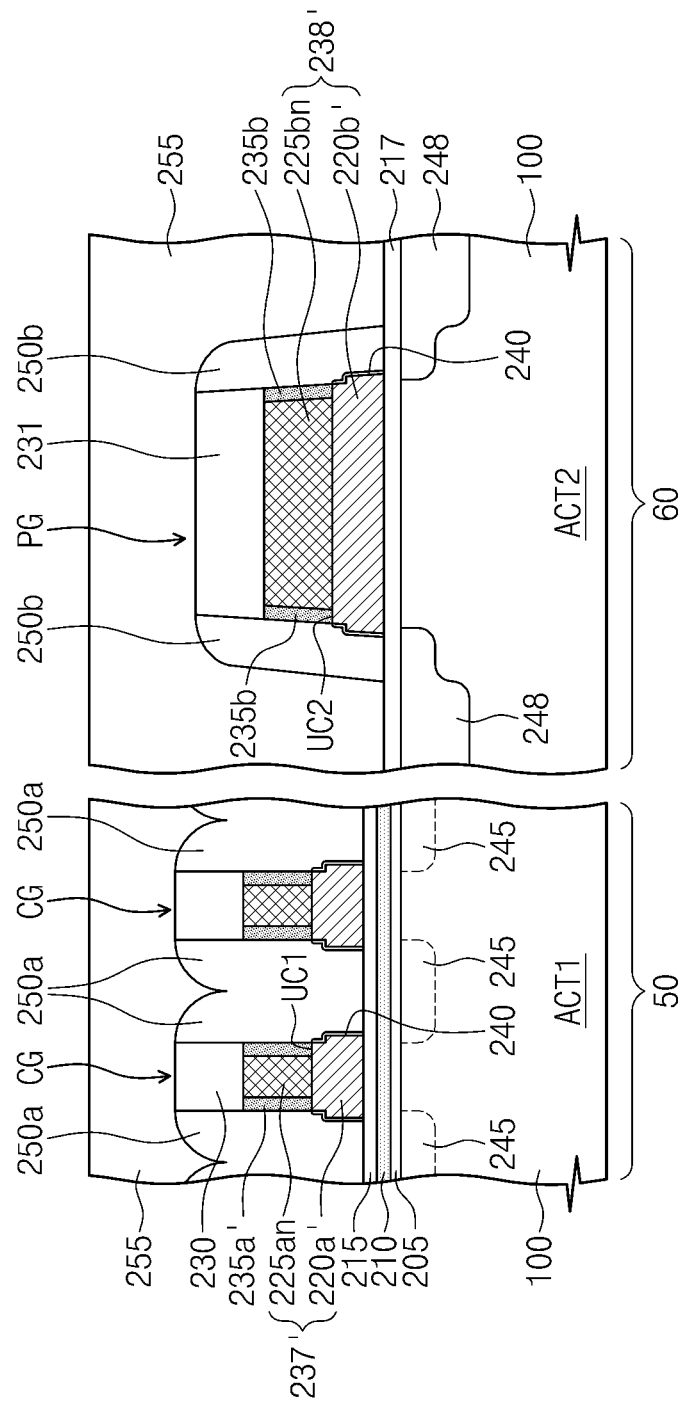
FIG. 10 is a cross-sectional view illustrating a modified example of a non-volatile memory device according to another embodiment of the inventive concept.

FIG. 10 is a cross-sectional view illustrating a modified example of a non-volatile memory device according to another embodiment of the inventive concept.

Referring to FIG. 10, a control base gate 220a' included in a control gate electrode 237' may have a sidewall in a stepped shape as described herein in connection with the embodiment of FIG. 3. In this case, a first oxidation-resistant spacer 235a' may fill the first undercut region UC1. Also, a sidewall of a peripheral sub-gate 220b' included in a peripheral gate electrode 238' may have a stepped shape. According to an embodiment, the sidewall of the control base gate 220a' may have a flat shape and the sidewall of the peripheral sub-gate 220b' may have a stepped shape, for example as described herein in connection with the embodiment of FIG. 4. In the embodiment of FIG. 10, the memory cells in the first active portion have a charge storage layer 210 that is continuous between neighboring memory cells, as described in connection with the embodiment of FIG. 9.

Figure 11:
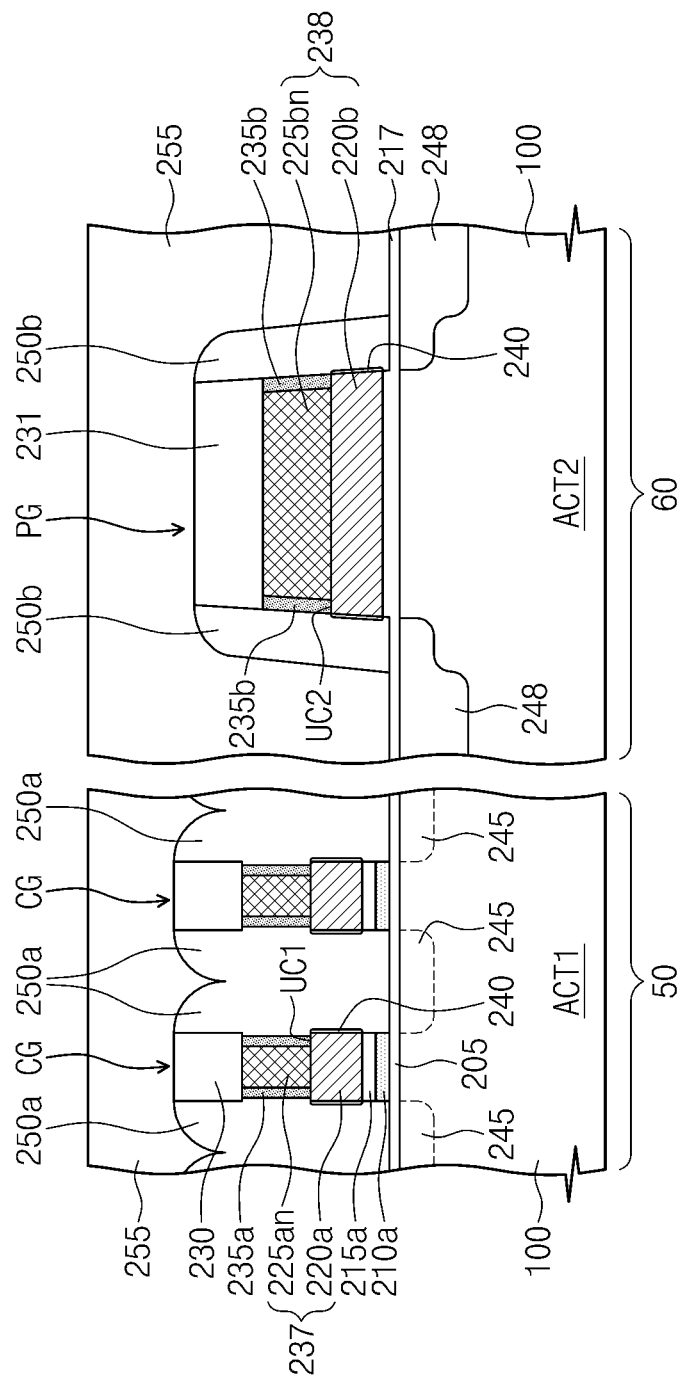
FIG. 11 is a cross-sectional view illustrating another modified example of a non-volatile memory device according to another embodiment of the inventive concept.

FIG. 11 is a cross-sectional view illustrating another modified example of a non-volatile memory device according to another embodiment of the inventive concept.

Referring to FIG. 11, according to the present modified example, charge storage layers 210a associated with adjacent or neighboring cell gate patterns CG may be spaced apart laterally by separating them from each other. Likewise, blocking dielectric layers 215a in the adjacent cell gate patterns CG may also be spaced apart laterally by separating them from each other.

Figure 12:
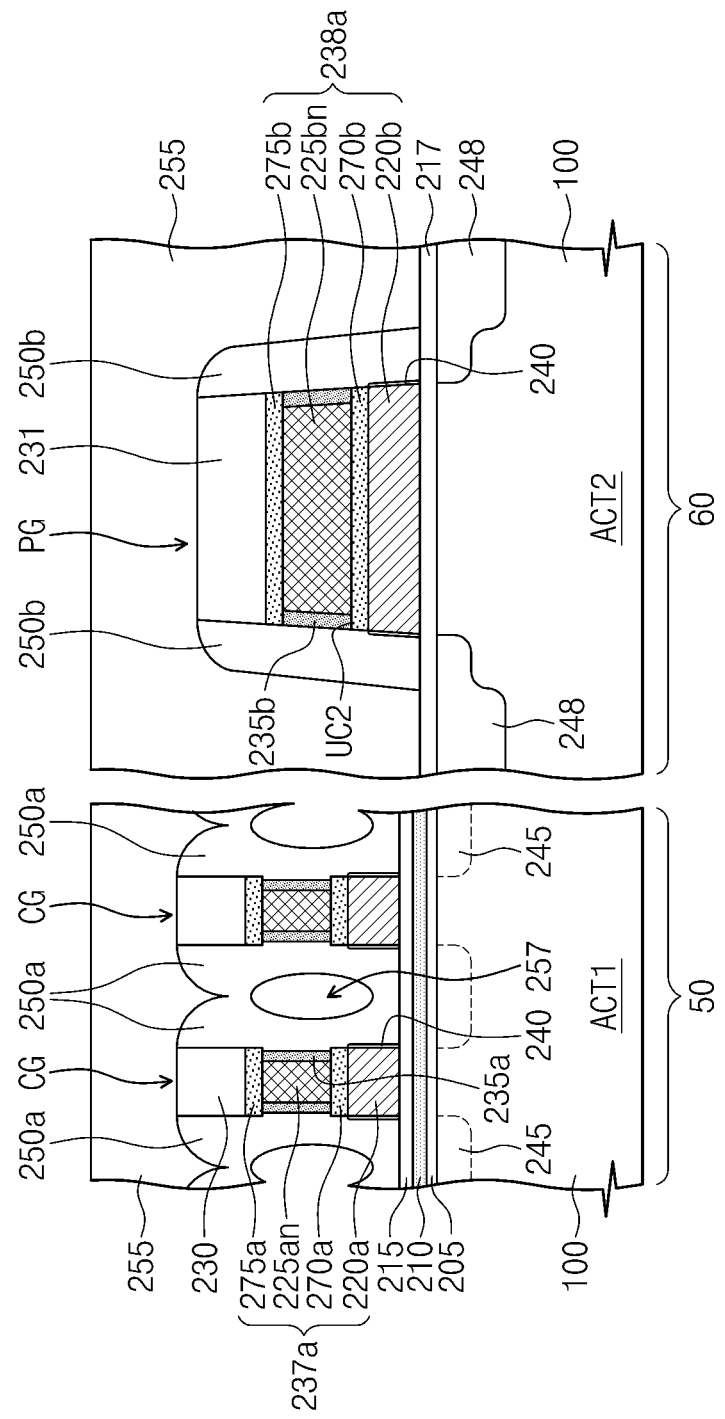
FIG. 12 is a cross-sectional view illustrating still another modified example of a non-volatile memory device according to another embodiment of the inventive concept.

FIG. 12 is a cross-sectional view illustrating still another modified example of a non-volatile memory device according to another embodiment of the inventive concept.

Referring to FIG. 12, a control gate electrode 237a may further include a first lower barrier pattern 270a positioned between the control metal pattern 225an and the control base gate 220a. In addition, the control gate electrode 237a may further include a first upper barrier pattern 275a positioned between the first gate mask pattern 230 and the control metal pattern 225an. Widths between sidewalls of the first lower and upper barrier patterns 270a and 275a may be greater than a width of the control metal pattern 225an. Therefore, the pair of first oxidation-resistant spacers 235a may be disposed between both edge regions of the first lower barrier pattern 270a and both edge regions of the first upper barrier pattern 275a. The first lower and upper barrier patterns 270a and 275a may be formed of the same materials as those of the first lower and upper barrier patterns 170a and 175a of FIG. 5, respectively. According to an embodiment, any one of the first lower barrier pattern 270a and the first upper barrier pattern 275a may be omitted. In a case where the control gate electrode 237 includes the first lower barrier pattern 270a, the control base gate 220a may include a doped semiconductor material (e.g., doped silicon, doped silicon-germanium, etc.).

Similarly, a peripheral gate electrode 238a may further include a second lower barrier pattern 270b positioned between the peripheral metal pattern 225bn and the peripheral sub-gate 220b, and/or a second upper barrier pattern 275b positioned between the second gate mask pattern 231 and the peripheral metal pattern 225bn. The second oxidation-resistant spacers 235b may be disposed between both edge regions of the second lower barrier pattern 270b and both edge regions of the second upper barrier pattern 275b. The second lower and upper barrier patterns 270b and 275b may be formed of the same materials as the first lower and upper barrier patterns 270a and 275a, respectively.

According to an embodiment, an air gap 257 may be formed between adjacent cell gate patterns CG. The air gap 257 may be covered with the first gate spacer 250a. Such air gap 257 may also be formed between the adjacent cell gate patterns CG of the non-volatile memory devices shown in FIGS. 9 through 11, or of other embodiments described herein.

Subsequently, a method of fabricating a non-volatile memory device according to the present embodiment will be described with reference to the following drawings.

Figure 13A:
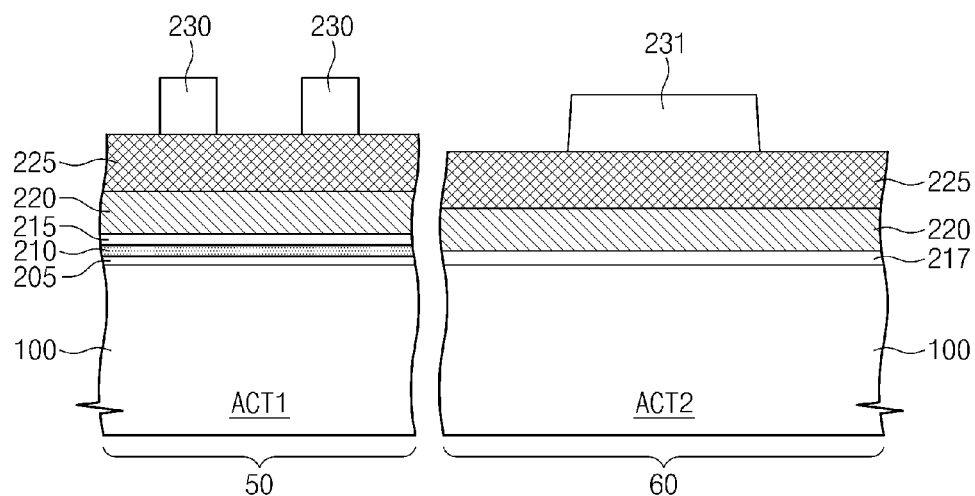
FIGS. 13A through 13D are cross-sectional views illustrating a method of fabricating a non-volatile memory device according to another embodiment of the inventive concept.
Figure 13B:
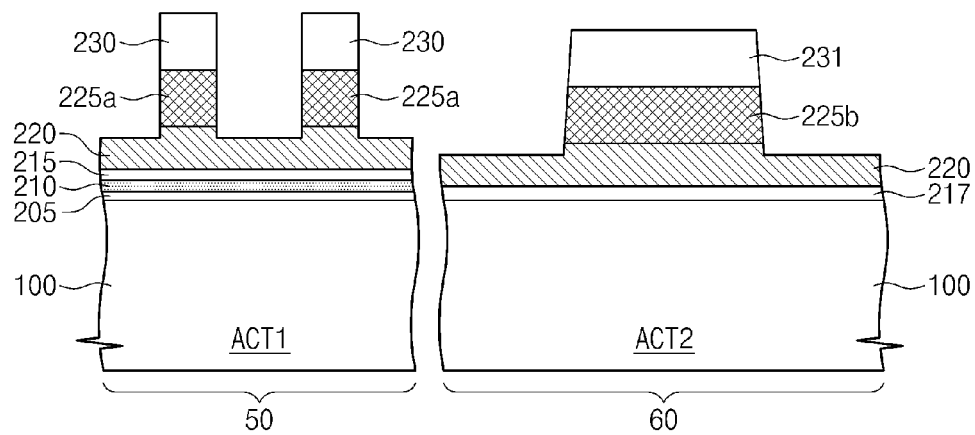
Figure 13C:
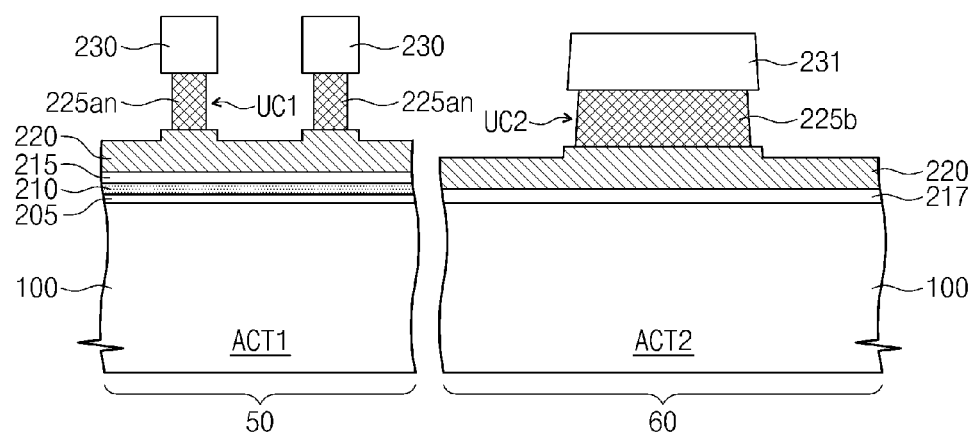
Figure 13D:
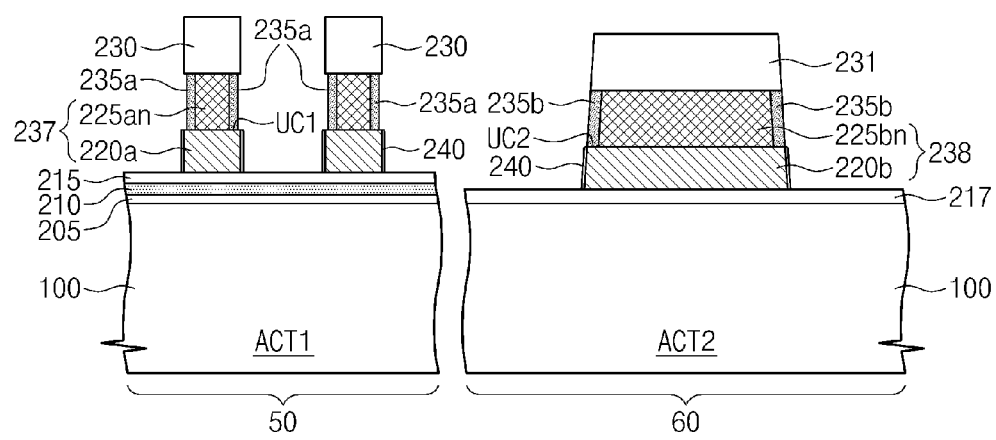
Figure 14:
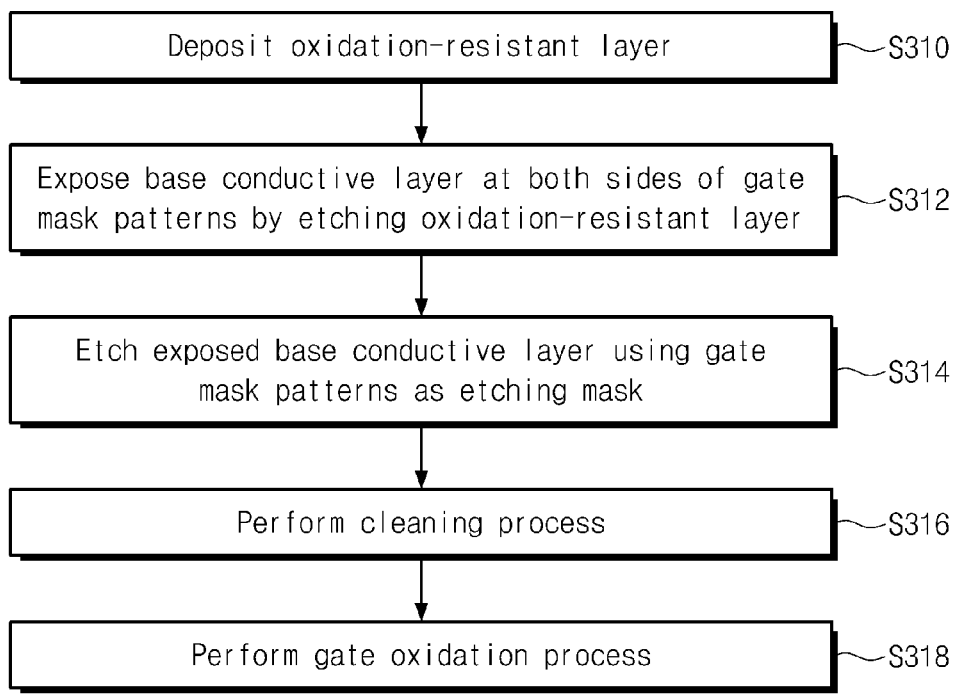
FIG. 14 is a flow chart illustrating a method of forming an oxidation-resistant spacer and gate patterns of a non-volatile memory device according to another embodiment of the inventive concept.

FIGS. 13A through 13D are cross-sectional views illustrating a method of fabricating a non-volatile memory device according to another embodiment of the inventive concept, and FIG. 14 is a flow chart illustrating a method of forming an oxidation-resistant spacer and gate patterns of a non-volatile memory device according to another embodiment of the inventive concept.

Referring to FIG. 13A, a first active portion ACT1 in a cell region 50 and a second active region ACT2 in a peripheral region 60 may be defined by forming a device isolation pattern (not illustrated) on or in the substrate 100. A tunnel dielectric layer 205, a charge storage layer 210 and a blocking dielectric layer 215 may be sequentially formed on the first active portion ACT1. A peripheral gate dielectric layer 217 may be formed on the second active portion ACT2. According to an embodiment, the tunnel dielectric layer 205, the charge storage layer 210 and the blocking dielectric layer 215 may be sequentially formed on an entire surface of the substrate having the first and second active portions ACT1 and ACT2. The second active portion ACT2 may be exposed by removing the blocking dielectric layer 215, the charge storage layer 210 and the tunnel dielectric layer 205 in the peripheral region 60. At this time, the tunnel dielectric layer 205, the charge storage layer 210 and the blocking dielectric layer 217 in the cell region 50 may remain on the substrate. The peripheral gate dielectric layer 217 may be formed on the exposed second active portion ACT2. However, the inventive concept is not limited thereto. Alternatively, the tunnel dielectric layer 205, the charge storage layer 210 and the blocking dielectric layer 215 which are stacked sequentially, and the peripheral gate dielectric layer 217, may also be formed according to other methods.

Subsequently, a base conductive layer 220 and a metal layer 225 may be formed on the entire surface of the substrate 100. The base conductive layer 220 may be formed directly on the blocking dielectric layer 215 and the peripheral gate dielectric layer 217. Subsequently, a first gate mask pattern 230 on the metal layer 225 in the cell region 50 and a second gate mask pattern 231 on the metal layer 225 in the peripheral region 60 may be formed.

Referring to FIG. 13b, a control metal pattern 225a and a peripheral metal pattern 225b may be formed by etching the metal layer 225 using the gate mask patterns 230 and 231 as etching masks. The metal layer 225 may be etched by the first dry etching process having a strong anisotropy.

Referring to FIG. 13C, both sidewalls of the control and peripheral metal patterns 225a and 225b are etched in a lateral direction. Therefore, first undercut regions UC1 may be formed at both sides of the laterally etched control metal pattern 225an, and second undercut regions UC2 may be formed at both sides of the laterally etched peripheral metal patters 225a and 225b. Both sidewalls of the control and peripheral metal patterns 225a and 225b may be etched laterally by a reactive dry etching process. The reactive dry etching process may be the same as the reactive etching process described with reference to FIG. 6D.

Next, a method of forming oxide-resistant spacers and gate patterns will be specifically described with reference to the flowchart of FIG. 14.

Referring to FIGS. 13C, 13D and 14, in operation S310, an oxidation-resistant layer is deposited on the substrate 100 having the undercut regions UC1 and UC2. The oxidation-resistant layer may be deposited by a chemical vapor deposition process and/or an atomic layer deposition process, or by another suitable process. The oxidation-resistant layer may also be formed in the undercut regions UC1 and UC2. In operation S312, the base conductive layers 220 of both sides of the gate mask patterns 230 and 231 are exposed by etching the oxidation-resistant layer. At this time, first and second spacers 235a and 235b may be formed in the first and second undercut regions UC1 and UC2. The gate mask patterns 230 and 231 may also be exposed by removing the oxidation-resistant layer on upper surfaces of the gate mask patterns 230 and 231.

In operation S314, the exposed base conductive layer 220 may be etched using the gate mask patterns 230 and 231 as etching masks. Therefore, a control base gate 220a is formed under the control metal pattern 225an, and a peripheral sub-gate 220b is formed under the peripheral metal pattern 225bn. Subsequently, in operation S316, a cleaning process may be performed on the substrate 100. The first and second oxidation-resistant spacers 235a and 235b may be formed so that their respective positions are confined to the first and second undercut regions UC1 and UC2 after the operation S312, the operation S314 and the operation S316. Subsequently, in operation S318, a gate oxidation process may be performed on the substrate 100. Therefore, an oxide layer 240 may be formed on both sidewalls of the control base gate 220a and the peripheral sub-gate 220b. Thereafter, the peripheral source/drain 248, the gate spacers 250a and 250b and the interlayer dielectric layer 255 of FIG. 9 may be formed. When the cell source/drain 245 is doped with a dopant, the cell source/drain 245 may also be formed. According to an embodiment, after the forming of the gate spacers 250a and 250b, the air gap 257 of FIG. 12 may also be formed between adjacent cell gate patterns CG.

As described above in the first embodiment, the degree of inclination of the sidewalls of the patterns 225an and 230 stacked in the cell region 50 may be different from that of the sidewalls of the patterns 225bn and 231 stacked in the peripheral region 60. As a result, the thickness of the oxidation-resistant layer on the sidewalls of the patterns 225an and 230 stacked in the cell region 50 may be different from that of the oxidation-resistant layer on the sidewalls of the patterns 225bn and 231 stacked in the peripheral region 60. Therefore, the thickness of the first oxidation-resistant spacer 235a may be different from that of the second oxidation-resistant spacer 235b. For example, the thickness of the second oxidation-resistant spacer 235b may be greater than that of the first oxidation-resistant spacer 235a.

According to an embodiment, the thickness of an oxidation-resistant layer on the sidewalls of the stacked patterns 225an, 230, 225bn and 231 may be adjusted so that the control base gate 220a' and the peripheral sub-gate 220b', which have the sidewalls in a stepped shape, as shown in FIG. 10, may be achieved.

According to an embodiment, after the forming of the control base gate 220a and the peripheral sub-gate 220b, the blocking dielectric layer 215 and the charge storage layer 210 may be etched using the gate mask patterns 230 and 231 as an etching mask. Therefore, the non-volatile device illustrated in FIG. 11 may be achieved.

A method of fabricating the non-volatile device shown in FIG. 12 will now be described.

Figure 15A:
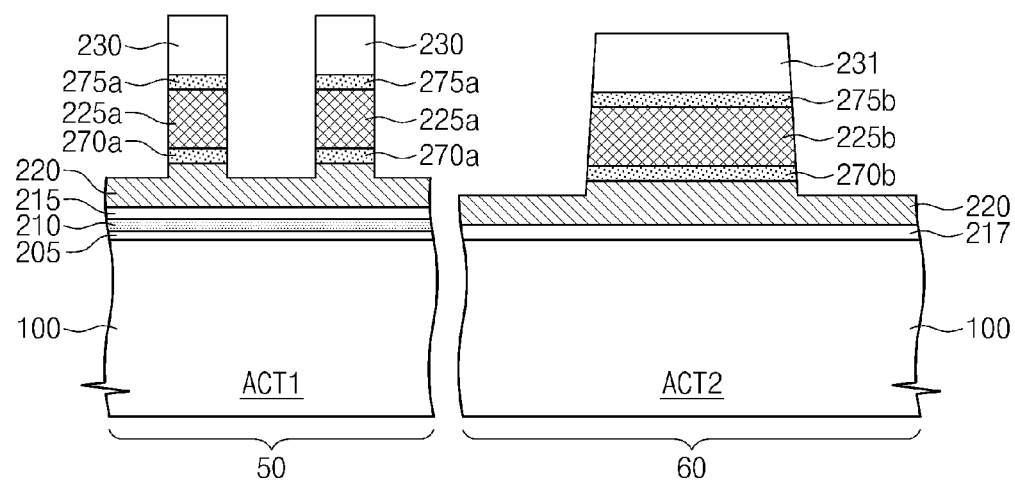
FIGS. 15A through 15C are cross-sectional views illustrating a method of fabricating the non-volatile memory device shown in FIG. 12.
Figure 15B:
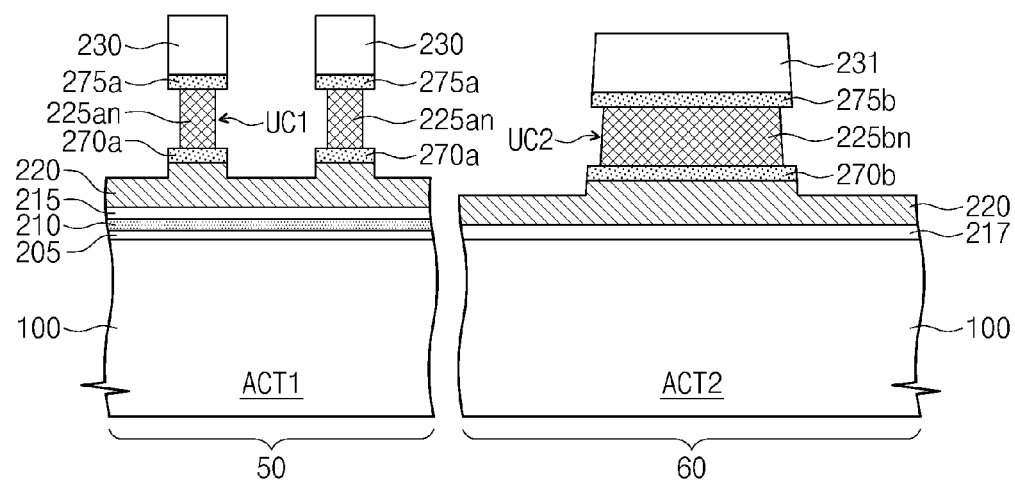
Figure 15C:
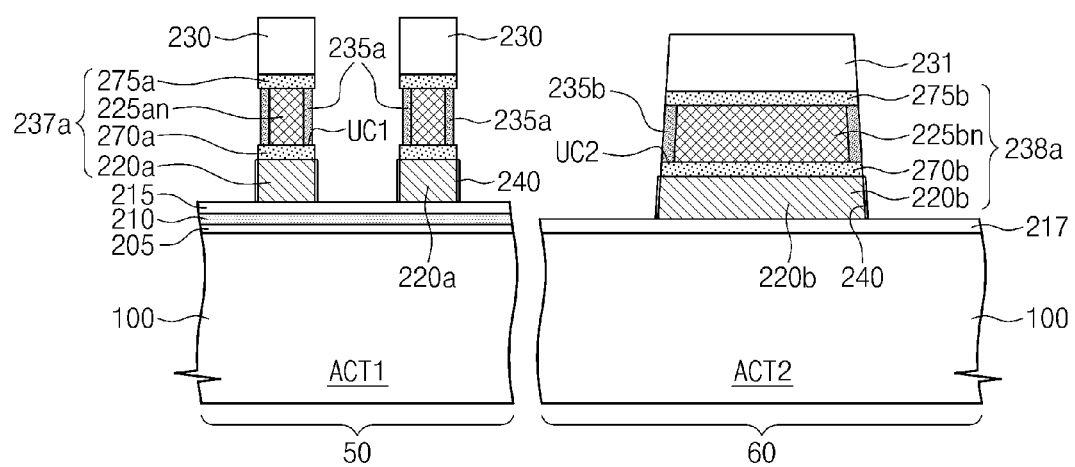

FIGS. 15A through 15C are cross-sectional views illustrating a method of fabricating the non-volatile memory device shown in FIG. 12.

Referring to FIGS. 13A and 15A, a lower barrier layer may be formed on a base conductive layer 220 before forming a metal layer 225. The metal layer 225 may be formed on the base conductive layer 220. An upper barrier layer may be formed on the metal layer 225 before forming gate mask patterns 230 and 231. The gate mask patterns 230 and 231 may be formed on the upper barrier layer.

The upper barrier layer, the metal layer 225 and the lower barrier layer may be etched using the gate mask patterns 230 and 231 as etching masks. Therefore, a first lower barrier pattern 270a, a control metal pattern 225a and a first upper barrier pattern 275a, which are sequentially stacked under the first gate mask pattern 230, may be formed. Also, a second lower barrier pattern 270b, a peripheral metal pattern 225b and a second upper barrier pattern 275b, which are sequentially stacked under the second gate mask pattern 231, may be formed.

Referring to FIG. 15B, first and second undercut regions UC1 and UC2 may be formed by etching both sidewalls of the control and peripheral metal patterns 225a and 225b laterally. At this time, the barrier patterns 270a, 270b, 275a and 275b may have an etch selectivity with respect to the metal patterns 225a and 225b. Therefore, the first undercut region UC1 may be formed between the first lower and upper barrier patterns 270a and 275a, and the second undercut region UC2 may be formed between the second lower and upper barrier patterns 270b and 275b.

Referring to FIG. 15C, subsequently, the operations shown in the flowchart of FIG. 14 may be performed. Therefore, oxidation-resistant spacers 235a and 235b may be formed in the undercut regions, a control base gate 220a and a peripheral sub-gate 220b may be formed. Also, an oxide layer 240 may be formed on both sidewalls of the control base gate 220a and the peripheral sub-gate 220b. Thereafter, the cell source/drain 245, the peripheral source/drain 248, the gate spacers 250a and 250b and the interlayer dielectric layer 255 of FIG. 12 may be formed.

The nonvolatile memory devices disclosed in the first embodiment and the nonvolatile memory devices disclosed in the second embodiment which are described above can be realized as a NOR-type non-volatile memory device or as a NAND-type non-volatile memory device, or as another type of non-volatile memory device.

Third Embodiment

In the present embodiment, like reference numerals in the foregoing embodiments refer to like elements.

Figure 16A:
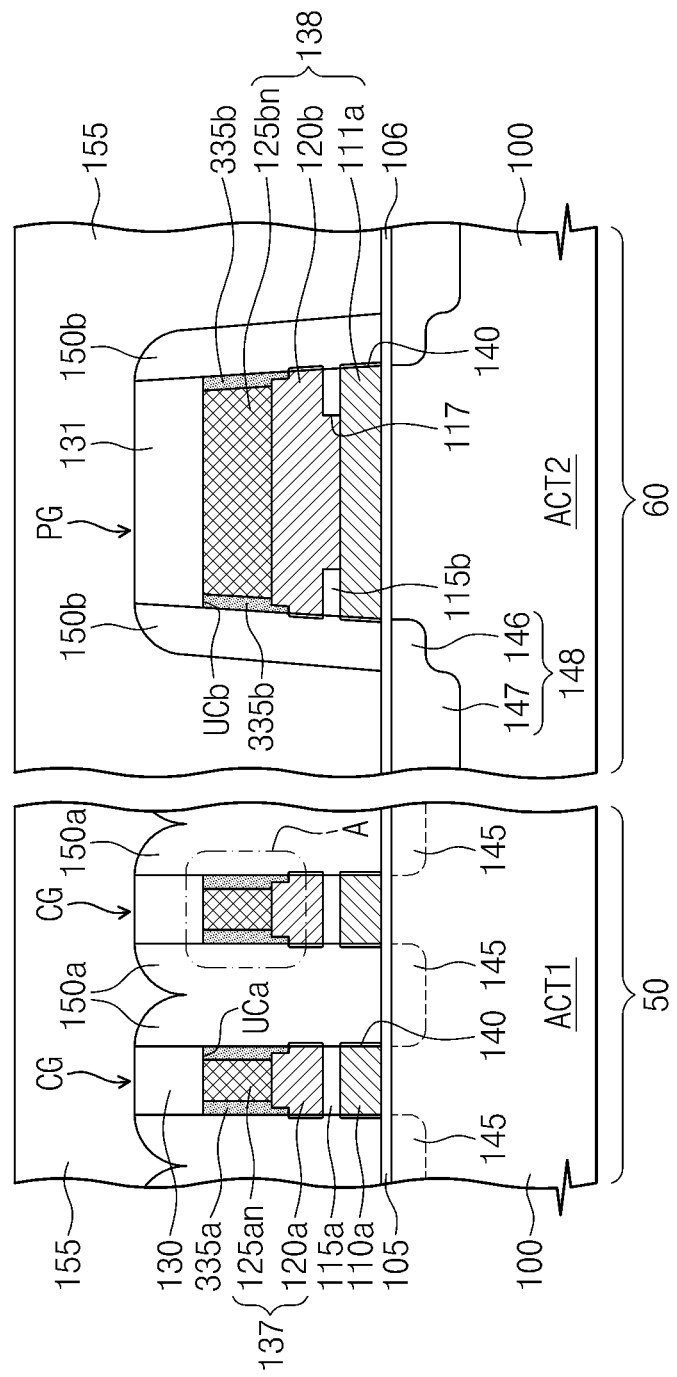
FIG. 16A is a cross-sectional view illustrating a nonvolatile memory device according to still another embodiment of the inventive concept.
Figure 16B:
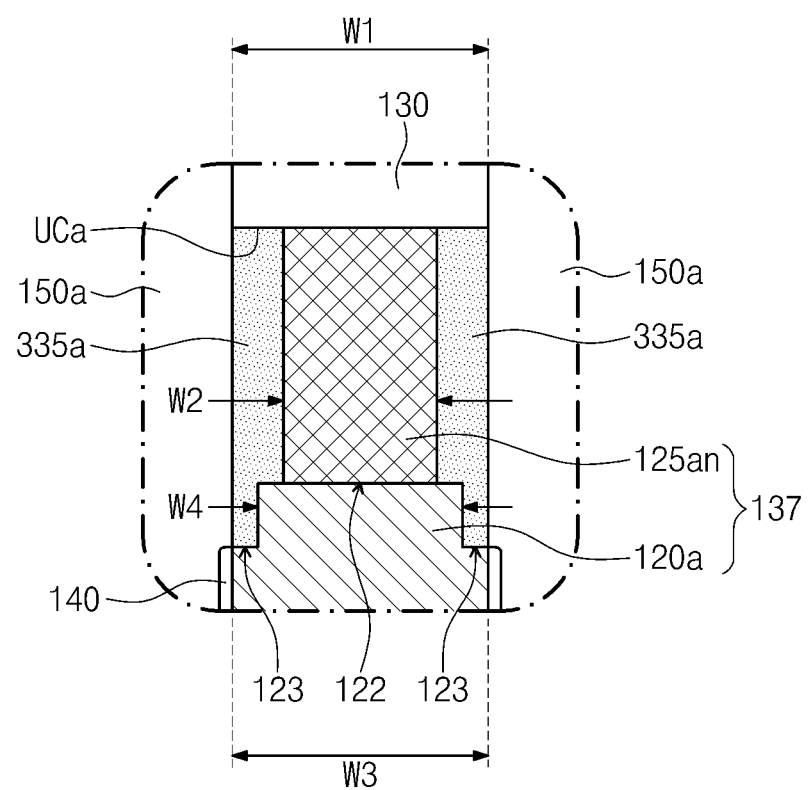
FIG. 16B is an enlarged view of portion A of FIG. 16A.

FIG. 16A is a cross-sectional view illustrating a nonvolatile memory device according to still another embodiment of the inventive concept, and FIG. 16B is an enlarged view of portion A of FIG. 16A.

Referring to FIGS. 16A and 16B, in a cell region 50, a first width W1 of a first gate mask pattern 130 is greater than a second width W2 of a control metal pattern 125an in a control gate electrode 137. Thus, a pair of first undercut regions UCa may be defined under both edge regions of the first gate mask pattern 130, respectively. Also, the pair of first undercut regions UCa may be defined at both sides of the control metal pattern 125an, respectively.

A control base gate 120a under the control metal pattern 125an may include a first lower portion and a second upper portion on a blocking dielectric layer 115a. That is, the first portion of the control base gate 120a may be disposed between the blocking dielectric layer 115a and the second portion of the control base gate 120a, and the first portion of the control base gate 120a may be wider than the second portion of the control base gate 120a. A third width W3 of the first portion of the control base gate 120a may be substantially equal to the first width W1 of the first gate mask pattern 130. A fourth width W4 of the second portion of the control base gate 120a may be smaller than the first width W1 of the first gate mask pattern 130. The fourth width W4 of the second upper portion of the control base gate 120a may be greater than the width of the second width W2 of the control metal pattern 125an. Therefore, the first undercut regions UCa extend downwardly so that lower ends of the first undercut regions UCa may be located at a level lower than that of a bottom surface of the control metal pattern 125an.

More specifically, due to the second portion having the fourth width W4, the control base gate 120a may include a first upper surface 122, and second upper surfaces 123 positioned at a level lower than that of the first upper surface 122. The first upper surface 122 may correspond to an upper surface of the second portion of the control base gate 120a. The second upper surfaces 123 may respectively correspond to upper surfaces of the first portion disposed at both sides of the second portion. An inner surface of the first undercut region UCa may include a bottom surface of one edge region of the first gate mask pattern 130, a sidewall of the control metal pattern 125an, a portion of an upper surface 122 of the second upper portion of the control base gate 120a, a sidewall of the second upper portion of the control base gate 120a, and a portion of an upper surface 123 of the first lower portion of the control base gate 120a.

The width W4 of the second upper portion of the control base gate 120a may be greater than the second width W2 of the control metal pattern 125an. Therefore, the inner surface of the first undercut region UCa may further include one edge region of the first upper surface 122 positioned beside the control metal pattern 125an. FIGS. 16A and 16B illustrate that the first upper surface 122 of the second upper portion of the control base gate 120a is flat. However, the inventive concept is not limited thereto. According to an embodiment, an edge region of the first upper surface 122 included in the inner surface of the first undercut region UCa may be positioned at a level lower than that of a central region of the first upper surface 122.

A pair of first oxidation-resistant spacers 335a may be respectively disposed in the pair of the first undercut regions UCa defined in the cell gate pattern CG. The first oxidation-resistant spacers 335a may be formed of the same material as the first oxidation-resistant spacers 135a of the first embodiment. The pair of the first oxidation-resistant spacers 335a may cover both sidewalls of the control metal pattern 125an. Also, the pair of the first oxidation-resistant spacers 335a may cover both ends of an interface between the control metal pattern 125an and the control base gate 120a. Since the first oxidation-resistant spacers 335a cover the both sidewalls of the control metal pattern and the both ends of the interface, it is possible to minimize a pathway through which oxygen may permeate into the control metal pattern 125an. As a result, the first oxidation-resistant spacers 335a can prevent the oxidation of the control metal pattern 125an caused by oxidation process and/or oxide, thereby enabling to realize a nonvolatile memory device having enhanced reliability.

Likewise, as illustrated in FIG. 16A, a width of a peripheral metal pattern 125bn of a peripheral gate electrode 138 in a peripheral region 60 may be smaller than a width of the second gate mask pattern 131. Therefore, a pair of second undercut regions UCb may be defined under both edge regions of the second gate mask pattern 131. A peripheral sub-gate 120b included in the peripheral gate electrode 138 may also include a first portion and a second portion. The width of the first portion of the peripheral sub-gate 120b may be substantially equal to, or greater than, the width of the second gate mask pattern 131, and the width of the second portion of the peripheral sub-gate 120b may be less than the width of the second gate mask pattern 131. Accordingly, the pair of the second undercut regions UCb may extend in a downward direction. That is, lower ends of the pair of second undercut regions UCb may be positioned at level lower than that of a bottom surface of the peripheral metal pattern 125bn. A pair of second oxidation-resistant spacers 335b may be respectively disposed in the pair of second undercut regions UCb. Accordingly, the pair of second oxidation-resistant spacers 335b may cover both sidewalls of the peripheral metal pattern 125bn, and both ends of an interface between the peripheral metal pattern 125bn and the peripheral sub-gate 120b. This prevents the peripheral metal pattern 125bn from becoming oxidized as a result of subsequent oxidation process and/or the presence of oxides, thus providing for a nonvolatile memory device having enhanced reliability. The second oxidation-resistant spacers 335b may be formed of the same material as the first oxidation-resistant spacers 335a.

According to an embodiment, the first oxidation-resistant spacer 335a may be confinedly disposed in the first undercut region UCa. The second oxidation-resistant spacer 335b may be confinedly disposed in the second undercut region UCb.

Various modified examples of the first embodiment may be applied to the nonvolatile memory device according to the present embodiment. For example, a thickness of the first oxidation-resistant spacer 335a positioned at the sidewall of control metal pattern 125an may differ from a thickness of the second oxidation-resistant spacer 335b positioned at the sidewall of the peripheral metal pattern 125bn. According to an embodiment, the thickness of the second oxidation-resistant spacer 335b may be greater than the thickness of the first oxidation-resistant spacer 335a.

According to an embodiment, a sidewall of the first portion of the control base gate 120a under the first undercut region UCa may have a stepped shape in a manner similar to the sidewall of the control base gate (see 120a' in FIG. 3). In this case, at least a lower portion of the first portion of the control base gate 120a may have a greater width than the first width W1 of the first gate mask pattern 130. Likewise, the sidewall of the first portion of the peripheral sub-gate 120b under the second undercut region UCb may have a stepped shape.

According to an embodiment, as illustrated in FIG. 5, air gaps may be provided between neighboring cell gate patterns CG of the embodiment of FIG. 16A.

The undercut regions UCa and UCb and the oxidation-resistant spacers 335a and 335b according to the present embodiment may be applicable to the nonvolatile memory devices described in the second embodiment.

Hereinafter, a modified example of a nonvolatile memory device according to an embodiment will be described with reference to accompanying drawings.

Figure 17A:
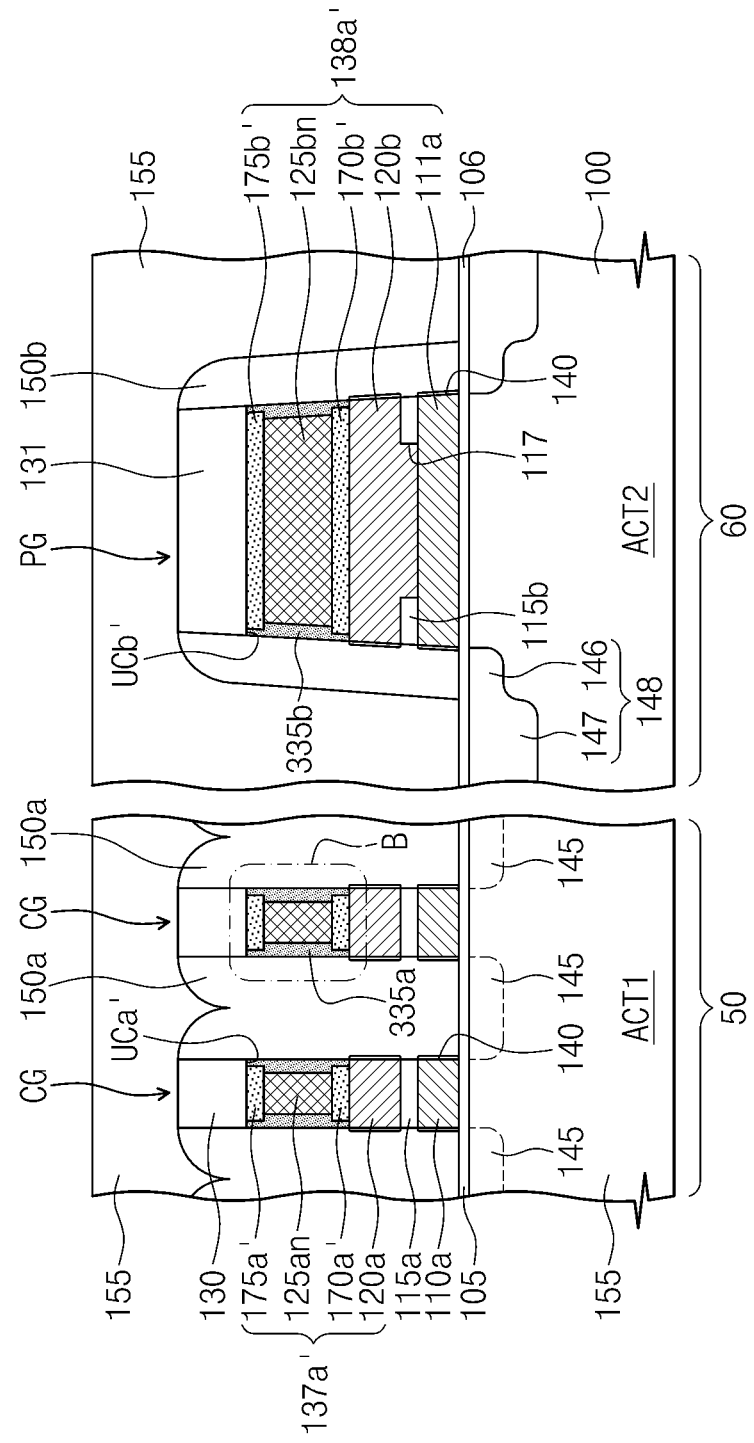
FIG. 17A is a cross-sectional view illustrating a modified example of a nonvolatile memory device according to still another embodiment of the inventive concept.
Figure 17B:
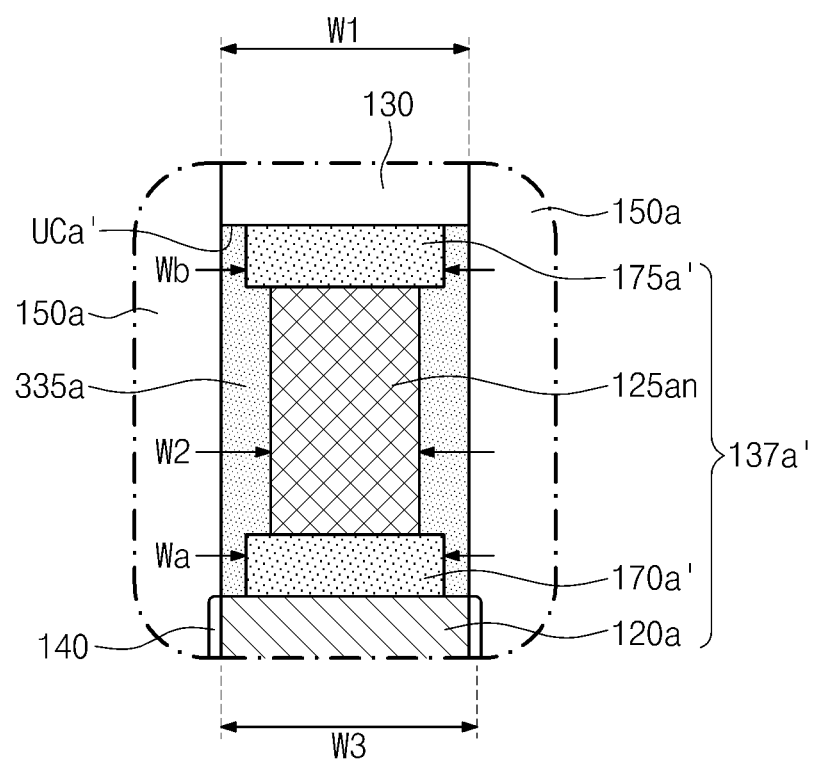
FIG. 17B is an enlarged view of portion B of FIG. 17A.

FIG. 17A is a cross-sectional view illustrating a modified example of a nonvolatile memory device according to still another embodiment of the inventive concept, and FIG. 17B is an enlarged view of portion B of FIG. 17A.

Referring to FIGS. 17A and 17B, a control gate electrode 137a' in a cell region 50 may include a control base gate 120a, a first lower barrier pattern 170a', a control metal pattern 125an, and a first upper barrier pattern 175a', which are stacked. The first lower barrier pattern 170a' and the first upper barrier pattern 175a' may be formed of the same materials as the first lower barrier pattern 170a and the first upper barrier pattern 175a, respectively, which are illustrated and described above in connection with the embodiment of FIG. 5. In the case where the control gate electrode 137a' includes the first lower barrier pattern 170a', the control base gate 120a may be formed of a semiconductor doped with a dopant (e.g., silicon doped with a dopant, etc), a semiconductor doped with a dopant and carbon (e.g., silicon doped with a dopant and carbon), or other suitable material.

A width Wa of the first lower barrier pattern 170a' may be less than the first width W1 of the first gate mask pattern 130. Likewise, a width Wb of the first upper barrier pattern 175a' may also be less than the first width W1 of the first gate mask pattern 130. As a result, as illustrated in FIG. 17B, a pair of first undercut regions UCa' defined at both sides of the control metal pattern 125an may extend downwardly and upwardly in a vertical direction. The first undercut regions UCa' are defined under both edge regions of the first gate mask pattern 130, respectively. The widths Wa and Wb of the first lower and upper barrier patterns 170a' and 175a' may be greater than a second width W2 of the control metal pattern 125an.

A pair of first oxidation-resistant spacers 335a may be disposed in the pair of first undercut regions UCa', respectively. The pair of first oxidation-resistant spacers 335a may cover both sidewalls of the control metal pattern 125an, both ends of an interface between the control metal pattern 125an and the first lower barrier pattern 170a', and both ends of an interface between the control metal pattern 125an and the first upper barrier pattern 175a'. In addition, the pair of first oxidation-resistant spacers 335a may also cover both sidewalls of the first lower barrier pattern 170a' and both sidewalls of the first upper barrier pattern 175a'. Thus, it is possible to prevent the control metal pattern 125an from becoming oxidized.

Similarly, a peripheral gate electrode 138a' in a peripheral region 60 may include a peripheral bottom gate 111a, a peripheral sub-gate 120b, a second lower barrier pattern 170b', a peripheral metal pattern 125bn, and a second upper barrier pattern 175b', which are sequentially stacked. Here, a width of the second lower barrier pattern 170b' may be smaller than that of the second gate mask pattern 131. A width of the second upper barrier pattern 175b' may also be smaller than that of the second gate mask pattern 131. Accordingly, the second undercut regions UCb' defined at both sides of the peripheral metal pattern 125bn may extend downwardly and upwardly in a vertical direction. The second undercut regions UCb' are defined under both edge regions of the second gate mask pattern 131, respectively. The widths of the second lower and upper barrier patterns 170b' and 175b' may be greater than that of the peripheral metal pattern 125bn. The second lower and upper barrier patterns 170b' and 175b' may be formed of the same materials as the first lower and upper barrier patterns 170a' and 175a', respectively.

A pair of second oxidation-resistant spacers 335b may be disposed in the second undercut regions UCb', respectively. The pair of second oxidation-resistant spacers 335b may cover both sidewalls of the peripheral metal pattern 125bn, both ends of the interface between the peripheral metal pattern 125bn and the second lower barrier pattern 170b', and both ends of the interface between the peripheral metal pattern 125bn and the second upper barrier pattern 175b'. In addition, the pair of second oxidation-resistant spacers 335b may cover both sidewalls of the second lower barrier pattern 170b' and both sidewalls of the second upper barrier pattern 175b'. Therefore, the oxidation of the peripheral metal pattern 125bn can be prevented by the pair of second oxidation-resistant spacers 335b.

The above-described modified examples of the first embodiment may be applicable to the nonvolatile memory device of FIGS. 17A and 17B, and to other embodiments described herein.

The undercut regions UCa' and UCb' and the oxidation-resistant spacers 335a and 335b, which are illustrated in FIGS. 17A and 17B, may also be applied to the nonvolatile memory device of the second embodiment.

Hereinafter, a method of fabricating a nonvolatile memory device according to the present embodiment will be described. This method may be similar to the method described with reference to FIGS. 6A to 6C.

Figure 18A:
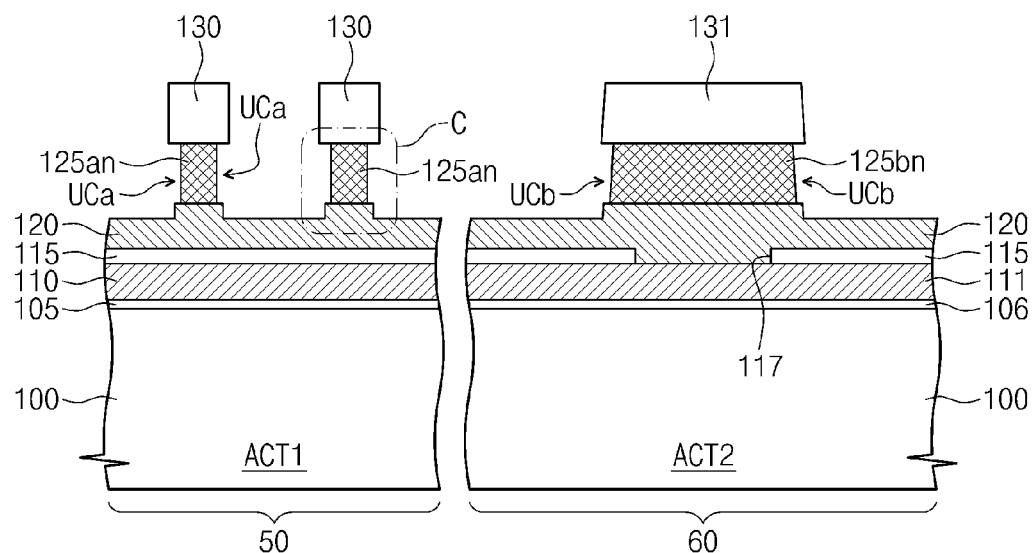
FIG. 18A is a cross-sectional view illustrating a nonvolatile memory device according to still another embodiment of the inventive concept.
Figure 18B:
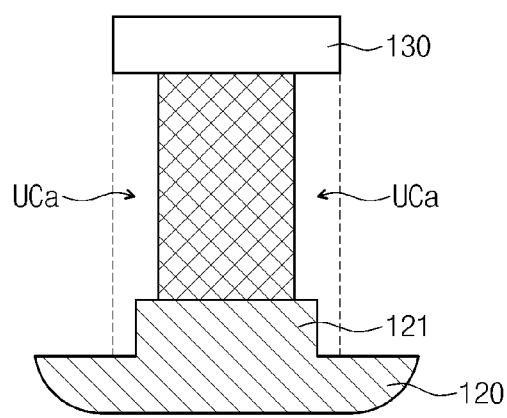
FIG. 18B is an enlarged view of portion C of FIG. 18A.

FIG. 18A is a cross-sectional view illustrating a nonvolatile memory device according to still another embodiment of the inventive concept, and FIG. 18B is an enlarged view of portion C of FIG. 18A.

Referring to FIGS. 6C, 18A and 18B, the metal layer 125 of FIG. 6B may be etched using the first and second gate mask patterns 130 and 131 as an etch mask, thereby forming the control metal pattern (125a of FIG. 6C) in the cell region 50 and the peripheral metal pattern (125b of FIG. 6C) in the peripheral region 60. An upper portion of the base conductive layer 120, which is disposed at both sides of the control and peripheral metal patterns 125a and 125b, may be etched. As a result, a first protrusion may be defined under the control metal pattern 125a, and a second protrusion may be defined under the peripheral metal pattern 125b. The first protrusion 121 may correspond to a portion of the base conductive layer 120 under the control metal pattern 125a, and the second protrusion 121 may correspond to a portion of the base conductive layer 120 under the peripheral metal pattern 125b.

Both sidewalls of the control and peripheral metal patterns 125a and 125b are etched in a lateral direction. At this time, both sidewalls of the first protrusion 121 and both sidewalls of the second protrusion 121 can also become etched in a lateral direction. In this manner, the first undercut regions UCa and the second undercut regions UCb illustrated in FIG. 18A may be totaled. As illustrated in FIG. 18B, the first protrusion 121 which is etched laterally may be smaller in width than that of the first gate mask pattern 130. Therefore, the first undercut region UCa illustrated in FIG. 18B may be formed. Likewise, the second protrusion which is etched laterally may be smaller in width than that of the second gate mask pattern 131. Thus, the second undercut region UCb which is illustrated in FIG. 18A and described with reference to FIG. 16A may be formed. A pair of the first undercut regions UCa may be respectively formed at both sides of the laterally etched control metal pattern 125an, and a pair of the second undercut regions UCb may be respectively formed at both sides of the laterally etched peripheral metal pattern 125bn.

During the etching process for forming the undercut regions UCa and UCb, the first and second protrusions may be smaller in etch rate than the control and peripheral metal patterns 125a and 125b. Thus, as illustrated in FIG. 18B, the width of the laterally etched first protrusion 121 may be greater than the width of the laterally etched control metal pattern 125an. Also, the width of the laterally etched second protrusion may be greater than the width of the laterally etched peripheral metal pattern 125bn.

The sidewalls of the first and second protrusions of the base conductive layer 120, and the sidewalls of the control and peripheral metal patterns 125a and 125b may be laterally etched by reactive dry etching or wet etching. The reactive dry etching may have dominant isotropy.

The subsequent fabrication processes may be performed in a manner similar to those described with reference to FIGS. 6D to 6G, and FIG. 7.

Figure 19A:
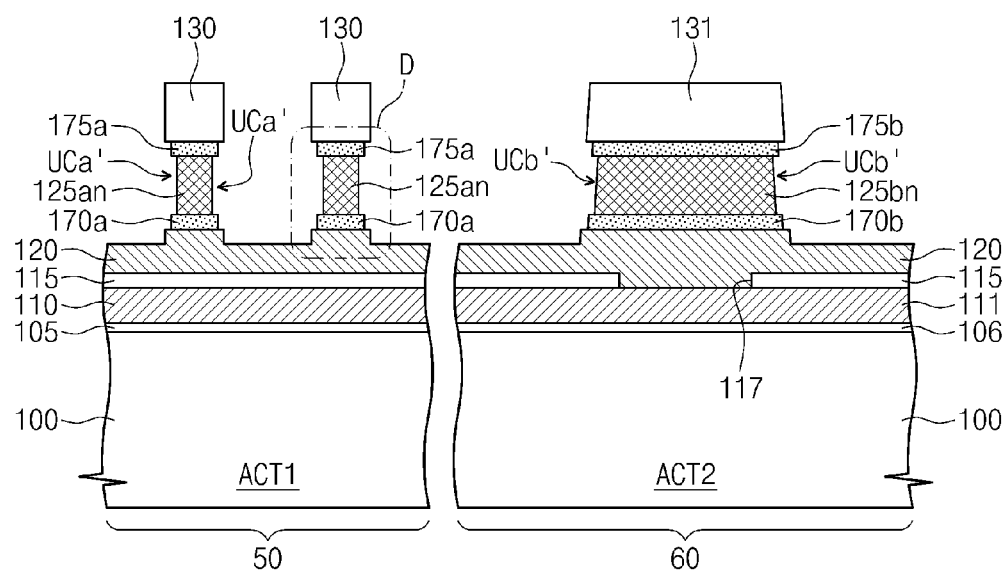
FIG. 19A is a cross-sectional view illustrating a modified example of a method of fabricating a nonvolatile memory device according to still another embodiment of the inventive concept.
Figure 19B:
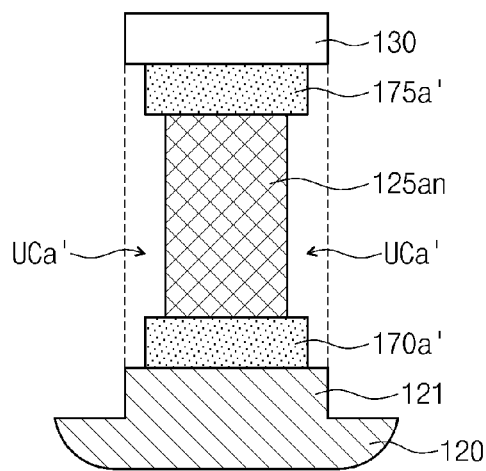
FIG. 19B is an enlarged view of portion D of FIG. 19A.

FIG. 19A is a cross-sectional view illustrating a modified example of a method of fabricating a nonvolatile memory device according to still another embodiment of the inventive concept, and FIG. 19B is an enlarged view of portion D of FIG. 19A. The method of fabricating the nonvolatile memory device may include the methods described herein with reference to FIGS. 8A and 8B.

Referring to FIGS. 8B, 19A and 19B, after forming the first and second lower barrier patterns 170a and 170b, the control and peripheral metal patterns 125a and 125b, and the first and second upper barrier patterns 175a and 175b, which are illustrated in FIG. 8B, both sidewalls of the control and peripheral metal patterns 125a and 125b may be etched in a lateral direction. At this time, the first and second lower barrier patterns 170a and 170b and the first and second upper barrier patterns 175a and 175b may also be etched in a lateral direction. Thus, the laterally etched first lower and upper barrier patterns 170a' and 175a' may be smaller in width than the first gate mask pattern 130, and the laterally etched second lower and upper barrier patterns 170b' and 175b' may be smaller in width than the second gate mask pattern 131. As a result, a pair of first undercut regions UCa' are formed under both edge regions of the first gate mask pattern 130, and a pair of second undercut regions UCb' are formed under both edge regions of the second gate mask pattern 131.

During the etching process for forming the undercut regions UCa' and UCb', the barrier patterns 170a, 170b, 175a and 175b may have etch rates that are less than etch rates of the control and peripheral metal patterns 125a and 125b.

The subsequent fabrication processes may be performed in a manner similar to those described with reference to FIG. 8D.

Fourth Embodiment

In the present embodiment, like reference numerals in the foregoing embodiments refer to like elements.

Figure 20:
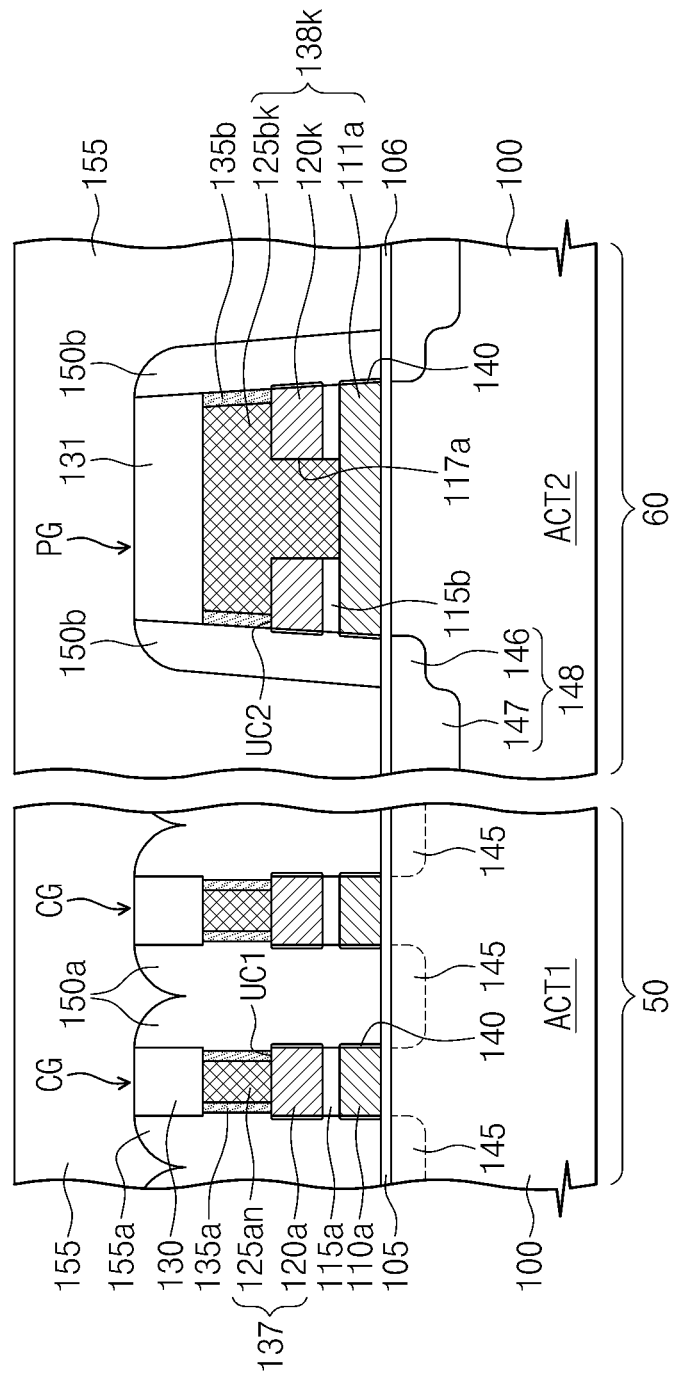
FIG. 20 is a cross-sectional view illustrating a nonvolatile memory device according to yet another embodiment of the inventive concept.

FIG. 20 is a cross-sectional view illustrating a nonvolatile memory device according to yet another embodiment of the inventive concept.

Referring to FIG. 20, a peripheral gate electrode 138k in a peripheral region 60 may include a peripheral bottom gate 111a, a peripheral sub-gate 120k, and a peripheral metal pattern 125bk, which are stacked in sequence. An interlayer dielectric pattern 116b may be disposed between the peripheral bottom gate 111a and the peripheral sub-gate 120k. The peripheral metal pattern 125bk may fill an opening 117a that penetrates the peripheral sub-gate 120k and the interlayer dielectric pattern 115b. As a result, the peripheral metal pattern 125bk may be in direct contact with the peripheral sub-gate 120k and the peripheral bottom gate 111a. The peripheral sub-gate 120k and the peripheral metal pattern 125bk may be formed of the same material layer as those of the control base gate 120a and the control metal pattern 125an in the control gate electrode 137 in the cell region 50, respectively. A pair of second oxidation-resistant spacers 135b may be disposed in second undercut regions UC2 defined at both sides of the peripheral metal pattern 125bk, respectively.

The peripheral gate electrode 138k of the nonvolatile memory device according to the present embodiment may be applicable to the modified examples of the first embodiment or to the nonvolatile memory devices of the third embodiment, or to other embodiments described herein.

Figure 21A:
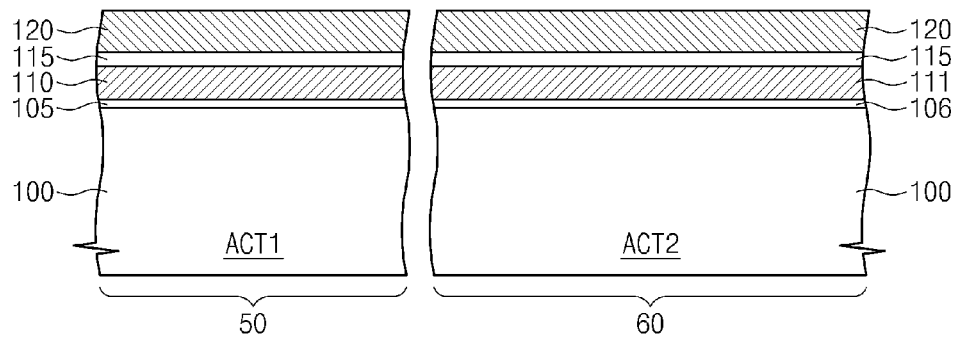
FIGS. 21A and 21B area cross-sectional views illustrating a method of fabricating a nonvolatile memory device according to yet another embodiment of the inventive concept.
Figure 21B:
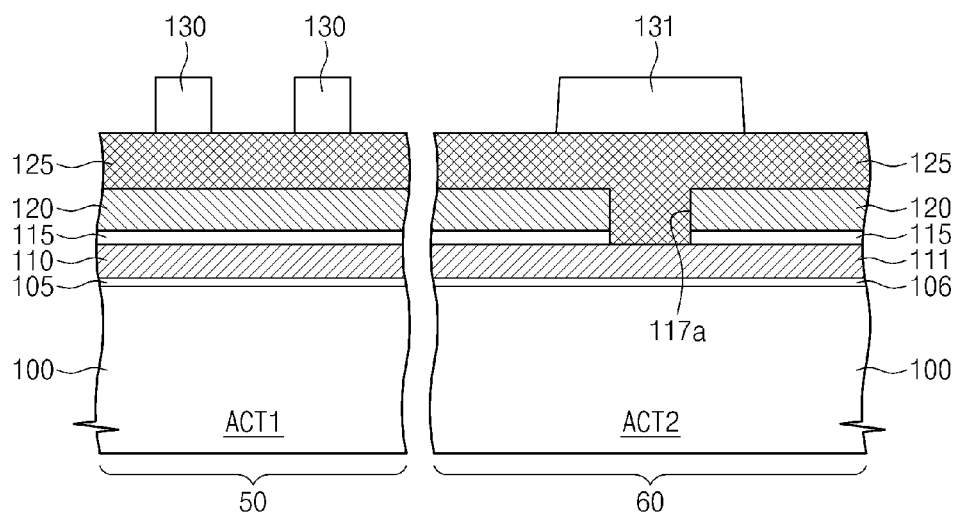

FIGS. 21A and 21B area cross-sectional views illustrating a method of fabricating a nonvolatile memory device according to yet another embodiment of the inventive concept. The fabricating method according to the present embodiment may include the methods described with reference to FIG. 6A.

Referring to FIGS. 6A and 21A, a blocking dielectric layer 115 and a base conductive layer 120 may be sequentially formed on a substrate having the first and second semiconductor patterns 110 and 111 of FIG. 6A.

Referring to FIG. 21B, the base conductive layer 120 and the blocking dielectric layer 115 in a peripheral region 60 may be sequentially patterned to form an opening 117a exposing the second semiconductor pattern 111. Thereafter, a metal layer 125 filling the opening 117a may be formed on the substrate 100.

First gate mask patterns 130 may be formed on the metal layer 125 in the cell region 50, and a second gate mask pattern 131 may be formed on the metal layer 125 in the peripheral region 60. The subsequent fabrication processes may be performed in a manner similar to those described with reference to FIGS. 6C to 6G and FIG. 7. Alternatively, subsequent processes may be performed in a manner similar to those described with reference to the third embodiment.

Fifth Embodiment

In the present embodiment, an example of realizing the non-volatile memory devices of the above-described first to fourth embodiments as a NAND-type non-volatile memory device will be described.

Figure 22:
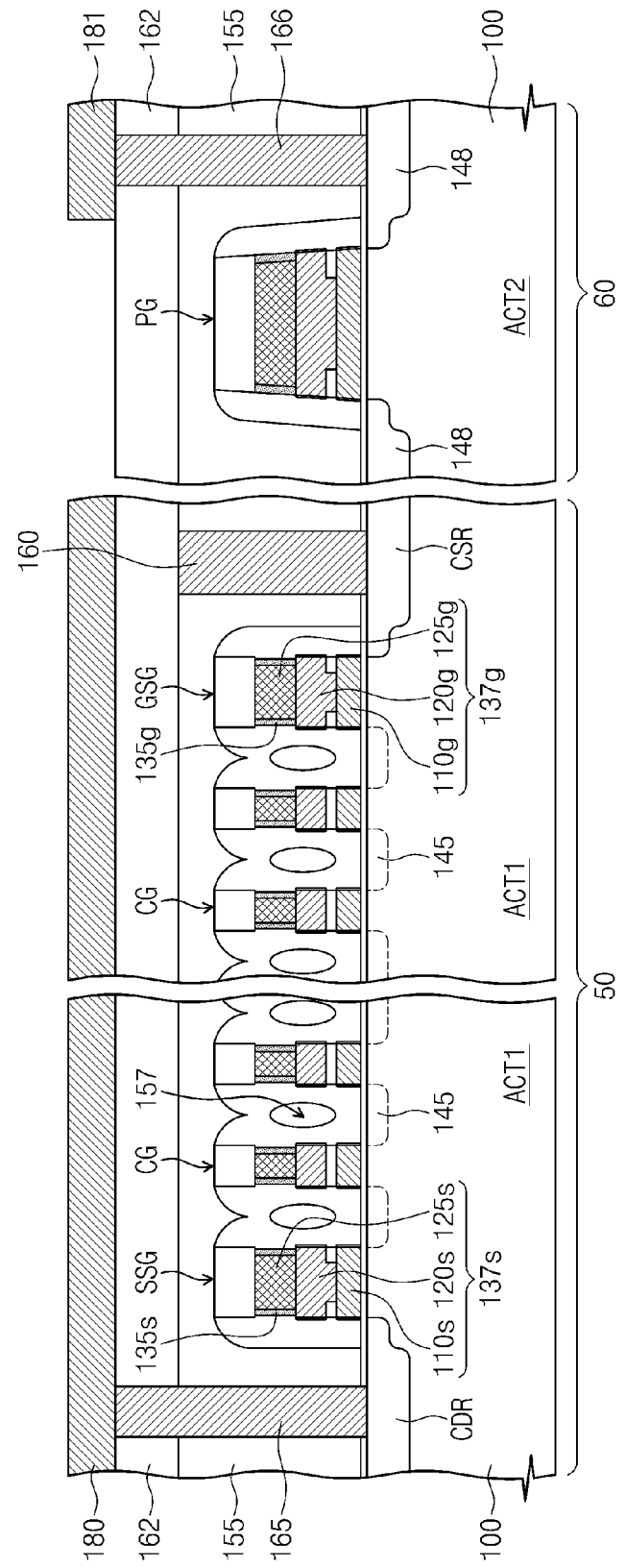
FIG. 22 is a cross-sectional view illustrating a non-volatile memory device according to another embodiment of the inventive concept.

FIG. 22 is a cross-sectional view illustrating a non-volatile memory device according to another embodiment of the inventive concept.

Referring to FIG. 22, a first selection gate pattern GSG and a second selection gate pattern SSG may be disposed on a first active portion ACT1 defined in a cell region 50 of a substrate 100. A plurality of cell gate patterns CG may be disposed on the first active portion ACT1 between the first and second selection gate patterns GSG and SSG. A common source CSR may be disposed in the first active portion ACT1 of a side of the first selection gate pattern GSG, and a common drain CDR may be disposed in the first active portion ACT1 of a side of the second selection gate pattern SSG. The first selection gate pattern GSG, the plurality of cell gate patterns CG and the second selection gate pattern SSG may be disposed on the first active portion ACT1 between the common source CSR and the common drain CDR. A cell source/drain 145 may be disposed in the first active portion ACT1 of both sides of the each cell gate pattern CG. The first selection gate pattern GSG may be included in a first selection transistor, and the cell gate patterns CG may be included in non-volatile memory cells, respectively. The second selection gate pattern SSG may be included in a second selection transistor. The first selection transistor, the non-volatile memory cells and the second selection transistor may constitute a cell string.

The first selection gate pattern GSG may include a first selection gate dielectric and a first selection gate electrode 137g which are stacked sequentially. The first selection gate electrode 137g may include a first sub-gate 110g, a second sub-gate 120g and a third sub-gate 125g which are stacked sequentially. Also, the first selection gate pattern GSG may further include a first selection mask pattern disposed on the third sub-gate 125g. The third sub-gate 125g may include the same metal as a control metal pattern of the cell gate pattern CG. A width of the third sub-gate 125g may be less than widths of the first selection mask pattern and the second sub-gate 120a Therefore, first selection undercut regions may be defined at both sides of the third sub-gate 125g. A pair of first selection oxidation-resistant spacers 135g may be disposed on both sidewalls of the third sub-gate 125g. The pair of first selection oxidation-resistant spacers 135g may be confinedly disposed in the first selection undercut regions. A first selection interlayer pattern may be disposed between the first and second sub-gates 110g and 120g. In this case, the second sub-gate 120g may be connected to the first sub-gate 110g via a first selection opening penetrating the first selection interlayer pattern.

Likewise, the second selection gate pattern SSG may include a second selection gate dielectric, a second selection gate electrode 137s and a second selection mask pattern which are stacked sequentially. The second selection gate electrode 137s may include a first sub-gate 110s, a second sub-gate 120s and a third sub-gate 125s which are stacked sequentially. The third sub-gate 125s of the second selection gate pattern SSG may include the same metal material as that of the control metal pattern. Second selection undercut regions may be defined at both sides of the third sub-gate 125s of the second selection gate pattern SSG, and second selection oxidation-resistant spacers 135s may be disposed on both sidewalls of the third sub-gate 125s of the second selection gate pattern SSG. The second selection oxidation-resistant spacers 135s may be confinedly disposed in the second selection undercut regions. The first, second and third sub-gates 110s, 120s and 125s of the second selection gate pattern SSG may also be electrically connected to each other.

The first sub gates 110g and 110s of the first and second selection gate patterns GSG and SSG may include the same semiconductor material as a charge storage layer of the cell gate pattern CG. The second sub-gates 120g and 120s may include the same material as a control base gate of the cell gate pattern CG, and the third sub-gates 125g and 125s may include the same metal as the control metal pattern of the cell gate pattern CG. The first and second selection mask patterns may be formed of the same material as a first gate mask pattern of the cell gate pattern CG.

A peripheral transistor including the peripheral gate pattern PG shown in FIG. 1 may be disposed in the peripheral region 60. First gate spacers may be disposed on both sidewalls of the selection gate patterns GSG and SSG and the cell gate patterns CG. At this time, an air gap 157 covered with the gate spacers may also be formed between the cell gate patterns CG. However, the inventive concept is not limited thereto. In other embodiments, the air gap 157 need not be formed.

A first interlayer dielectric layer 155 may be disposed on an entire surface of the substrate 100. A common source line 160 may be electrically connected to the common source CSR by penetrating the first interlayer dielectric layer 155. A second interlayer dielectric layer 162 may be disposed on the first interlayer dielectric layer 155 and the common source line 160. A first contact plug 165 may be electrically connected to the common drain CDR by continuously penetrating the second and first interlayer dielectric layers 162 and 155 in the cell region 50. A second contact plug 166 may be electrically connected to a peripheral source/drain 148 by continuously penetrating the second and first interlayer dielectric layers 162 and 155 in the peripheral region 60. A bit line 180 may be electrically connected to the first contact plug 165 by being disposed on the second interlayer dielectric layer 162 in the cell region 50. An interconnection line 181 may be electrically connected to the second contact plug 166 by being disposed on the second interlayer dielectric layer 162 in the peripheral region 60.

In the embodiment depicted in FIG. 22, the cell gate pattern CG and the peripheral gate pattern PG were illustrated as the cell gate pattern CG and the peripheral gate pattern PG of FIG. 1. However, the inventive concept is not limited thereto. The cell gate pattern CG and the peripheral gate pattern PG of FIG. 22 may be substituted by any one of the cell gate patterns CG and peripheral gate patterns PG of the embodiments illustrated and described herein, including the embodiments described in connection with FIGS. 2-5, FIGS. 9-12, FIG. 17a or FIG. 18a. In this case, the selection gate patterns GSG and SSG may have substantially the same shape as the peripheral gate pattern PG.

Figure 23:
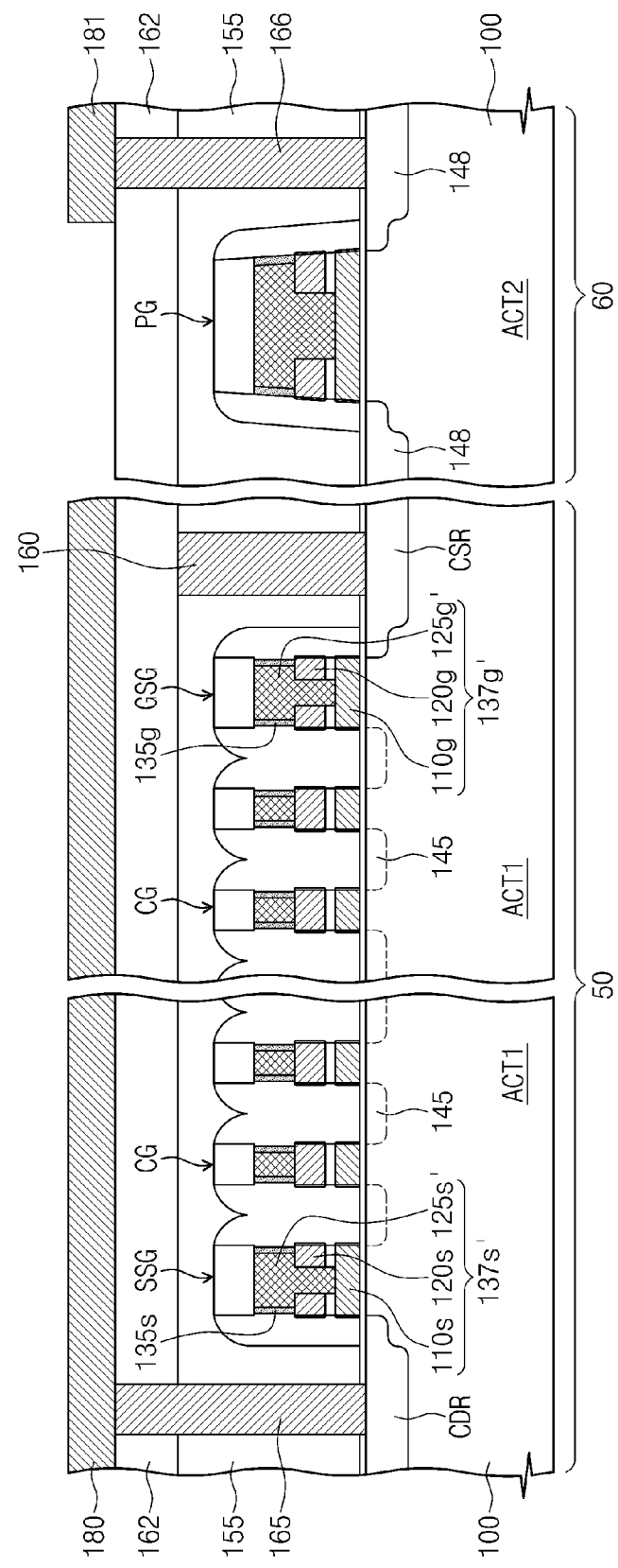
FIG. 23 is a cross-sectional view illustrating a modified example of a nonvolatile memory device according to another embodiment of the inventive concept.

FIG. 23 is a cross-sectional view illustrating a modified example of a nonvolatile memory device according to yet another embodiment of the inventive concept.

Referring to FIG. 23, a peripheral gate pattern PG of the nonvolatile memory device according to this modified example may have the same shape as the peripheral gate pattern PG having the peripheral gate electrode 138k which is illustrated in FIG. 20. In this case, a third sub-gate 125g' of a first selection gate electrode 137g' may fill a first selection opening which sequentially penetrates a second sub-gate 120g and a first selection interlayer pattern. Accordingly, the third sub-gate 125g' of the first selection gate electrode 137g' may be in direct contact with a first sub-gate 110g of the first selection gate electrode 137g'.

Likewise, a third sub-gate 125s' of a second selection gate electrode 137s' may fill a second selection opening which sequentially penetrates a second sub-gate 120s and a second selection interlayer pattern. Accordingly, the third sub-gate 125s' of the second selection gate electrode 137s' may be in direct contact with a first sub-gate 110s of the second selection gate electrode 137s'.

The non-volatile memory devices disclosed in the foregoing embodiments may be realized in various types of semiconductor packages. Examples of the packages of the non-volatile memory devices according to the embodiments of the inventive concept may include package on package (PoP), ball grid arrays (BGAs), chip scale packages (CSPs), a plastic leaded chip carrier (PLCC), a plastic dual in-line package (PDIP), a die in waffle pack, a die in wafer form, a chip on board (COB), a ceramic dual in-line package (CERDIP), a plastic metric quad flat pack (MQFP), a thin quad flat pack (TQFP), a small outline package (SOP), a shrink small outline package (SSOP), a thin small outline package (TSOP), a thin quad flat package (TQFP), a system in package (SIP), a multi chip package (MCP), a wafer-level fabricated package (WFP), a wafer-level processed package (WSP) and other suitable semiconductor packages.

A package, on which a non-volatile memory device according to the embodiments of the inventive concept is mounted, may also further include a controller and/or a logic device or the like which control the non-volatile memory device.

Figure 24:
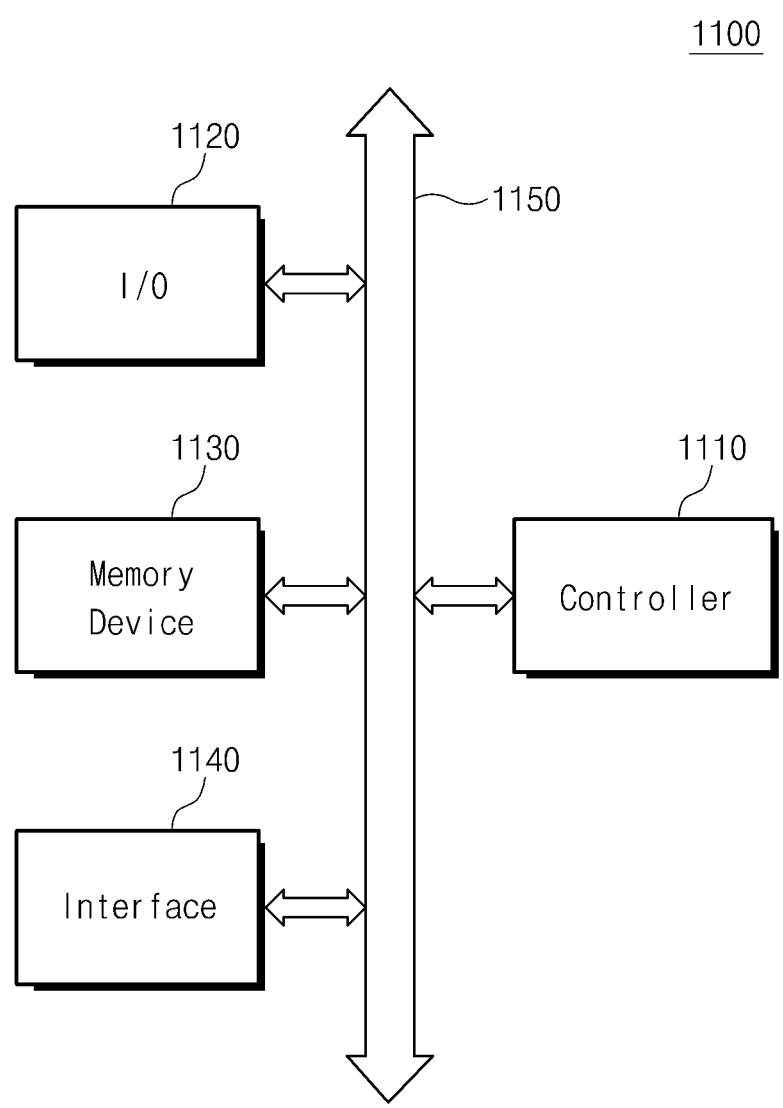
FIG. 24 is a block diagram illustrating an example of an electronic system including a non-volatile memory device configured in accordance with the inventive concept.

FIG. 24 is a block diagram illustrating an example of an electronic system including a non-volatile memory device based on the technical idea of the inventive concept.

Referring to FIG. 24, the electronic system 1100 according to an embodiment of the inventive concept may include a controller 1110, an input/output (I/O) device 1120, a memory device 1130, an interface 1140, and a bus 1150. The controller 1110, the input/output device 1120, the memory device 1130 and/or the interface 1140 may be interconnected to each other through the bus 1150. The bus 1150 corresponds to a data transfer path.

The controller 1110 includes at least one of a micro processor, a digital signal processor, a micro controller and other logic devices capable of performing similar functions to the above elements. The input/output device 1120 may include a key pad, a keyboard and a display device, etc. The memory device 1130 may store data and/or commands, etc. The memory device 1130 may include at least one of non-volatile memory devices disclosed in the foregoing embodiments. Also, the memory device 1130 may further include another kind of memory device (e.g., a phase-change memory device, a magnetic memory device, a dynamic random access memory (DRAM) device and/or a static random access memory (SRAM) device, etc.). The interface 1140 may serve to transmit/receive data to/from a communication network. The interface 1140 may have a wire or wireless type. For example, the interface 1140 may include an antenna or wire/wireless transceivers, etc. Although not illustrated, the electronic system 1100, which is a working memory device for improving an operation of the controller 1110, may further include a high speed DRAM device and/or SRAM device, etc.

The electronic system 1100 may be applied to a personal digital assistant (PDA), a portable computer, a web tablet, a wireless phone, a mobile phone, a digital music player, a memory card and all electronic products which may transmit and/or receive data in a wireless environment.

Figure 25:
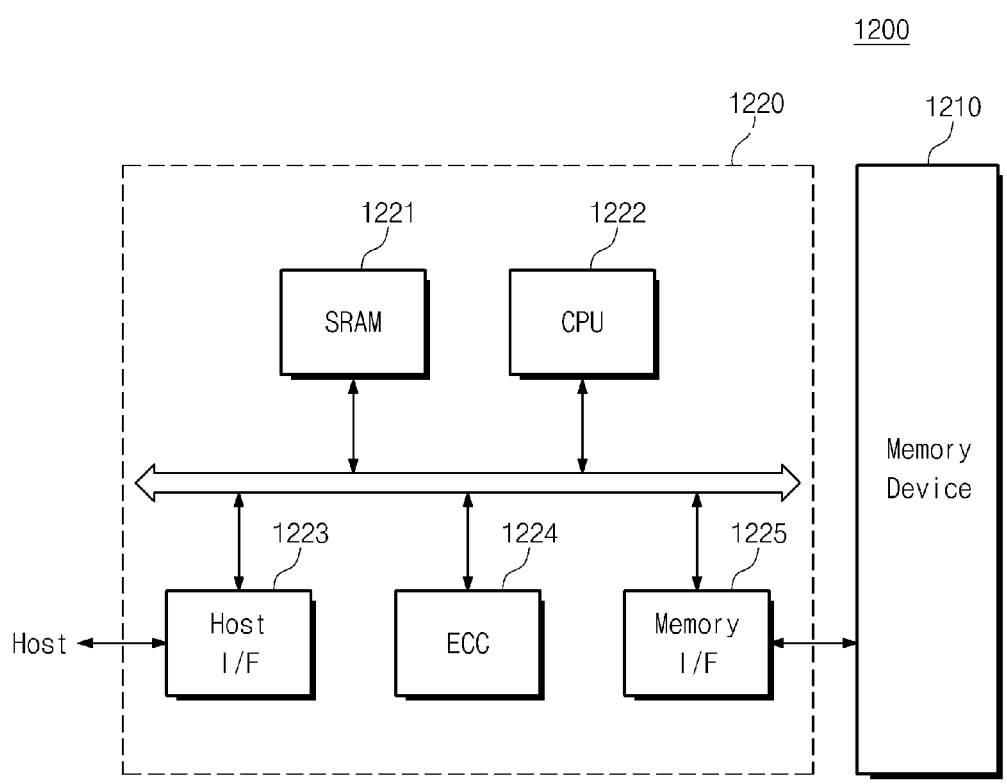
FIG. 25 is a block diagram illustrating an example of a memory card including a non-volatile memory device configured in accordance with the inventive concept.

FIG. 25 is a block diagram illustrating an example of a memory card including a non-volatile memory device based on the technical idea of the inventive concept.

Referring to FIG. 25, the memory card 1200 according to an embodiment of the inventive concept includes a memory device 1210. The memory device 1210 may include at least one of non-volatile memory devices according to the foregoing embodiments. Also, the memory device 1210 may further include another kind of memory device (e.g., a phase-change memory device, a magnetic memory device, a DRAM device and/or a SRAM device, etc.). The memory card 1200 may include a memory controller 1220 which controls various data exchanges between a host and the memory device 1210.

The memory controller 1220 may include a processing unit 1222 that controls overall operations of the memory card. Also, the memory controller 1220 may include a SRAM 1221 which is used as a working memory of the processing unit 1222. In addition, the memory controller 1220 may further include a host interface 1223 and a memory interface 1225. The host interface 1223 may have a data exchange protocol between the memory card 1200 and the host. The memory interface 1225 may connect the memory controller 1220 with the memory device 1210. Furthermore, the memory controller 1220 may further include an error correction code (ECC) 1224 processor. The error correction code 1224 processor may detect and correct an error in the data read out from the memory device 1210. Although not illustrated, the memory card 1200 may further include a read only memory (ROM) device which stores code data for interfacing with the host. The memory card 1200 may be used for a portable data storage card. Alternatively, the memory card 1200 may also be realized as a solid state disk (SSD) which can substitute a hard disk of a computer system.

According to the foregoing non-volatile memory device, the pair of first oxidation-resistant spacers is disposed at both sidewalls of the control metal pattern. The oxidation-resistant spacers prevent the control metal pattern from becoming oxidized during subsequent gate oxidation processes or caused by subsequent exposure to oxide, etc. Also, the first oxidation-resistant spacers are confined in position to a region that is defined in a horizontal direction between both edge regions of the control base gate or between both edge regions of the gate mask pattern which are disposed under and above the control metal pattern. This enables further minimization of any increase in the line width of a cell gate pattern. As a result, a non-volatile memory device having superior reliability and that is optimized for high integration density can be achieved. Also, the control gate electrode includes the control metal pattern having low resistivity, thereby enabling high-speed operation in the non-volatile memory device.

While the inventive concepts have been particularly shown and described with reference to exemplary embodiments thereof, it will be understood by those of ordinary skill in the art that various changes in form and details may be made therein without departing from the spirit and scope of the inventive concepts as defined by the following claims. Therefore, the disclosed subject matter is to be considered illustrative and not restrictive.

What is claimed is:

1. A method of fabricating a non-volatile memory device comprising:
    providing a charge storage layer on a substrate;
    providing a control base gate layer on the charge storage layer;
    providing a control metal gate layer on the control base gate layer;
    providing a control gate mask pattern on the control metal gate layer;
    etching the control metal gate layer and the control base gate layer using the control gate mask pattern as an etch mask to form a first control metal gate pattern and a control base gate pattern;
    etching sidewalls of the first control metal gate pattern to form a second control metal gate pattern, so that a width of the second control metal gate pattern is less than a width of the control gate mask pattern;
    providing an oxidation-resistant spacer at sidewalls of the second control metal gate pattern positioned between the control gate mask pattern and the control base gate pattern; and
    performing a gate oxidation process on sidewalls of the control base gate pattern.

2. The method of claim 1 wherein providing the oxidation-resistant spacer comprises:
    providing an oxidation-resistant layer on the second control metal gate pattern at sidewalls of the second control metal gate pattern to fill an undercut region below the control gate mask pattern; and
    etching the oxidation-resistant layer to form the oxidation-resistant spacer.

3. The method of claim 2 wherein etching the oxidation-resistant layer comprises etching using an etching process having dominant anisotropy properties.

4. The method of claim 1 wherein etching the sidewalls of the first control metal gate pattern to form the second control metal gate pattern comprises etching using a dry etching process having dominant anisotropy properties.

5. A method of fabricating a non-volatile memory device comprising:
    providing a charge storage region on a substrate;
    providing a control gate electrode layer comprising metal on the charge storage region;
    providing a control gate mask pattern on the control gate electrode layer;
    etching the control gate electrode layer using the control gate mask pattern as an etch mask to form a first control gate electrode pattern;
    etching sidewalls of the first control gate electrode pattern to form a second control gate electrode pattern, so that a width of the second control gate electrode pattern is less than a width of the control gate mask pattern;
    providing an oxidation-resistant spacer at sidewalls of the second control gate electrode pattern positioned between the control gate mask pattern and the charge storage region; and
    performing a gate oxidation process on sidewalls of the charge storage region.

6. The method of claim 5 wherein providing the oxidation-resistant spacer comprises:
    providing an oxidation-resistant layer on the second control gate electrode pattern at sidewalls of the second control gate electrode pattern to fill an undercut region below the control gate mask pattern; and
    etching the oxidation-resistant layer to form the oxidation-resistant spacer.

7. The method of claim 6 wherein etching the oxidation-resistant layer comprises etching using an etching process having dominant anisotropy properties.

8. The method of claim 5 wherein etching the sidewalls of the first control gate electrode pattern to form the second control gate electrode pattern comprises etching using a dry etching process having dominant anisotropy properties.

* * * * *